US012568654B2

(12) United States Patent
Goto et al.

(10) Patent No.: US 12,568,654 B2
(45) Date of Patent: Mar. 3, 2026

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Naoto Goto, Tochigi (JP); Naoki Ikezawa, Tochigi (JP); Masataka Nakada, Tochigi (JP); Ami Sato, Tochigi (JP); Chieko Misawa, Utsunomiya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 482 days.

(21) Appl. No.: 17/629,802

(22) PCT Filed: Jul. 27, 2020

(86) PCT No.: PCT/IB2020/057052
§ 371 (c)(1),
(2) Date: Jan. 25, 2022

(87) PCT Pub. No.: WO2021/028750
PCT Pub. Date: Feb. 18, 2021

(65) Prior Publication Data
US 2022/0320340 A1      Oct. 6, 2022

(30) Foreign Application Priority Data
Aug. 9, 2019      (JP) ................................. 2019-147798

(51) Int. Cl.
H10D 30/67          (2025.01)
H10D 30/01          (2025.01)

(52) U.S. Cl.
CPC ....... H10D 30/6755 (2025.01); H10D 30/031 (2025.01); H10D 30/6757 (2025.01)

(58) Field of Classification Search
CPC ........... H01L 29/7869; H01L 29/66742; H01L 29/78696; H01L 29/42384;
(Continued)

(56) References Cited

U.S. PATENT DOCUMENTS 6,335,290 B1    1/2002  Ishida
6,384,818 B1    5/2002  Yamazaki et al.
(Continued)

FOREIGN PATENT DOCUMENTS

CN          104821338 A      8/2015
CN          106898551 A      6/2017
(Continued)

OTHER PUBLICATIONS

International Search Report (Application No. PCT/IB2020/057052), dated Oct. 27, 2020.
(Continued)

*Primary Examiner* — Mounir S Amer
*Assistant Examiner* — Nicholas B Michaud
(74) *Attorney, Agent, or Firm* — Eric J. Robinson; Robinson Intellectual Property Law Office, P.C.

(57)          ABSTRACT

A semiconductor device with favorable electrical characteristics is provided. A highly reliable semiconductor device is provided. The semiconductor device includes a semiconductor layer, a first insulating layer over the semiconductor layer, and a conductive layer over the first insulating layer. The semiconductor layer includes a first region, a pair of second regions, a pair of third regions, and a pair of fourth regions. The second regions sandwich the first region, the third regions sandwich the first region and the second regions, and the fourth regions sandwich the first region, the second regions, and the third regions. The first region includes a region overlapping with the first insulating layer and the conductive layer, the second regions and the third (Continued)

regions each include a region overlapping with the first insulating layer and not overlapping with the conductive layer, and the fourth regions overlap with neither the first insulating layer nor the conductive layer. A thickness of the first insulating layer in regions overlapping with the second regions is substantially equal to a thickness of the first insulating layer in a region overlapping with the first region. A thickness of the first insulating layer in regions overlapping with the third regions is smaller than the thickness of the first insulating layer in the regions overlapping with the second regions.

13 Claims, 39 Drawing Sheets

(58) Field of Classification Search
CPC ....... H01L 29/78648; H01L 2029/7863; H01L 29/4908; H01L 29/0684
USPC ......................................................... 257/288
See application file for complete search history.

(56) References Cited

U.S. PATENT DOCUMENTS

| | | | | |
|---|---|---|---|---|
| 6,534,789 | B2 | 3/2003 | Ishida | |
| 6,646,287 | B1 * | 11/2003 | Ono | H10D 86/60 |
| | | | | 257/E27.111 |
| 6,765,562 | B2 | 7/2004 | Yamazaki et al. | |
| 6,939,750 | B2 | 9/2005 | Hotta et al. | |
| 7,061,565 | B2 | 6/2006 | Kwon et al. | |
| 7,161,181 | B2 | 1/2007 | Hotta et al. | |
| 7,268,777 | B2 | 9/2007 | Yamazaki et al. | |
| 7,279,348 | B2 | 10/2007 | Hotta et al. | |
| 7,323,351 | B2 | 1/2008 | Hotta et al. | |
| 7,489,291 | B2 | 2/2009 | Yamazaki et al. | |
| 7,532,208 | B2 | 5/2009 | Yamazaki et al. | |
| 8,514,340 | B2 | 8/2013 | Kwon et al. | |
| 8,564,575 | B2 | 10/2013 | Yamazaki et al. | |
| 8,624,245 | B2 | 1/2014 | Yamazaki | |
| 8,927,349 | B2 | 1/2015 | Yamazaki | |
| 9,324,881 | B2 | 4/2016 | Yamazaki | |
| 9,443,876 | B2 | 9/2016 | Yamazaki et al. | |
| 9,496,408 | B2 | 11/2016 | Yamazaki et al. | |
| 9,735,284 | B2 | 8/2017 | Yamazaki | |
| 9,741,865 | B2 | 8/2017 | Yamazaki et al. | |
| 9,899,536 | B2 | 2/2018 | Yamazaki et al. | |
| 9,929,279 | B2 | 3/2018 | Yamazaki et al. | |
| 10,014,415 | B2 | 7/2018 | Yamazaki | |
| 10,249,645 | B2 | 4/2019 | Yamazaki et al. | |
| 10,388,796 | B2 | 8/2019 | Yamazaki et al. | |
| 10,505,049 | B2 | 12/2019 | Yamazaki | |
| 10,680,116 | B2 | 6/2020 | Yamazaki et al. | |
| 10,811,435 | B2 | 10/2020 | Yamazaki et al. | |
| 10,861,983 | B2 | 12/2020 | Yamazaki | |
| 11,011,648 | B2 | 5/2021 | Yamazaki et al. | |
| 11,107,837 | B2 | 8/2021 | Yamazaki et al. | |
| 11,342,464 | B2 | 5/2022 | Yamazaki | |
| 11,640,996 | B2 | 5/2023 | Yamazaki et al. | |
| 11,728,437 | B2 | 8/2023 | Yamazaki | |
| 11,942,555 | B2 | 3/2024 | Yamazaki et al. | |
| 12,283,634 | B2 | 4/2025 | Yamazaki et al. | |
| 2001/0019127 | A1 * | 9/2001 | Ishida | H01L 29/78621 |
| | | | | 257/E21.309 |
| 2002/0089483 | A1 | 7/2002 | Yamazaki et al. | |
| 2003/0151049 | A1 | 8/2003 | Hotta et al. | |
| 2003/0155594 | A1 * | 8/2003 | Ohnuma | H01L 27/1288 |
| | | | | 257/E29.151 |

| | | | | |
|---|---|---|---|---|
| 2005/0230752 | A1 * | 10/2005 | Kanno | H01L 29/66757 |
| | | | | 438/149 |
| 2006/0091387 | A1 * | 5/2006 | Yamazaki | H10D 86/60 |
| | | | | 257/59 |
| 2006/0192907 | A1 | 8/2006 | Kwon et al. | |
| 2006/0270124 | A1 * | 11/2006 | You | H01L 29/78621 |
| | | | | 438/151 |
| 2007/0108449 | A1 * | 5/2007 | Oue | H01L 29/4908 |
| | | | | 257/E29.151 |
| 2007/0296003 | A1 | 12/2007 | Park et al. | |
| 2012/0313152 | A1 * | 12/2012 | Yokoi | H10D 30/6755 |
| | | | | 257/288 |
| 2015/0221678 | A1 | 8/2015 | Yamazaki et al. | |
| 2015/0221774 | A1 | 8/2015 | Yamazaki et al. | |
| 2015/0263141 | A1 * | 9/2015 | Yamazaki | H01L 29/4908 |
| | | | | 438/104 |
| 2016/0172502 | A1 * | 6/2016 | Yamazaki | H10D 30/673 |
| | | | | 257/43 |
| 2016/0336352 | A1 | 11/2016 | Yamazaki et al. | |
| 2017/0025548 | A1 * | 1/2017 | Yamazaki | H01L 29/66969 |
| 2017/0179164 | A1 * | 6/2017 | Choi | H01L 29/78618 |
| 2021/0336064 | A1 * | 10/2021 | Gu | H01L 29/66969 |
| 2022/0020781 | A1 | 1/2022 | Yamazaki et al. | |
| 2023/0369511 | A1 | 11/2023 | Yamazaki | |
| 2025/0159941 | A1 | 5/2025 | Yamazaki et al. | |

FOREIGN PATENT DOCUMENTS

| | | |
|---|---|---|
| DE | 102015201707 | 8/2015 |
| JP | 10-104663 A | 4/1998 |
| JP | 11-121757 A | 4/1999 |
| JP | 2000-047263 A | 2/2000 |
| JP | 2003-203919 A | 7/2003 |
| JP | 2004-163901 A | 6/2004 |
| JP | 2014-007399 A | 1/2014 |
| JP | 2015-179822 A | 10/2015 |
| JP | 2015-181151 A | 10/2015 |
| KR | 1998-0025065 A | 7/1998 |
| KR | 2000-0011242 A | 2/2000 |
| KR | 2003-0057460 A | 7/2003 |
| KR | 2007-0117269 A | 12/2007 |
| KR | 2015-0092722 A | 8/2015 |
| KR | 2017-0074267 A | 6/2017 |
| KR | 2018-0066848 A | 6/2018 |
| TW | 200302372 | 8/2003 |
| TW | 201535690 | 9/2015 |
| TW | 201743453 | 12/2017 |
| WO | WO-2011/068066 | 6/2011 |

OTHER PUBLICATIONS

Written Opinion (Application No. PCT/IB2020/057052), dated Oct. 27, 2020.

Du Ahn.B et al., "Comparison of the effects of Ar and H2 plasmas on the performance of homojunctioned amorphous indium gallium zinc oxide thin film transistors", Appl. Phys. Lett. (Applied Physics Letters) , 2008, vol. 93, No. 20, pp. 203506-1-203506-3.

Jeong.H et al., "Coplanar amorphous-indium-gallium-zinc-oxide thin film transistor with He plasma treated heavily doped layer", Appl. Phys. Lett. (Applied Physics Letters) , 2014, vol. 104, pp. 022115-1-02115-5.

Bae.J et al., "Development of Oxide TFT's Structures", SID Digest '13 : SID International Symposium Digest of Technical Papers, May 21, 2013, pp. 89-92.

Taiwanese Office Action (Application No. 109125507), dated Feb. 20, 2024.

* cited by examiner

FIG. 5A
100
120a   141a           B1           141b   120b
A1                                               A2
110
112       108
B2
FIG. 5B
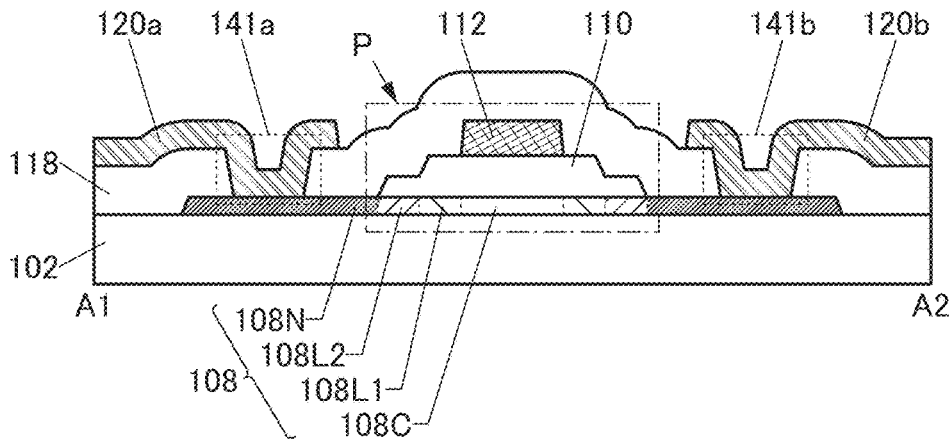
120a   141a    P    112    110    141b   120b
118
102
A1                                             A2
108N
108L2
108    108L1
108C
FIG. 5C
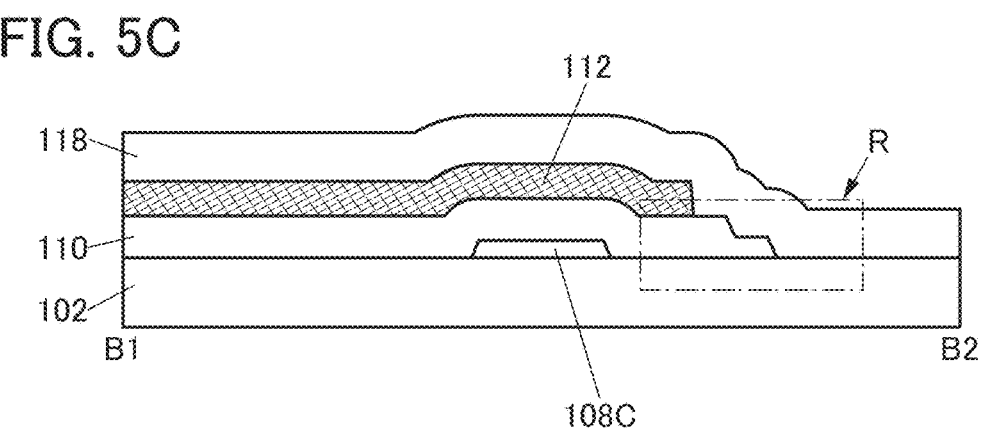
112
118
R
110
102
B1                                             B2
108C FIG. 19A
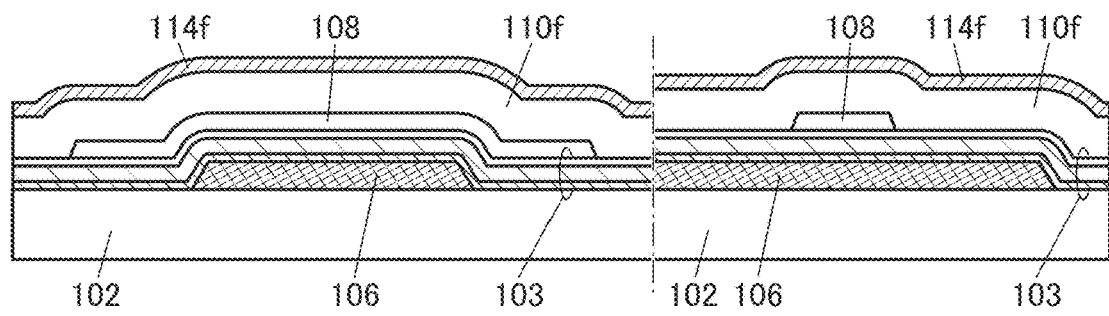
FIG. 19B
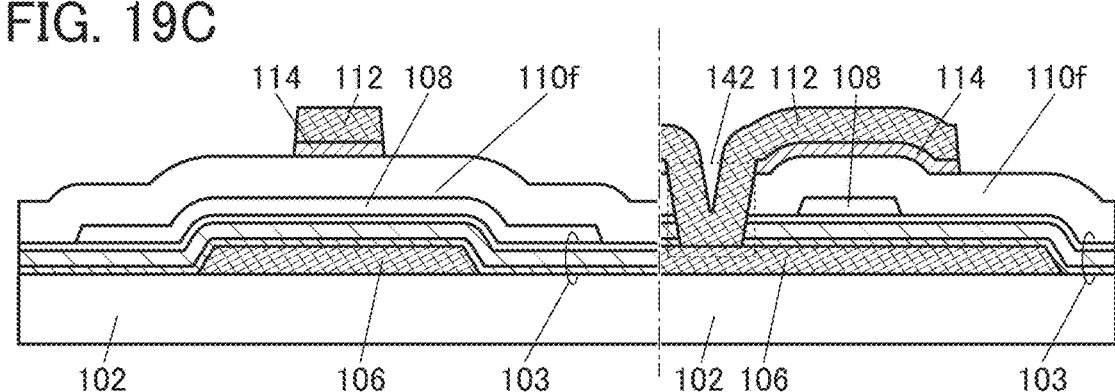
FIG. 19C
FIG. 19D
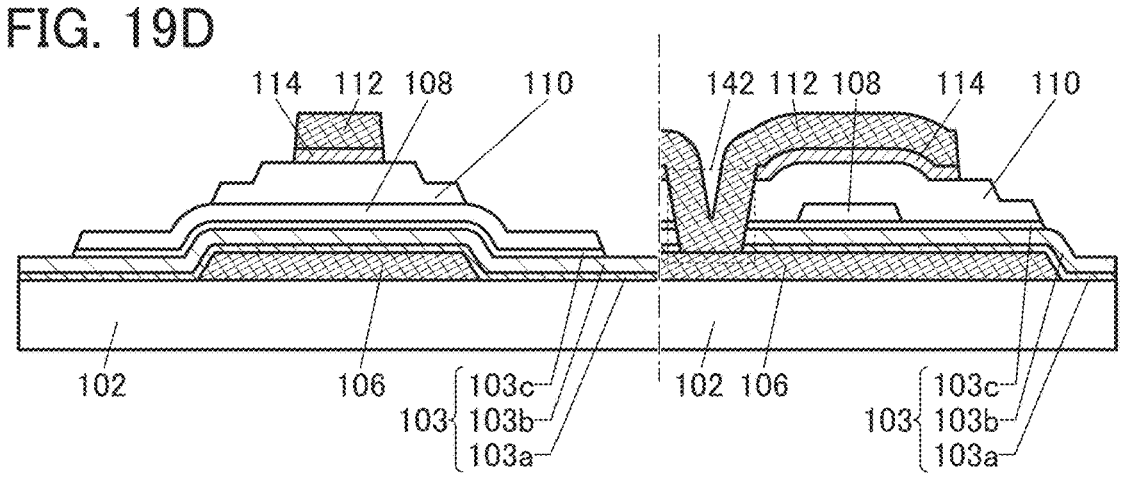

FIG. 22A
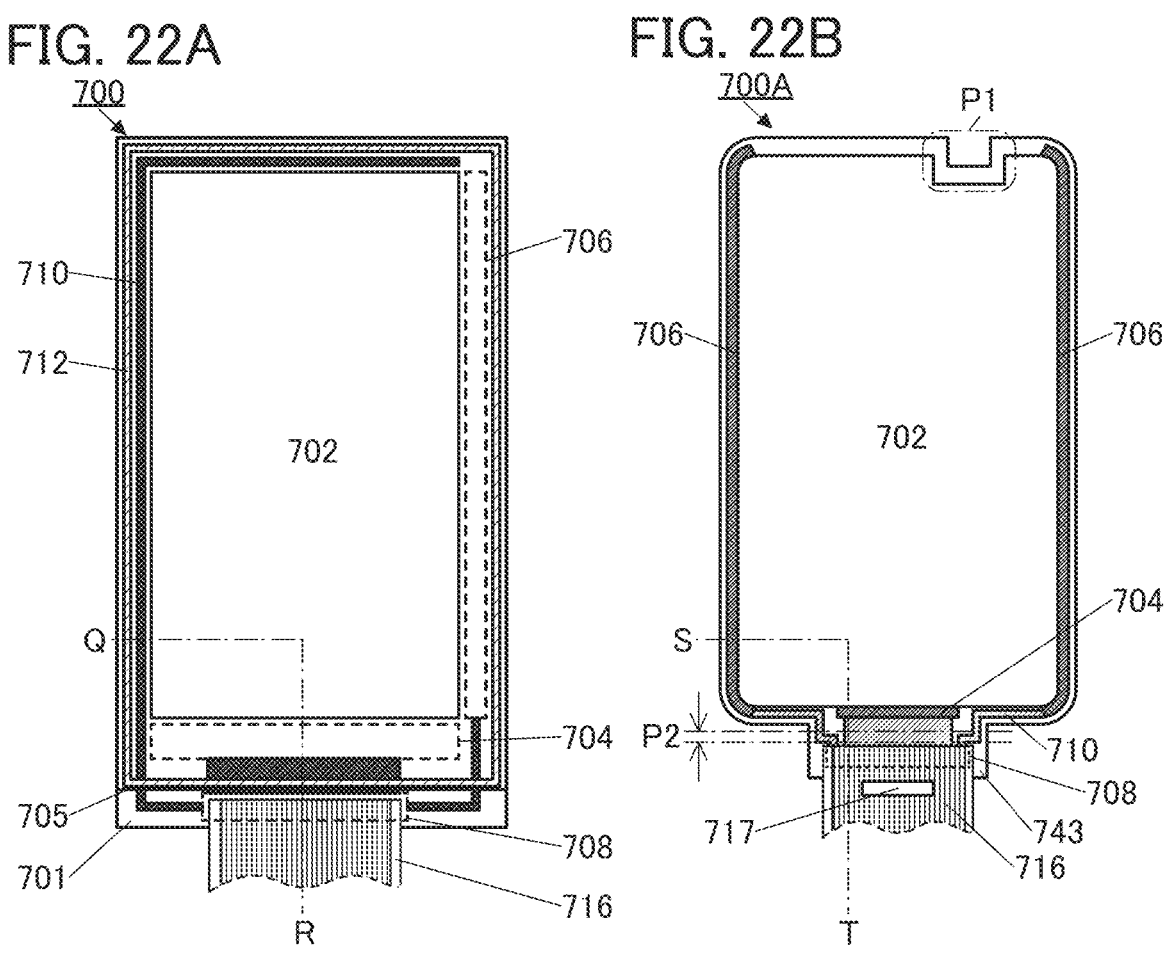
FIG. 22B
FIG. 22C
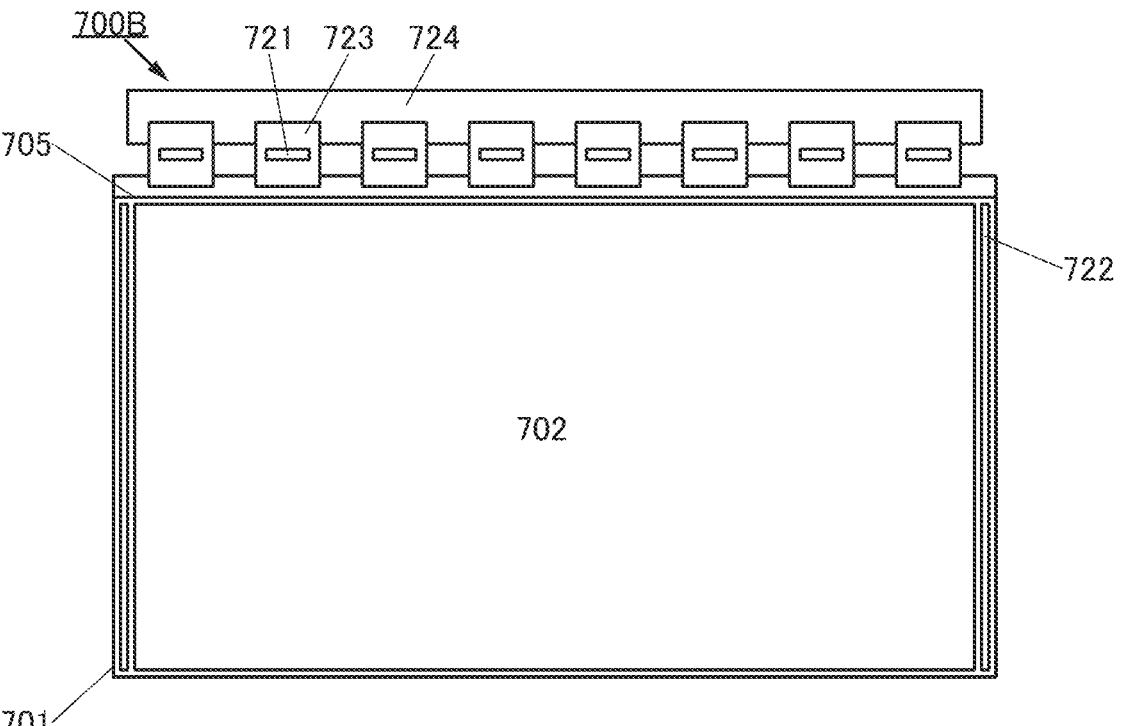

400

400LC

400EL

6001

6005

6006

6000

6009

6010

6011

6002

6000

6018

6001

6017a

6017b

6002

6015   6006   6010   6011   6009   6016

6500

FIG. 31A
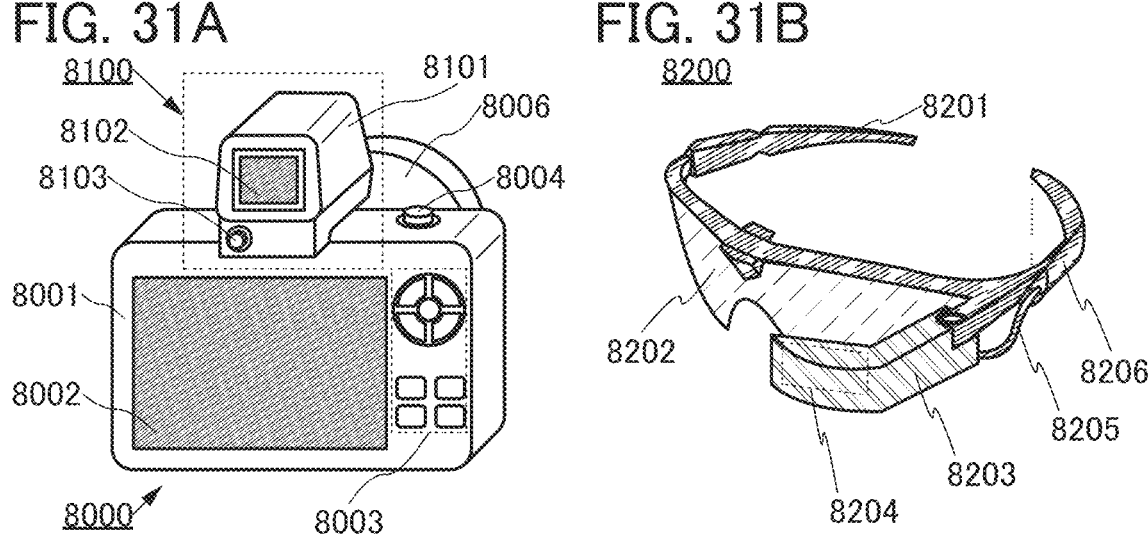
FIG. 31B
FIG. 31C
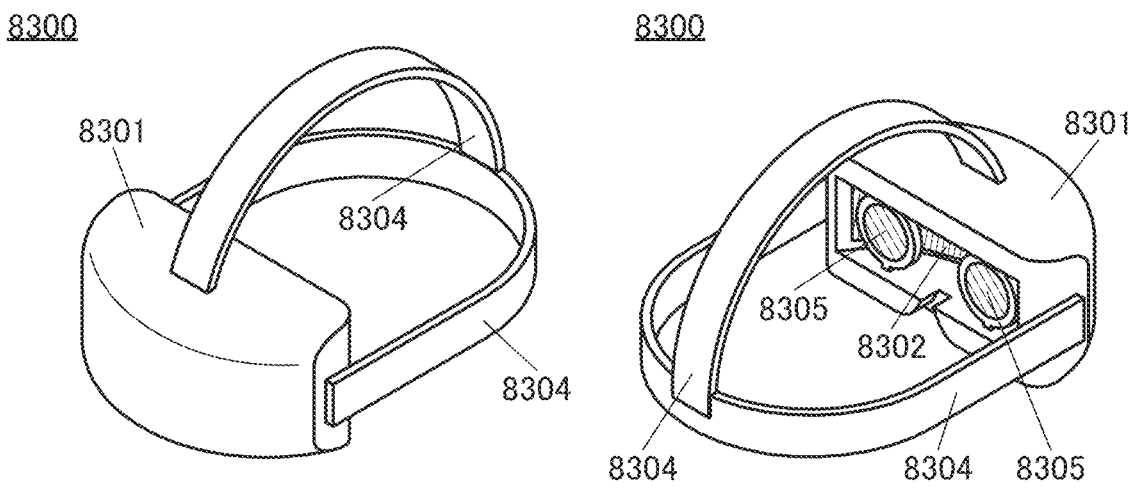
FIG. 31D
FIG. 31E
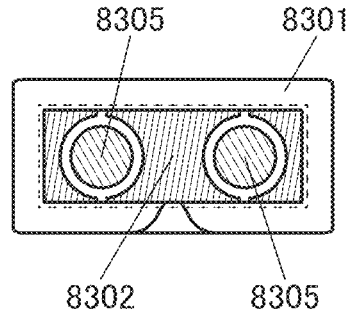

FIG. 32A
9100
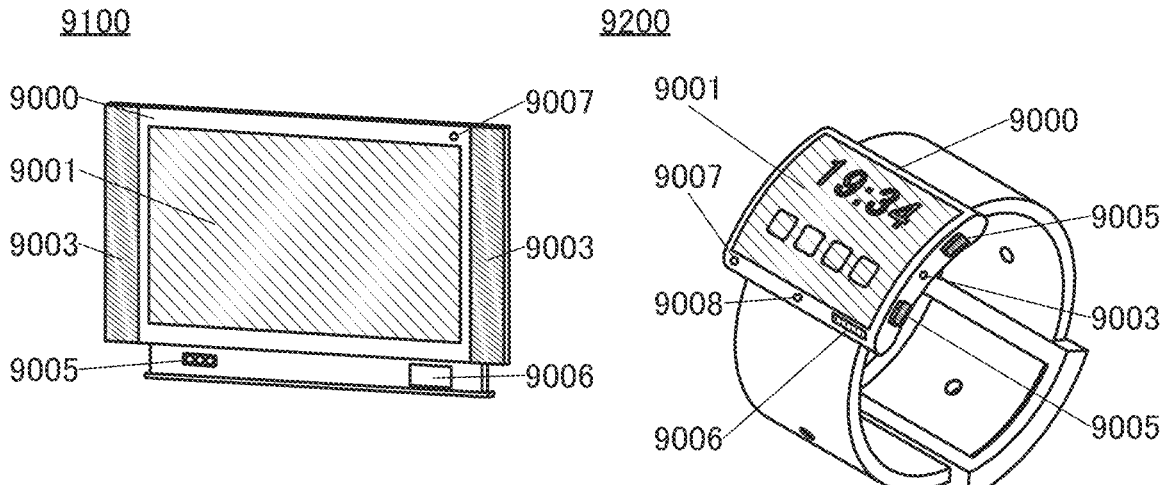
FIG. 32B
9101
FIG. 32C
9102
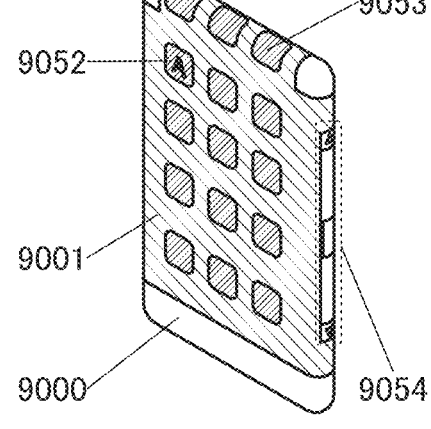
FIG. 32D
9200
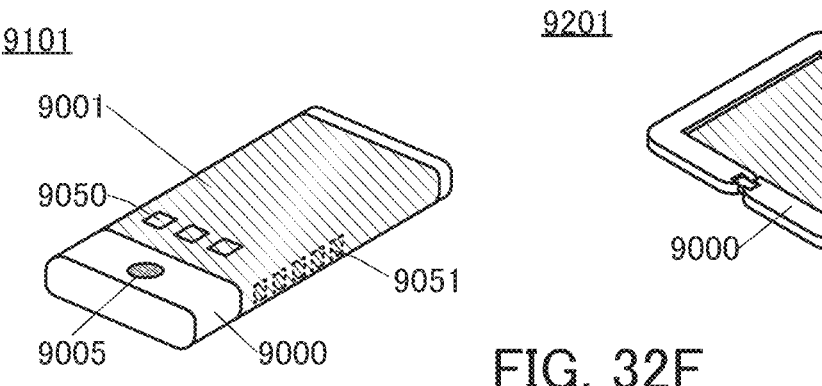
FIG. 32E
9201
FIG. 32F
9201
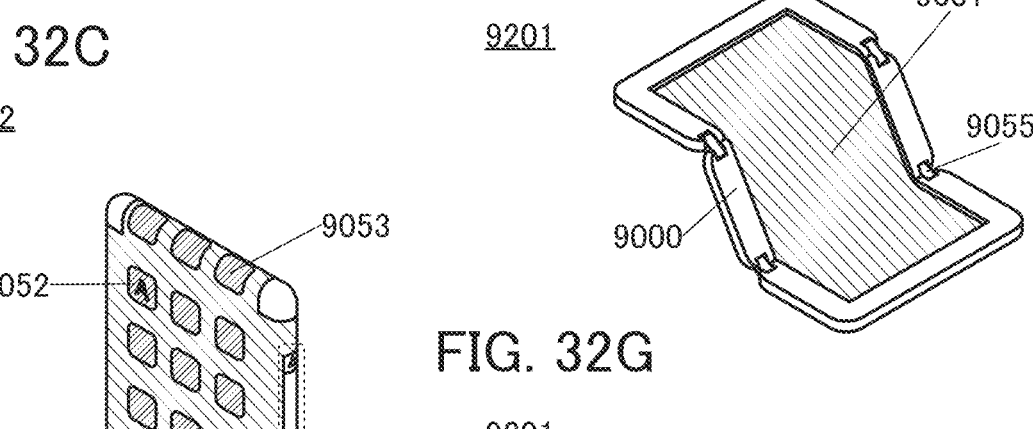
FIG. 32G
9201
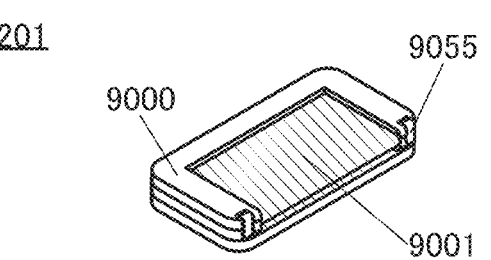

7100

7101
7500
7103
7111

7200

7211
7500
7212
7213
7214

7300

7301
7303
7500
7311

7400

7401
7500
7311 sample A

PR
Mo
SiON-2
OS
SiON-1
SiN
Cu
Glass 1.5 μm sample B

PR
Mo
SiON-2
OS
SiON-1
SiN
Cu
Glass 1.5 μm sample A sample A

Plasma treatment: 350 °C, heat treatment: not performed

Plasma treatment: 240 °C, heat treatment: not performed

Plasma treatment: 350 °C, heat treatment: 250 °C

Plasma treatment: 240 °C, heat treatment: 250 °C

Plasma treatment: 350 °C, 60 sec

Plasma treatment: 240 °C, 60 sec

SEMICONDUCTOR DEVICE AND METHOD FOR MANUFACTURING SEMICONDUCTOR DEVICE

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device in which the field-effect mobility (simply referred to as mobility or µFE in some cases) is increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case of using amorphous silicon; therefore, a high-performance display device provided with driver circuits can be obtained.

There is a trend in a display device toward a larger screen, and development taking a screen size of 60 inches diagonal or more or 120 inches diagonal or more into consideration has been progressed. Furthermore, there is a trend in resolution of a screen toward a higher definition, for example, full high definition (the number of pixels: 1920×1080; also referred to as "2K", for example), ultra high definition (the number of pixels: 3840×2160; also referred to as "4K", for example), and super high definition (the number of pixels: 7680×4320; also referred to as "8K", for example).

An increase in screen size or definition tends to increase wiring resistance in a display portion. Patent Document 2 discloses a technique of forming a low-resistance wiring layer using copper (Cu) in order to suppress an increase in wiring resistance in a liquid crystal display device using an amorphous silicon transistor.

REFERENCES

Patent Documents

[Patent Document 1] Japanese Published Patent Application No. 2014-7399

[Patent Document 2] Japanese Published Patent Application No. 2004-163901

SUMMARY OF THE INVENTION

Problems to be Solved by the Invention

An object of one embodiment of the present invention is to provide a semiconductor device having favorable electrical characteristics. Another object of one embodiment of the present invention is to provide a highly reliable semiconductor device. Another object of one embodiment of the present invention is to provide a novel semiconductor device. Another object of one embodiment of the present invention is to provide a method for manufacturing a semiconductor device having favorable electrical characteristics. Another object of one embodiment of the present invention is to provide a method for manufacturing a highly reliable semiconductor device. Another object of one embodiment of the present invention is to provide a method for manufacturing a novel semiconductor device.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a semiconductor device including a semiconductor layer, a first insulating layer over the semiconductor layer, and a conductive layer over the first insulating layer. The semiconductor layer includes a first region, a pair of second regions, a pair of third regions, and a pair of fourth regions. The second regions sandwich the first region, the third regions sandwich the first region and the second regions, and the fourth regions sandwich the first region, the second regions, and the third regions. The first region includes a region overlapping with the first insulating layer and the conductive layer, the second regions and the third regions each include a region overlapping with the first insulating layer and not overlapping with the conductive layer, and the fourth regions overlap with neither the first insulating layer nor the conductive layer. A thickness of the first insulating layer in regions overlapping with the second regions is substantially equal to a thickness of the first insulating layer in a region overlapping with the first region. A thickness of the first insulating layer in regions overlapping with the third regions is smaller than the thickness of the first insulating layer in the regions overlapping with the second regions.

It is preferable that the above-described semiconductor device further include a second insulating layer, and the second insulating layer be in contact with a top surface and a side surface of the first insulating layer and top surfaces of the fourth regions.

In the above-described semiconductor device, it is preferable that the first insulating layer include an oxide or an oxynitride, and the second insulating layer include an oxide or an oxynitride.

In the above-described semiconductor device, it is preferable that the first insulating layer include an oxide or an oxynitride, and the second insulating layer include a nitride or a nitride oxide.

In the above-described semiconductor device, the third regions and the fourth regions each preferably include a first element. It is preferable that a concentration of the first element in the third regions be higher than a concentration of the first element in the second regions, and a concentration of the first element in the fourth regions be higher than the concentration of the first element in the third regions. The first element is preferably at least one of hydrogen, boron, nitrogen, and phosphorus.

In the above-described semiconductor device, it is preferable that the second regions have lower resistance than the first region, the third regions have lower resistance than the second regions, and the fourth regions have lower resistance than the third regions.

In the above-described semiconductor device, the resistance of the third regions is preferably higher than or equal to 2 times and lower than or equal to $1 \times 10^3$ times the resistance of the second regions.

In the above-described semiconductor device, the thickness of the first insulating layer in the regions overlapping with the third regions is preferably more than or equal to 0.2 times and less than or equal to 0.9 times the thickness of the first insulating layer in the regions overlapping with the second regions.

In the above-described semiconductor device, a width of the second regions and a width of the third regions are each preferably greater than or equal to 50 nm and less than or equal to 1 μm.

In the above-described semiconductor device, it is preferable that the semiconductor layer contain indium, an element M, and zinc, and the element M be at least one of aluminum, gallium, yttrium, and tin.

One embodiment of the present invention is a method for manufacturing a semiconductor device, including a step of forming an island-shaped semiconductor layer; a step of forming an insulating film over the semiconductor layer; a step of forming a conductive film over the insulating film; a step of forming a first resist mask whose end portion is positioned inward from an end portion of the semiconductor layer over the conductive film; a step of forming a conductive layer whose end portion is positioned inward from the end portion of the first resist mask by etching the conductive film with the first resist mask; a step of forming a first insulating layer by etching the insulating film with the first resist mask; a step of forming a second resist mask whose end portion is positioned outward from the end portion of the conductive layer by shrinkage of the first resist mask; a step of forming a second insulating layer by etching part of an upper portion of the first insulating layer with the second resist mask; a step of removing the second resist mask; a step of forming a third insulating layer over the conductive layer, the second insulating layer, and the semiconductor layer; and a step of supplying a first element to the semiconductor layer through the second insulating layer and the third insulating layer. Here, the first element is at least one of hydrogen, boron, nitrogen, and phosphorus.

In the above-described method for manufacturing a semiconductor device, the step of supplying the first element is preferably performed successively after the step of forming the third insulating layer without exposure to the air.

In the above-described method for manufacturing a semiconductor device, it is preferable that a wet etching method be employed in the step of forming the conductive layer, and a dry etching method be employed in the step of forming the first insulating layer and the step of forming the second insulating layer.

Effect of the Invention

According to one embodiment of the present invention, a semiconductor device having favorable electrical characteristics can be provided. Alternatively, a highly reliable semiconductor device can be provided. Alternatively, a novel semiconductor device can be provided. Alternatively, a method for manufacturing a semiconductor device having favorable electrical characteristics can be provided. Alternatively, a method for manufacturing a highly reliable semiconductor device can be provided. Alternatively, a method for manufacturing a novel semiconductor device can be provided.

Note that the description of these effects does not preclude the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIG. 3A and FIG. 3B are diagrams illustrating structure examples of semiconductor devices.

FIG. 4A and FIG. 4B are diagrams illustrating structure examples of semiconductor devices.

FIG. 5A is a top view of a semiconductor device. FIG. 5B and FIG. 5C are cross-sectional views of the semiconductor device.

FIG. 19A, FIG. 19B, FIG. 19C, and FIG. 19D are cross-sectional views illustrating a method for manufacturing a semiconductor device.

FIG. 22A, FIG. 22B, and FIG. 22C are top views of display devices.

FIG. 31A, FIG. 31B, FIG. 31C, FIG. 31D, and FIG. 31E are diagrams illustrating structure examples of electronic devices.

FIG. 32A, FIG. 32B, FIG. 32C, FIG. 32D, FIG. 32E, FIG. 32F, and FIG. 32G are diagrams illustrating structure examples of electronic devices.

MODE FOR CARRYING OUT THE INVENTION

Figure 1A:
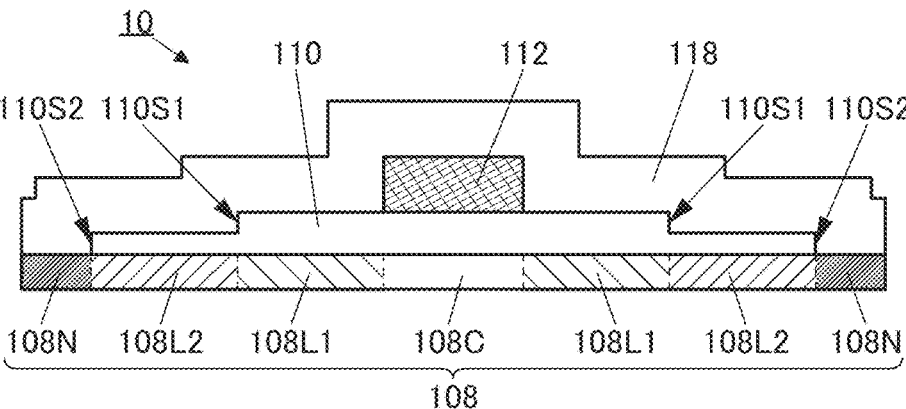
FIG. 1A, FIG. 1B, and FIG. 1C are diagrams illustrating structure examples of semiconductor devices.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Thus, the present invention should not be construed as being limited to the following description of the embodiments.

In each drawing described in this specification, the size, the layer thickness, or the region of each component is exaggerated for clarity in some cases.

Ordinal numbers such as "first", "second", and "third" used in this specification and the like are used in order to avoid confusion among components and do not limit the components numerically.

In this specification and the like, terms for describing arrangement, such as "over" and "under", are used for convenience to describe the positional relation between components with reference to drawings. Furthermore, the positional relation between components is changed as appropriate in accordance with a direction in which the components are described. Thus, terms for the description are not limited to those used in this specification, and the description can be rephrased appropriately depending on the situation.

In this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

In this specification and the like, the channel length direction of a transistor refers to one of directions parallel to the straight line that connects a source region and a drain region in the shortest distance. In other words, the channel length direction corresponds to one of directions of current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

In this specification and the like, the expression "having substantially the same top surface shapes" means that at least outlines of stacked layers partly overlap with each other. For example, the case of processing or partly processing an upper layer and a lower layer with the use of the same mask pattern is included. However, in some cases, the outlines do not completely overlap with each other and an end portion of the upper layer is positioned inward from an end portion of the lower layer or an end portion of the upper layer is positioned outward from an end portion of the lower layer; such a case is also represented by the expression "having substantially the same top surface shapes".

Unless otherwise specified, off-state current in this specification and the like refers to a drain current of a transistor in an off state (also referred to as a non-conducting state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

In this specification and the like, a display panel that is one embodiment of a display device has a function of displaying (outputting) an image or the like on (to) a display surface. Therefore, the display panel is one embodiment of an output device.

In this specification and the like, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display panel module or a display module, or simply as a display panel or the like in some cases.

Note that in this specification and the like, a touch panel that is one embodiment of a display device has a function of displaying an image or the like on a display surface and a function of a touch sensor that senses the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a structure in which a connector and an IC are mounted on a substrate of a touch panel is referred to as a touch panel module or a display module, or simply as a touch panel or the like in some cases.

Embodiment 1

In this embodiment, a semiconductor device of one embodiment of the present invention and a manufacturing method thereof will be described. As examples of the semiconductor device, structure examples of a transistor using an oxide semiconductor in a channel formation region and examples of a manufacturing method thereof will be described below.

Structure Example 1

Structure Example 1-1

FIG. 1A illustrates a schematic cross-sectional view of a transistor 10 in the channel length direction.

The transistor 10 includes a semiconductor layer 108, an insulating layer 110, and a conductive layer 112. The insulating layer 110 functions as a gate insulating layer. The conductive layer 112 functions as a gate electrode. The transistor 10 is what is called a top-gate transistor, in which the gate electrode is provided over the semiconductor layer 108.

The semiconductor layer 108 includes a region 108C, a pair of regions 108L1, a pair of regions 108L2, and a pair of regions 108N. The region 108C includes a region overlapping with the conductive layer 112 and the insulating layer 110 and functions as a channel formation region. The pair of regions 108L1 is provided with the region 108C therebetween. The pair of regions 108L2 is provided with the region 108C and the pair of regions 108L1 therebetween. The regions 108L1 and the regions 108L2 each include a region that does not overlap with the conductive layer 112 and overlaps with the insulating layer 110. The pair of regions 108N is provided with the region 108C, the pair of regions 108L1, and the pair of regions 108L2 therebetween. The regions 108N overlap with neither the conductive layer 112 nor the insulating layer 110.

The regions 108N have lower resistance than the region 108C and function as a source region and a drain region. It is preferable that the regions 108L1 and the regions 108L2 each have lower resistance than the region 108C and higher resistance than the regions 108N. The regions 108L1 and the regions 108L2 each have a function of a buffer region that relieves a drain electric field. The regions 108L1 and the regions 108L2 function as what is called LDD (Lightly Doped Drain) regions.

Providing the regions 108L1 and the regions 108L2 functioning as the LDD regions between the region 108C functioning as the channel formation region and the regions 108N functioning as the source region and the drain region can relieve an electric field in the drain region, thereby reducing a change in the threshold voltage of the transistor due to the electric field in the drain region.

The electric resistance of the regions 108N is preferably as low as possible; for example, the sheet resistance of the regions 108N is preferably higher than or equal to 1 $\Omega$/square and less than $1\times10^3$ $\Omega$/square, further preferably higher than or equal to 1 $\Omega$/square and lower than or equal to $8\times10^2$ $\Omega$/square.

The electric resistance of the region 108C in a state where the channel is not formed is preferably as high as possible. For example, the sheet resistance of the region 108C is preferably higher than or equal to $1\times10^7$ $\Omega$/square, further preferably higher than or equal to $1\times10^8$ $\Omega$/square, still further preferably higher than or equal to $1\times10^9$ $\Omega$/square.

The sheet resistance of the regions 108L1 and the regions 108L2 is preferably, for example, higher than or equal to $1\times10^3$ $\Omega$/square and lower than or equal to $1\times10^9$ $\Omega$/square, further preferably higher than or equal to $1\times10^3$ $\Omega$/square and lower than or equal to $1\times10^8$ $\Omega$/square, still further preferably higher than or equal to $1\times10^3$ $\Omega$/square and lower than or equal to $1\times10^7$ $\Omega$/square, yet further preferably higher than or equal to $1\times10^3$ $\Omega$/square and lower than or equal to $1\times10^6$ $\Omega$/square, yet still further preferably higher than or equal to $1\times10^3$ $\Omega$/square and lower than or equal to $1\times10^5$ $\Omega$/square. When the resistance is within the above range, a transistor that has favorable electrical characteristics and high reliability can be provided. Note that the sheet resistance can be calculated from a resistance value. Providing the regions 108L1 and the regions 108L2 having the resistance in the above range between the regions 108N and the region 108C can increase the source-drain withstand voltage of the transistor 100.

The electric resistance of the region 108C in a state where the channel is not formed is preferably more than or equal to $1\times10^6$ times and less than or equal to $1\times10^{12}$ times, further preferably more than or equal to $1\times10^6$ times and less than or equal to $1\times10^{11}$ times, still further preferably more than or equal to $1\times10^6$ times and less than or equal to $1\times10^{10}$ times the electric resistance of the regions 108N.

The electric resistance of the region 108C in a state where the channel is not formed is preferably more than or equal to $1\times10^0$ times and less than or equal to $1\times10^9$ times, further preferably more than or equal to $1\times10^1$ times and less than or equal to $1\times10^8$ times, still further preferably more than or equal to $1\times10^2$ times and less than or equal to $1\times10^7$ times the electric resistance of each of the regions 108L1 and the regions 108L2.

The electric resistance of each of the regions 108L1 and the regions 108L2 is preferably more than or equal to $1\times10^0$ times and less than or equal to $1\times10^9$ times, further preferably more than or equal to $1\times10^1$ times and less than or equal to $1\times10^8$ times, still further preferably more than or equal to $1\times10^1$ times and less than or equal to $1\times10^7$ times the electric resistance of the regions 108N.

It is preferable that the carrier concentration in the semiconductor layer 108 be the lowest in the region 108C and the highest in the regions 108N. Providing the regions 108L1 and the regions 108L2 between the region 108C and the regions 108N can keep the carrier concentration of the region 108C extremely low even when impurities such as hydrogen diffuse from the regions 108N during the manufacturing process, for example.

The carrier concentration of the region 108C functioning as the channel formation region is preferably as low as possible and is preferably lower than or equal to $1\times10^{18}$ $cm^{-3}$, further preferably lower than or equal to $1\times10^{17}$ $cm^{-3}$, still further preferably lower than or equal to $1\times10^{16}$ $cm^{-3}$, yet further preferably lower than or equal to $1\times10^{13}$ $cm^{-3}$, yet still further preferably lower than or equal to $1\times10^{12}$ $cm^{-3}$. Note that the lower limit of the carrier concentration of the region 108C is not particularly limited and can be, for example, $1\times10^{-9}$ $cm^{-3}$.

Meanwhile, the carrier concentration of the regions 108N can be higher than or equal to $5\times10^{18}$ $cm^{-3}$, preferably higher than or equal to $1\times10^{19}$ $cm^{-3}$, further preferably higher than or equal to $5\times10^{19}$ $cm^{-3}$, for example. The upper limit of the carrier concentration of the regions 108N is not particularly limited and can be, for example, $5\times10^{21}$ $cm^{-3}$ or $1\times10^{22}$ $cm^{-3}$.

The carrier concentration of each of the regions 108L1 and the regions 108L2 can lie between that of the region 108C and that of the regions 108N and is, for example, a value higher than or equal to $1\times10^{14}$ $cm^{-3}$ and lower than $1\times10^{20}$ $cm^{-3}$.

Note that the carrier concentration is not necessarily uniform in each of the regions 108L1 and the regions 108L2; in some cases, the carrier concentration has a falling gradient from the region 108N side toward the region 108C side. The hydrogen concentration in the regions 108L1 and the regions 108L2 may have a falling gradient from the region 108N side toward the region 108C side.

It is further preferable that the regions 108L2 have lower resistance than the regions 108L1. That is, the resistance of the semiconductor layer 108 preferably decreases gradually from the region 108C side toward the region 108N side. When the resistance is the highest in the region 108C, followed in order by those in the regions 108L1, the regions 108L2, and the regions 108N, the electric field in the drain region can be effectively relieved, thereby further reducing a change in the threshold voltage of the transistor.

The regions 108L1 preferably have higher resistance than the regions 108L2. In addition, the sheet resistance of the regions 108L1 is preferably, for example, higher than or equal to $1\times10^{4}$ $\Omega$/square and lower than or equal to $1\times10^{9}$ $\Omega$/square, further preferably higher than or equal to $1\times10^{4}$ $\Omega$/square and lower than or equal to $1\times10^{8}$ $\Omega$/square, still further preferably higher than or equal to $1\times10^{4}$ $\Omega$/square and lower than or equal to $1\times10^{7}$ $\Omega$/square, yet further preferably higher than or equal to $1\times10^{4}$ $\Omega$/square and lower than or equal to $1\times10^{6}$ $\Omega$/square, yet still further preferably higher than or equal to $1\times10^{4}$ $\Omega$/square and lower than or equal to $1\times10^{5}$ $\Omega$/square. Furthermore, the sheet resistance of the regions 108L2 is preferably, for example, higher than or equal to $1\times10^{3}$ $\Omega$/square and lower than or equal to $1\times10^{8}$ $\Omega$/square, further preferably higher than or equal to $1\times10^{3}$ $\Omega$/square and lower than or equal to $1\times10^{7}$ $\Omega$/square, still further preferably higher than or equal to $1\times10^{3}$ $\Omega$/square and lower than or equal to $1\times10^{6}$ $\Omega$/square, yet further preferably higher than or equal to $1\times10^{3}$ $\Omega$/square and lower than or equal to $1\times10^{5}$ $\Omega$/square, yet still further preferably higher than or equal to $1\times10^{3}$ $\Omega$/square and lower than or equal to $1\times10^{4}$ $\Omega$/square.

The resistance of the regions 108L1 is preferably higher than or equal to 2 times and lower than or equal to $1\times10^{3}$ times, further preferably higher than or equal to 3 times and lower than or equal to $1\times10^{2}$ times, still further preferably higher than or equal to 4 times and lower than or equal to 10 times the resistance of the regions 108L2. Providing the regions 108L1 and the regions 108L2 having the resistance in the above range between the regions 108N and the region 108C can increase the source-drain withstand voltage of the transistor 100.

The regions 108L1, the regions 108L2, and the regions 108N are each a region containing a first element. As the first element, for example, one or more of hydrogen, boron, carbon, nitrogen, fluorine, phosphorus, sulfur, arsenic, aluminum, magnesium, helium, neon, argon, krypton, and xenon can be used. In particular, one or more of hydrogen, boron, nitrogen, and phosphorus can be suitably used as the first element. Note that the regions 108L1, the regions 108L2, and the regions 108N may each contain a plurality of first elements.

The concentration of the first element in the semiconductor layer 108 is preferably the highest in the regions 108N, followed in order by those in the regions 108L2, the regions 108L1, and the region 108C. The concentration of the first element in the semiconductor layer 108 can be analyzed by an analysis method such as secondary ion mass spectrometry (SIMS) or X-ray photoelectron spectroscopy (XPS), for example. In the case of using XPS analysis, ion sputtering from the top surface side or the back surface side is combined with XPS analysis, whereby the concentration distribution in the depth direction can be found. Note that in the case where the concentration of the first element is low, the first element is not detected in the analysis or is lower than or equal to the lower detection limit in some cases. In particular, since the concentration of the first element in the region 108C is low, the first element is not detected in the analysis or is lower than or equal to the lower detection limit in some cases. Also in the regions 108L1, the first element is not detected in the analysis or is lower than or equal to the lower detection limit in some cases.

It is preferable that the thickness of the insulating layer 110 in regions overlapping with the regions 108L1 be substantially equal to the thickness of the insulating layer 110 in a region overlapping with the region 108C. In addition, the thickness of the insulating layer 110 in regions overlapping with the regions 108L2 is preferably smaller than the thickness of the insulating layer 110 in the regions overlapping with the regions 108L1. That is, the thickness of the insulating layer 110 preferably becomes gradually smaller from the region 108C side toward the region 108N side, i.e., has a shape with a step (hereinafter, also referred to as a step-like shape).

With the insulating layer 110 having a step-like shape, the amount of first element added to the region 108C, the regions 108L1, the regions 108L2, and the regions 108N can be controlled, and the resistance of the semiconductor layer 108 can be the lowest in the regions 108N, followed in order by those in the regions 108L2, the regions 108L1, and the region 108C. With the insulating layer 110 having a step-like shape, the coverage with the layer formed over the insulating layer 110 (e.g., an insulating layer 118) can be improved and occurrence of a defect, such as a void or disconnection caused by a step, in the layer can be inhibited.

Note that in this specification and the like, the expression "the thickness of A is substantially equal to the thickness of B" means that the ratio of the thickness of B to the thickness of A is greater than or equal to 0.8 and less than or equal to 1.2.

As illustrated in FIG. 1A, end portions of the insulating layer 110 are positioned inward from end portions of the semiconductor layer 108. The insulating layer 110 has first side surfaces 110S1 and second side surfaces 110S2. In the cross-sectional view in the channel length direction, the first side surfaces 110S1 and the second side surfaces 110S2 are positioned over the semiconductor layer 108. Also in the cross-sectional view in the channel length direction, the first side surfaces 110S1 are positioned outward from end portions of the conductive layer 112, and the second side surfaces 110S2 are positioned outward from the first side surfaces 110S1.

The insulating layer 110 in contact with the semiconductor layer 108 preferably contains an oxide or an oxynitride. The insulating layer 110 further preferably includes a region containing oxygen in excess of that in the stoichiometric composition. In other words, the insulating layer 110 includes an insulating film capable of releasing oxygen. It is also possible to supply oxygen into the insulating layer 110 by forming the insulating layer 110 in an oxygen atmosphere, performing heat treatment in an oxygen atmosphere after the formation of the insulating layer 110, performing plasma treatment or the like in an oxygen atmosphere after the formation of the insulating layer 110, or depositing an oxide film or an oxynitride film over the insulating layer 110 in an oxygen atmosphere, for example. Note that an oxidizing gas (e.g., dinitrogen monoxide or ozone) may be used instead of oxygen or in addition to oxygen in each of the above treatments for supplying oxygen.

For example, the insulating layer 110 can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method.

In particular, the insulating layer 110 is preferably formed by a PECVD (plasma CVD) method.

The semiconductor layer 108 contains a metal oxide exhibiting semiconductor characteristics (hereinafter, also referred to as an oxide semiconductor). The semiconductor layer 108 preferably contains at least indium and oxygen. When the semiconductor layer 108 contains an oxide of indium, the carrier mobility can be increased. For example, a transistor that can flow higher current than a transistor using amorphous silicon can be provided.

There is no particular limitation on the crystallinity of a semiconductor material used for the semiconductor layer 108, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer 108 preferably contains a metal oxide. Alternatively, the semiconductor layer 108 may contain silicon. Examples of silicon include amorphous silicon and crystalline silicon (low-temperature polysilicon, single crystal silicon, or the like).

In the case of using a metal oxide, the semiconductor layer 108 preferably contains indium, an element M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, the element M is preferably one or more of aluminum, gallium, yttrium, and tin. The element M further preferably contains one or both of gallium and tin.

An oxide containing indium (In), gallium (Ga), and zinc (Zn) (hereinafter, also referred to as IGZO), for example, can be suitably used for the semiconductor layer 108. For example, an oxide with an atomic ratio of metal elements of In:Ga:Zn=1:1:1 or in the neighborhood thereof can be suitably used for the semiconductor layer 108.

As the semiconductor layer 108, an oxide containing, in addition to indium, gallium, and zinc, one or more of aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium can also be used. In particular, an oxide containing tin, aluminum, or silicon in addition to indium, gallium, and zinc is preferably used as the semiconductor layer, in which case a transistor with high field-effect mobility can be obtained.

In the case where the semiconductor layer 108 is an In-M-Zn oxide, a sputtering target used for depositing the In-M-Zn oxide preferably has the atomic ratio of In to the element M higher than or equal to 1. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=10:1:3, In:M:Zn=5:1:6, In:M:Zn=5:1:7, In:M:Zn=5:1:8, In:M:Zn=6:1:6, and In:M:Zn=5:2:5. In the case where two or more kinds of elements are contained as the element M, the proportion of the element M in the atomic ratio corresponds to the sum of the number of atoms of the two or more metal elements.

A target containing a polycrystalline oxide is preferably used as the sputtering target, in which case the semiconductor layer having crystallinity is easily formed. Note that the atomic ratio in the formed semiconductor layer may vary in the range of ±40% from any of the above atomic ratios of the metal elements contained in the sputtering target. For example, in the case where the composition of a sputtering target used for the semiconductor layer is In:M:Zn=4:2:4.1 [atomic ratio], the composition of the formed semiconductor layer is sometimes in the neighborhood of In:M:Zn=4:2:3 [atomic ratio].

Note that when the atomic ratio is described as In:M:Zn=4:2:3 or in the neighborhood thereof, the case is included where the element M is greater than or equal to 1 and less than or equal to 3 and Zn is greater than or equal to 2 and less than or equal to 4 with In being 4. When the atomic ratio is described as In:M:Zn=5:1:6 or in the neighborhood thereof, the case is included where M is greater than 0.1 and less than or equal to 2 and Zn is greater than or equal to 5 and less than or equal to 7 with In being 5. When the atomic ratio is described as In:M:Zn=1:1:1 or in the neighborhood thereof, the case is included where the element M is greater than 0.1 and less than or equal to 2 and Zn is greater than 0.1 and less than or equal to 2 with In being 1.

Here, the composition of the semiconductor layer 108 is described. The semiconductor layer 108 preferably contains a metal oxide containing at least indium and oxygen. Moreover, the semiconductor layer 108 may contain zinc additionally. The semiconductor layer 108 may contain gallium.

The composition of the semiconductor layer 108 greatly affects the electrical characteristics and reliability of the transistor 10. For example, an increase in the indium content in the semiconductor layer 108 can increase the carrier mobility and achieve a transistor with high field-effect mobility.

Here, one of indexes for evaluating the reliability of a transistor is a gate bias stress test (GBT) in which a state of applying an electric field to a gate is maintained. Among GBTs, a test in which a state where a positive potential relative to a source potential and a drain potential is supplied to a gate is maintained at high temperatures is referred to as a PBTS (Positive Bias Temperature Stress) test, and a test in which a state where a negative potential is supplied to a gate is maintained at high temperatures is referred to as an NBTS (Negative Bias Temperature Stress) test. The PBTS test and the NBTS test conducted in a state where irradiation with light such as white LED light is performed are respectively referred to as a PBTIS (Positive Bias Temperature Illumination Stress) test and an NBTIS (Negative Bias Temperature Illumination Stress) test.

In particular, in an n-channel transistor using an oxide semiconductor, a positive potential is applied to a gate in putting the transistor in an on state (a state where current flows); thus, the amount of change in threshold voltage in the PBTS test is one important item to be focused on as an indicator of the reliability of the transistor.

Here, the use of a metal oxide film not containing gallium or having a low gallium content in the composition of the semiconductor layer 108 can reduce the amount of change in the threshold voltage in the PBTS test. In the case where gallium is contained, the gallium content is preferably lower than the indium content in the composition of the semiconductor layer 108. Thus, a highly reliable transistor can be achieved.

One of the factors in change in the threshold voltage in the PBTS test is a defect state at the interface between a semiconductor layer and a gate insulating layer or in the vicinity of the interface. As the density of defect states increases, degradation in the PBTS test becomes significant. Generation of the defect states can be inhibited by reducing the gallium content in a portion of the semiconductor layer that is in contact with the gate insulating layer.

The following can be given, for example, as the reason why degradation in the PBTS test can be inhibited when gallium is not contained, or the gallium content is made low. Gallium contained in the semiconductor layer 108 has a property of attracting oxygen more easily than another metal element (e.g., indium or zinc) does. Thus, when, at the interface between a metal oxide film containing a large amount of gallium and the insulating layer 110 containing an oxide, gallium is bonded to excess oxygen in the insulating layer 110, trap sites of carriers (here, electrons) are probably generated easily. This might cause the change in the threshold voltage when a positive potential is applied to a gate and carriers are trapped at the interface between the semiconductor layer and the gate insulating layer.

Specifically, in the case where an In—Ga—Zn oxide is used for the semiconductor layer 108, a metal oxide film whose atomic proportion of In is higher than the atomic proportion of Ga can be used as the semiconductor layer 108. It is further preferable to use a metal oxide film whose atomic proportion of Zn is higher than the atomic proportion of Ga. In other words, a metal oxide film in which the atomic proportions of metal elements satisfy In >Ga and Zn>Ga is preferably used as the semiconductor layer 108.

For example, a metal oxide film having any of the following atomic ratios of metal elements can be used as the semiconductor layer 108: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=10:1:3, In:Ga:Zn=5:1:6, In:Ga:Zn=5:1:7, In:Ga:Zn=5:1:8, In:Ga:Zn=6:1:6, In:Ga:Zn=5:2:5, and a neighborhood thereof.

In the case where a metal oxide film containing indium and gallium is used as the semiconductor layer 108, the atomic proportion (atomic ratio) of gallium to metal elements contained in the metal oxide can be higher than 0 and lower than 50%, preferably higher than or equal to 0.05% and lower than or equal to 30%, further preferably higher than or equal to 0.1% and lower than or equal to 15%, still further preferably higher than or equal to 0.1% and lower than or equal to 5%. Note that oxygen vacancies (hereinafter, also referred to as Vo) are less likely to be generated when the semiconductor layer 108 contains gallium.

A metal oxide film not containing gallium may be used as the semiconductor layer 108. For example, an In—Zn oxide can be used as the semiconductor layer 108. In this case, when the atomic proportion of In to metal elements contained in the metal oxide film is increased, the field-effect mobility of the transistor can be increased. By contrast, when the atomic proportion of Zn to metal elements contained in the metal oxide is increased, the metal oxide film has high crystallinity; thus, a change in the electrical characteristics of the transistor can be inhibited and the reliability can be increased. Alternatively, a metal oxide film that contains neither gallium nor zinc, such as indium oxide, can be used as the semiconductor layer 108. The use of a metal oxide film not containing gallium can make a change in the threshold voltage particularly in the PBTS test extremely small.

For example, an oxide containing indium and zinc can be used as the semiconductor layer 108. In that case, for example, a metal oxide film with an atomic ratio of metal elements of In:Zn=2:3, In:Zn=4:1, or a neighborhood thereof can be used.

In particular, a metal oxide film whose atomic proportion of In is higher than the atomic proportion of the element M is preferably used as the semiconductor layer 108. Furthermore, a metal oxide film whose atomic proportion of Zn is higher than the atomic proportion of the element M is preferably used.

It is preferable to use a metal oxide film having crystallinity as the semiconductor layer 108. For example, a metal oxide film having a CAAC (c-axis aligned crystal) structure, which is described later, an nc (nano crystal) structure, a polycrystalline structure, a microcrystalline structure, or the like can be used. With the use of a metal oxide film having crystallinity as the semiconductor layer 108, the density of defect states in the semiconductor layer 108 can be reduced, which enables the semiconductor device to have high reliability.

As the semiconductor layer 108 has higher crystallinity, the density of defect states in the film can be lower. By contrast, the use of a metal oxide film with low crystallinity enables a transistor to flow a large amount of current.

The semiconductor layer 108 may have a stacked-layer structure in which layers with different compositions, layers with different crystallinities, or layers with different impurity concentrations are stacked.

In the case where the metal oxide film is formed by a sputtering method, the crystallinity of the formed metal oxide film can be increased as the substrate temperature (stage temperature) at the time of deposition is higher. The crystallinity of the formed metal oxide film can be increased as the proportion of a flow rate of an oxygen gas to the whole deposition gas (also referred to as oxygen flow rate ratio) used at the time of deposition is higher. In this manner, the crystallinity of the metal oxide film to be formed can be controlled by the substrate temperature and the oxygen flow rate ratio of the deposition gas.

A low-resistance material is preferably used for the conductive layer 112. The use of a low-resistance material for the conductive layer 112 can reduce parasitic resistance and enables the transistor to have a high on-state current, leading to a semiconductor device having a high on-state current. For example, the conductive layer 112 is preferably formed using a conductive film containing a metal or an alloy, in which case electric resistance can be reduced. Note that a conductive film containing an oxide may be used as the conductive layer 112. In addition, in a large-sized or high-resolution display device, wiring resistance can be reduced, which inhibits signal delay and enables high-speed operation. For the conductive layer 112, copper, silver, gold, aluminum, or the like can be used. Copper is particularly preferable because of its low resistance and high mass productivity.

The conductive layer 112 may have a stacked-layer structure. In the case where the conductive layer 112 has a stacked-layer structure, a second conductive layer is provided over and/or under a first conductive layer having low resistance. For the second conductive layer, a conductive material that is less likely to be oxidized (that has higher oxidation resistance) than the first conductive layer is preferably used. For the second conductive layer, a material that inhibits diffusion of components of the first conductive layer is preferably used. For the second conductive layer, for example, a metal oxide such as indium oxide, indium zinc oxide, indium tin oxide (ITO), indium tin oxide containing silicon (ITSO), or zinc oxide, or a metal nitride such as titanium nitride, tantalum nitride, molybdenum nitride, or tungsten nitride can be suitably used.

The transistor 10 preferably further includes the insulating layer 118. The insulating layer 118 functions as a protective layer protecting the transistor 10. For example, an inorganic insulating material such as an oxide, an oxynitride, a nitride oxide, or a nitride can be used for the insulating layer 118. More specifically, an inorganic insulating material such as silicon oxide, silicon oxynitride, silicon nitride, silicon nitride oxide, aluminum oxide, aluminum oxynitride, aluminum nitride, hafnium oxide, or hafnium aluminate can be used. Moreover, the insulating layer 118 may have a stacked-layer structure of two or more layers.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

In the case where an oxynitride and a nitride oxide, which have the same elements, are described in this specification, the oxynitride includes a material that has a higher oxygen content and/or a lower nitrogen content than the nitride oxide. Similarly, the nitride oxide includes a material that has a lower oxygen content and/or a higher nitrogen content than the oxynitride. For example, in the case where silicon oxynitride and silicon nitride oxide are described, the silicon oxynitride includes a material that has a higher oxygen content and a lower nitrogen content than the silicon nitride oxide. Similarly, the silicon nitride oxide includes a material that has a lower oxygen content and a higher nitrogen content than the silicon oxynitride.

The insulating layer 118 may function as a supply source of the first element to the regions 108L1, the regions 108L2, and the regions 108N. For example, the insulating layer 118 can function as a supply source of hydrogen to the regions 108L1, the regions 108L2, and the regions 108N. The distance to the insulating layer 118 differs between the regions 108L1, the regions 108L2, and the regions 108N; thus, the amount of hydrogen supplied from the insulating layer 118 can be made different therebetween. Specifically, among the regions 108N, the regions 108L2, and the regions 108L1, the distance to the insulating layer 118 is the shortest and the amount of hydrogen to be added is the largest in the regions 108N, followed in order by those in the regions 108L2 and the regions 108L1. That is, the resistance can be the lowest in the regions 108N, followed in order by those of the regions 108L2 and the regions 108L1. The insulating layer 118 is in contact with the regions 108N of the semiconductor layer 108. Since the insulating layer 118 is provided in contact with the regions 108N, the resistance of especially the regions 108N can be lowered. Note that the conductive layer 112 and the insulating layer 110 are provided between the region 108C and the insulating layer 118, so that hydrogen is unlikely to be added to the region 108C and the resistance thereof can be inhibited from being lowered.

In the case where hydrogen is used as the first element, the insulating layer 118 may be formed using a mixed gas including a gas containing hydrogen. This enables hydrogen to be effectively supplied to the regions 108N exposed at the time of forming the insulating layer 118, which can further lower the resistance of the regions 108N. As the gas containing hydrogen, for example, hydrogen ($H_2$), ammonia ($NH_3$), silane ($SiH_4$), or the like can be used.

The transistor 10 of one embodiment of the present invention includes the regions 108L1 and the regions 108L2 between the region 108C and the regions 108N and thus can have a high drain withstand voltage, a high on-state current, and high reliability.

Structure Example 1-2

Figure 1B:
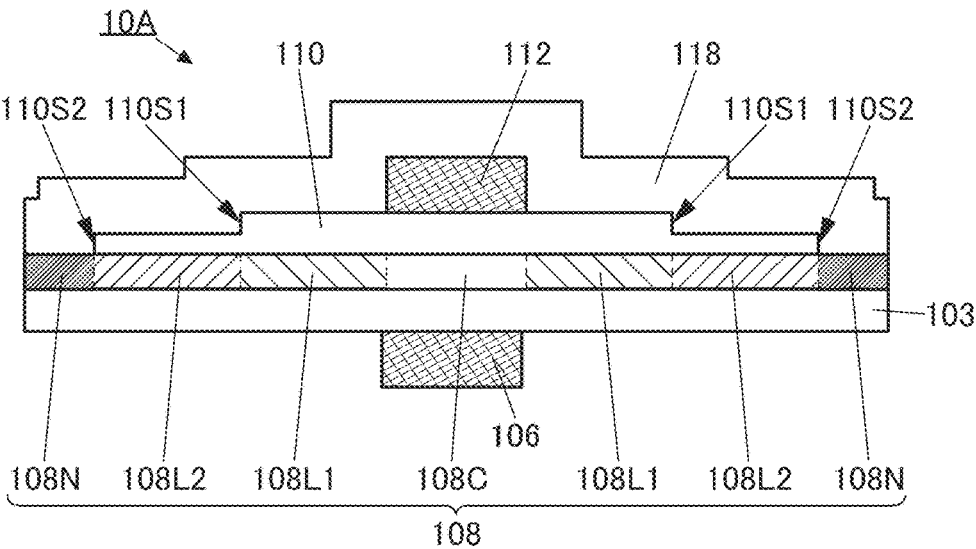

FIG. 1B illustrates a structure example different from that of the above-described transistor 10. FIG. 1B is a schematic cross-sectional view of a transistor 10A in the channel length direction. The transistor 10A is different from the transistor 10 mainly in including a conductive layer 106.

The conductive layer 106 includes a region overlapping with the semiconductor layer 108, the insulating layer 110, and the conductive layer 112 with the insulating layer 103 therebetween. The conductive layer 106 functions as a first gate electrode (also referred to as a back gate electrode). The insulating layer 103 functions as a first gate insulating layer. In this case, the conductive layer 112 functions as a second gate electrode (also referred to as a top gate electrode), and the insulating layer 110 functions as a second gate insulating layer.

For example, when the same potential is supplied to the conductive layer 112 and the conductive layer 106, the amount of current that can flow in the transistor 10A in an on state can be increased. In the transistor 10A, a potential for controlling the threshold voltage can be supplied to one of the conductive layer 112 and the conductive layer 106, and a potential for controlling an on/off state of the transistor 10A can be supplied to the other. In addition, the electrical characteristics of the transistor 10A can be stabilized by electrical connection between the source and one of the conductive layer 112 and the conductive layer 106.

The insulating layer 103 functioning as the second gate insulating layer preferably functions as a barrier layer that inhibits diffusion of impurities into the semiconductor layer 108 and the like from the formation surface side of the insulating layer 103. Examples of the impurities include metal components included in the conductive layer 106. The insulating layer 103 preferably satisfies one or more of the following characteristics, further preferably satisfies all of the following characteristics: a high withstand voltage, low stress of a film, unlikeliness of releasing hydrogen and water, unlikeliness of diffusing hydrogen and water, and few defects. An insulating film that can be used as the insulating layer 110 can be used as the insulating layer 103.

A conductive film that can be used as the conductive layer 112 can be used as the conductive layer 106.

Although FIG. 1(B) illustrates an example in which end portions of the conductive layer 106 are substantially aligned with the end portions of the conductive layer 112, one embodiment of the present invention is not limited thereto. The end portions of the conductive layer 106 may be positioned outward from the end portions of the conductive layer 112. Alternatively, the end portions of the conductive layer 106 may be positioned inward from the end portions of the conductive layer 112. Note that in this specification and the like, the expression "an end portion is substantially aligned with another end portion" means that at least outlines of stacked layers partly overlap with each other. For example, the case of processing an upper layer and a lower layer with use of the same mask pattern or mask patterns that are partly the same is included. However, in some cases, the outlines do not completely overlap with each other and an end portion of the upper layer is positioned inward from an end portion of the lower layer or an end portion of the upper layer is positioned outward from an end portion of the lower layer; such a case is also represented by the expression "an end portion is substantially aligned with another end portion".

Structure Example 1-3

Figure 1C:
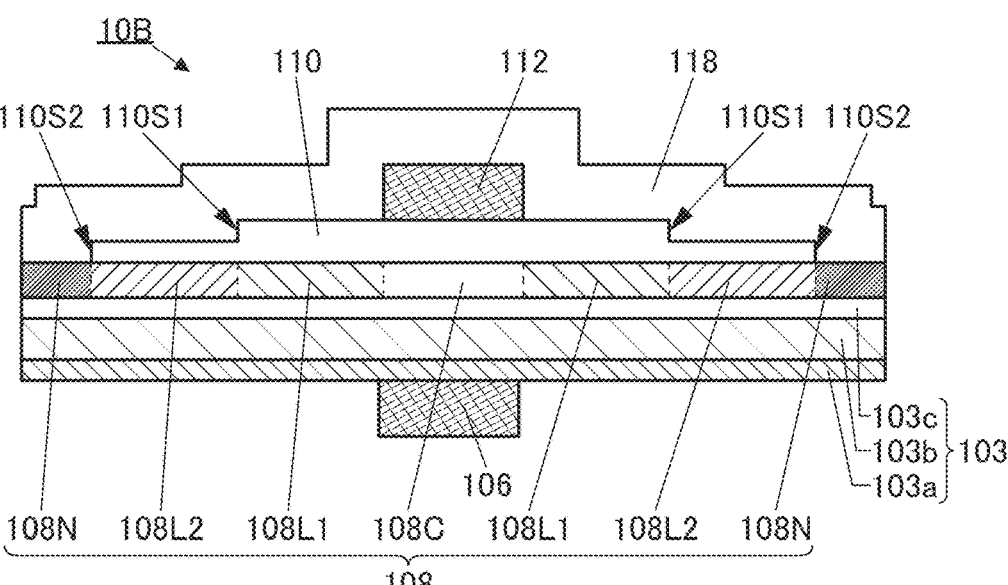

FIG. 1C illustrates a structure example different from that of the above-described transistor 10A. FIG. 1C is a schematic cross-sectional view of a transistor 10B in the channel length direction. The transistor 10B is different from the transistor 10A mainly in that the insulating layer 103 has a stacked-layer structure.

FIG. 1C illustrates a structure example in which the insulating layer 103 has a three-layer structure in which an insulating layer 103a, an insulating layer 103b, and an insulating layer 103c are stacked in this order from the conductive layer 106 side. The insulating layer 103a is in contact with the conductive layer 106. The insulating layer 103c is in contact with the semiconductor layer 108.

Of the three insulating films included in the insulating layer 103, the insulating layer 103a positioned on the formation surface side of the insulating layer 103 is preferably formed using an insulating film containing nitrogen. Meanwhile, the insulating layer 103c in contact with the semiconductor layer 108 is preferably formed using an insulating film containing oxygen. The three insulating films included in the insulating layer 103 are preferably formed successively without exposure to the air with a plasma CVD apparatus.

The insulating layer 103a is preferably a dense film that can prevent diffusion of impurities from the layers therebelow. The insulating layer 103a is preferably a film capable of blocking metal elements, hydrogen, water, and the like contained in a member (e.g., a substrate) on the formation surface side of the insulating layer 103a. Thus, an insulating film that is formed at a lower deposition rate than the insulating layer 103b can be used as the insulating layer 103a.

As the insulating layer 103a, an insulating film containing nitrogen, such as a silicon nitride film, a silicon nitride oxide film, an aluminum nitride film, or a hafnium nitride film, can be used, for example. In particular, a dense silicon nitride film formed with a plasma CVD apparatus is preferably used as the insulating layer 103a. With the use of such an insulating film containing nitrogen, diffusion of impurities from the formation surface side can be suitably inhibited even when the thickness of the insulating film is small.

The insulating layer 103c in contact with the semiconductor layer 108 is preferably formed using an insulating film containing an oxide or an oxynitride. It is particularly preferable to use an oxide film or an oxynitride film as the insulating layer 103c. As the insulating layer 103c, it is preferable to use a dense insulating film in which impurities such as water are less likely to be adsorbed on the surface. In addition, it is preferable to use an insulating film which includes as few defects as possible and in which impurities such as water and hydrogen are reduced.

It is further preferable that the insulating layer 103c include a region containing oxygen in excess of that in the stoichiometric composition. In other words, the insulating layer 103c is preferably an insulating film capable of releasing oxygen by heating. It is also possible to supply oxygen into the insulating layer 103c by forming the insulating layer 103c in an oxygen atmosphere, performing heat treatment on the formed insulating layer 103c in an oxygen atmosphere, performing plasma treatment or the like on the formed insulating layer 103c in an oxygen atmosphere, or depositing an oxide film or an oxynitride film over the insulating layer 103c in an oxygen atmosphere, for example. Note that an oxidizing gas (e.g., dinitrogen monoxide or ozone) may be used instead of oxygen or in addition to oxygen in each of the above treatments for supplying oxygen. Alternatively, heat treatment may be performed after an insulating film capable of releasing oxygen by heating is formed over the insulating layer 103c, so that oxygen may be supplied from the insulating film to the insulating layer 103c.

When a metal oxide film to be the semiconductor layer 108 is formed by a sputtering method in an atmosphere containing oxygen, oxygen can be supplied to the insulating layer 103c. Then, heat treatment is performed after the metal oxide film to be the semiconductor layer is formed, whereby oxygen in the insulating layer 103c can be supplied to the metal oxide film to reduce oxygen vacancies (Vo) in the metal oxide film.

As the insulating layer 103c, an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used, for example. It is particularly preferable to use a silicon oxide film or a silicon oxynitride film as the insulating layer 103c.

As the insulating layer 103b positioned between the insulating layer 103a and the insulating layer 103c, an insulating film that has low stress and is formed at a high deposition rate is preferably used. For example, the insulating layer 103b is preferably a film that has lower stress than the insulating layer 103a and the insulating layer 103c. In addition, the insulating layer 103b is preferably a film formed at a higher deposition rate than each of the insulating layer 103a and the insulating layer 103c.

An insulating film that releases hydrogen or water as little as possible is preferably used as the insulating layer 103b.

With the use of such an insulating film, diffusion of hydrogen and water from the insulating layer 103b to the semiconductor layer 108 through the insulating layer 103c by heat treatment or application of heat or the like during the process can be prevented, whereby the carrier concentration in the region 108C can be reduced.

As the insulating layer 103b, an insulating film that is less likely to absorb oxygen is further preferably used. In other words, an insulating film that does not easily allow diffusion of oxygen is preferably used. This can inhibit a reduction in the amount of oxygen supplied to the semiconductor layer 108, which is caused by diffusion of oxygen from the insulating layer 103c to the insulating layer 103b side in the heat treatment for supplying oxygen from the insulating layer 103c to the semiconductor layer 108 (or the metal oxide film to be the semiconductor layer 108).

As the insulating layer 103b, an insulating layer including one or more kinds of a silicon nitride oxide film, a silicon nitride film, an aluminum oxide film, a hafnium oxide film, an aluminum nitride film, and a hafnium nitride film can be used, for example. In particular, a silicon nitride oxide film or a silicon nitride film is preferably used as the insulating layer 103b.

Of the insulating layer 103a, the insulating layer 103b, and the insulating layer 103c included in the insulating layer 103, the insulating layer 103b preferably has the largest thickness. Note that the thickness (total thickness) of the insulating layer 103 can be determined on the basis of the values of the dielectric constant of the insulating films and the thicknesses of the insulating films in consideration of the value of the dielectric constant required for the insulating layer 103, withstand voltage characteristics required for the insulating layer 103, and the like. In other words, the thicknesses of the insulating films can each be adjusted within a range satisfying the above requirements.

In particular, the insulating layer 103b is preferably thicker than the insulating layer 103a. When the insulating layer 103b is thicker than the insulating layer 103a, the amount of hydrogen that can reach the insulating layer 103c can be reduced even when a film that easily releases hydrogen by heating is used as the insulating layer 103a. When the insulating layer 103a is thinner than the insulating layer 103b, the volume of the insulating layer 103a can be relatively small; as a result, the amount of hydrogen that can be released from the insulating layer 103a can be reduced.

The insulating layer 103b is preferably thicker than the insulating layer 103c. In the case where the insulating layer 103c is too thick and treatment for supplying oxygen into the insulating layer 103c is performed, the amount of oxygen which is not released by heating and remains in the insulating layer 103c is large; as a result, the amount of oxygen that can be supplied to the semiconductor layer 108 (or the metal oxide film to be the semiconductor layer 108) might be reduced. Thus, the insulating layer 103c is made thinner (or is made to have a smaller volume) than the insulating layer 103b, so that the amount of oxygen remaining in the insulating layer 103c after heating can be reduced. As a result, the proportion of oxygen supplied to the semiconductor layer 108 in oxygen supplied to the insulating layer 103c can be large, so that the amount of oxygen supplied to the semiconductor layer 108 can be effectively increased.

When the insulating layer 103b, which is the thickest, is formed at a high deposition rate and the insulating layer 103a and the insulating layer 103c, which are thinner than the insulating layer 103b, are formed to be dense films at a low deposition rate, the deposition time of the insulating layer 103 can be shortened without loss of reliability, leading to improvement in productivity.

Here, it is preferable that an insulating film containing at least silicon and nitrogen, typically a silicon nitride film or a silicon nitride oxide film, be used as the insulating layer 103a. It is preferable that an insulating film containing at least silicon, nitrogen, and oxygen, typically a silicon nitride oxide film or a silicon oxynitride film, be used as the insulating layer 103b. It is preferable that an insulating film containing at least silicon and oxygen, typically a silicon oxide film or a silicon oxynitride film, be used as the insulating layer 103c. Here, the amount of oxygen contained in the insulating layer 103b is preferably larger than that in the insulating layer 103a and smaller than that in the insulating layer 103c. In addition, the amount of nitrogen contained in the insulating layer 103b is preferably smaller than that in the insulating layer 103a and larger than that in the insulating layer 103c.

The nitrogen and oxygen contents in the insulating layer 103a, the insulating layer 103b, and the insulating layer 103c can be measured by an analysis method such as secondary ion mass spectrometry (SIMS) or X-ray photoelectron spectroscopy (XPS). Note that XPS is suitable when the content of a target element in a film is high (e.g., 0.5 atoms/cm$^3$ or more, or 1 atoms/cm$^3$ or more). By contrast, SIMS is suitable when the content of a target element in a film is low (e.g., 0.5 atoms/cm$^3$ or less, or 1 atoms/cm$^3$ or less). To compare the contents of elements in films, analysis with a combination of SIMS and XPS is further preferably used.

In the case where the insulating layer 103a, the insulating layer 103b, and the insulating layer 103c have different film densities, they can be distinguished from each other in some cases by a difference in contrast between them in a transmission electron microscopy (TEM) image or the like of a cross section of the insulating layer 103. Note that the boundary might be unclear in the case where their compositions or film densities are close to each other.

The insulating layer 103 may include two layers or four or more layers. For example, the insulating layer 103 can have a two-layer structure of the insulating layer 103a and the insulating layer 103c.

Structure Example 1-4

Figure 2A:
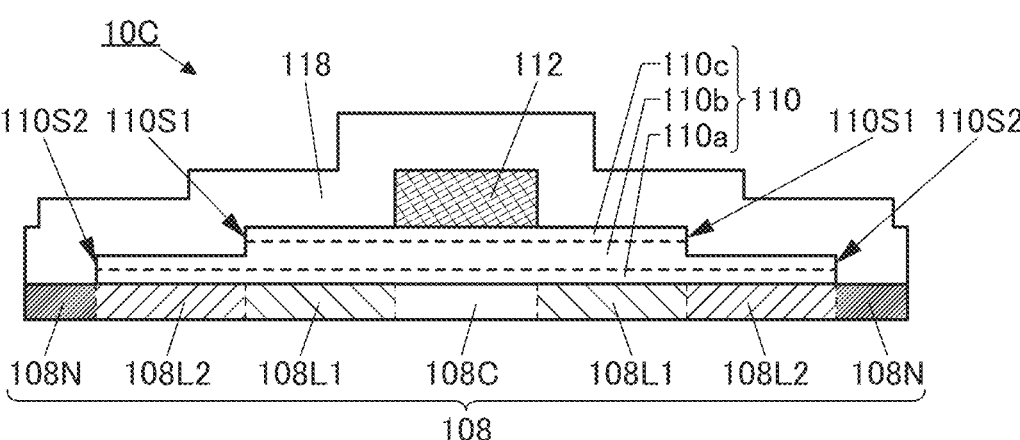
FIG. 2A, FIG. 2B, and FIG. 2C are diagrams illustrating structure examples of semiconductor devices.

FIG. 2A illustrates a structure example different from that of the above-described transistor 10. FIG. 2A is a schematic cross-sectional view of a transistor 10C in the channel length direction. The transistor 10C is different from the transistor 10 mainly in that the insulating layer 110 has a stacked-layer structure.

FIG. 2A illustrates an example in which the insulating layer 110 has a three-layer structure in which an insulating layer 110a, an insulating layer 110b, and an insulating layer 110c are stacked in this order from the semiconductor layer 108 side.

The insulating layer 110a includes a region in contact with the region 108C, the regions 108L1, and the regions 108L2. The insulating layer 110c includes a region in contact with the conductive layer 112. The insulating layer 110b is positioned between the insulating layer 110a and the insulating layer 110c.

The insulating layer 110a, the insulating layer 110b, and the insulating layer 110c are each preferably an insulating film containing an oxide or an oxynitride. It is also preferable that the insulating layer 110a, the insulating layer 110b, and the insulating layer 110c be successively formed without exposure to the air with the same deposition apparatus. The successive formation can suppress attachment of impurities such as water to the interfaces between the insulating layer 110a, the insulating layer 110b, and the insulating layer 110c.

As the insulating layer 110a, the insulating layer 110b, and the insulating layer 110c, an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used, for example.

For example, the insulating layer 110a, the insulating layer 110b, and the insulating layer 110c can be formed by a sputtering method, a CVD method, a vacuum evaporation method, a PLD method, an ALD method, or the like. As a CVD method, a plasma CVD method, a thermal CVD method, or the like can be used.

In particular, the insulating layer 110a, the insulating layer 110b, and the insulating layer 110c are preferably formed by a plasma CVD method.

The insulating layer 110a is formed over the semiconductor layer 108, and thus is preferably a film formed under conditions where the semiconductor layer 108 is damaged as little as possible. For example, the insulating layer 110a can be formed at a sufficiently low deposition rate. The insulating layer 110a is formed under the conditions where the semiconductor layer 108 is not damaged, so that the density of defect states at the interface between the semiconductor layer 108 and the insulating layer 110 is reduced and the transistor 10C can have high reliability.

For example, when a silicon oxynitride film is formed as the insulating layer 110a by a plasma CVD method, damage to the semiconductor layer 108 can be extremely small by low-power film formation.

For example, a source gas that contains a silicon-containing deposition gas such as silane or disilane and an oxidizing gas such as oxygen, ozone, dinitrogen monoxide, or nitrogen dioxide can be used as a deposition gas for deposition of a silicon oxynitride film. A dilution gas such as argon, helium, or nitrogen may be contained in addition to the source gas.

When the proportion of the flow rate of the deposition gas in the total flow rate of the film formation gas (hereinafter, also simply referred to as a flow rate ratio) is low, for example, the deposition rate can be made low, which allows formation of a dense film with few defects.

The insulating layer 110b is preferably a film formed at a higher deposition rate than the insulating layer 110a. Thus, the productivity can be improved.

For example, the insulating layer 110b can be formed at an increased deposition rate by setting the flow rate ratio of the deposition gas to be higher than that for the insulating layer 110a.

The insulating layer 110c is preferably an extremely dense film that has reduced defects on the surface and is less likely to adsorb impurities contained in the air, such as water. For example, like the insulating layer 110a, the insulating layer 110c can be formed at a sufficiently low deposition rate.

Since the insulating layer 110c is formed over the insulating layer 110b, the formation of the insulating layer 110c affects the semiconductor layer 108 less than the formation of the insulating layer 110a. Thus, the insulating layer 110c can be formed under conditions where the power is higher than that for the insulating layer 110a. The reduced flow rate ratio of the deposition gas and the relatively high-power film formation enable formation of a dense film in which defects on its surface are reduced.

That is, as the insulating layer 110, a stacked-layer film formed under conditions where the deposition rate of the insulating layer 110b is the highest, that of the insulating layer 110a is the second highest, and that of the insulating layer 110c is the lowest can be used. In the insulating layer 110, the etching rate of the insulating layer 110b is the highest, that of the insulating layer 110a is the second highest, and that of the insulating layer 110c is the lowest when wet etching or dry etching is performed under the same condition.

The insulating layer 110b is preferably formed to be thicker than the insulating layer 110a and the insulating layer 110c. The time taken to form the insulating layer 110 can be shortened by forming the insulating layer 110b, which is formed at the highest deposition rate, to be thick.

Note that insulating films formed of the same kind of material can be used as the insulating layer 110a, the insulating layer 110b, and the insulating layer 110c; thus, the boundary between the insulating layer 110a and the insulating layer 110b and the boundary between the insulating layer 110b and the insulating layer 110c cannot be clearly observed in some cases. Thus, the boundaries are denoted by dashed lines in FIG. 2A and the like. Since the insulating layer 110a and the insulating layer 110b have different film densities, the boundary therebetween can sometimes be observed as a difference in contrast in a transmission electron microscopy (TEM) image or the like of the cross section of the insulating layer 110. Similarly, the boundary between the insulating layer 110b and the insulating layer 110c can be observed as a difference in contrast in some cases.

Figure 2B:
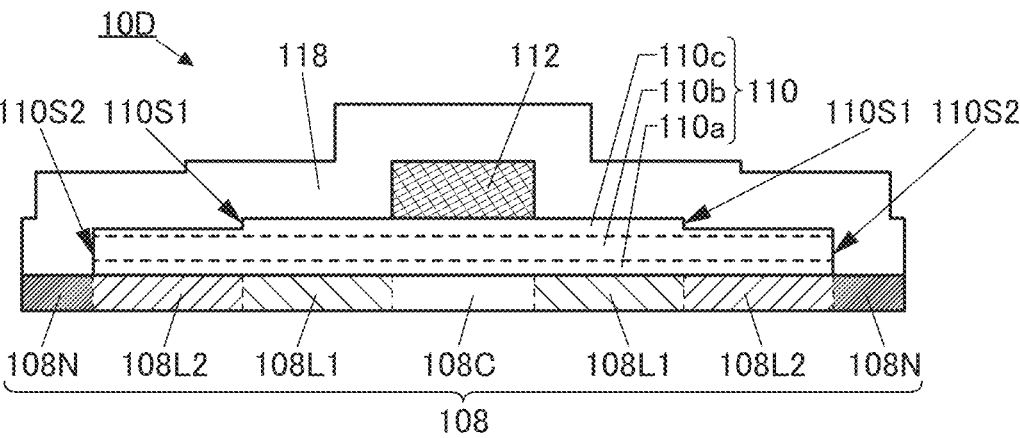
Figure 2C:
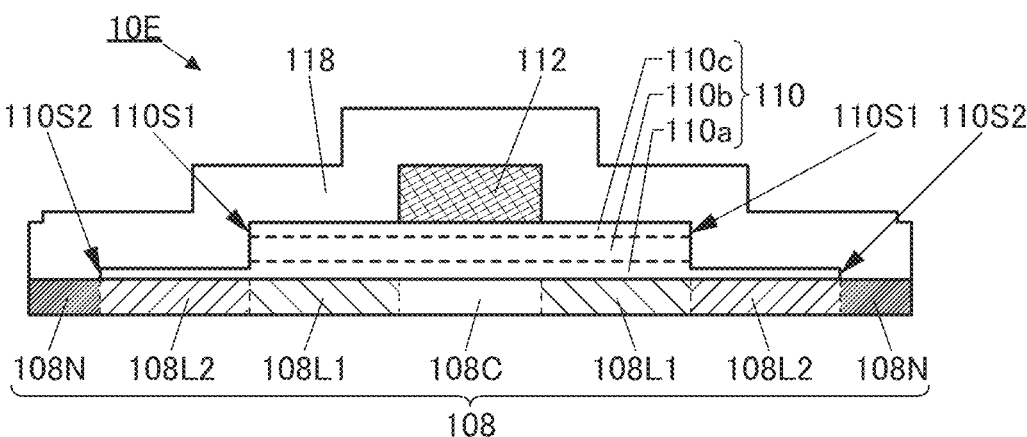

Although FIG. 2A illustrates the structure in which the insulating layer 110 in a region in contact with the region 108C and the insulating layer 110 in regions in contact with the regions 108L1 each have a stacked-layer structure of the insulating layer 110a, the insulating layer 110b, and the insulating layer 110c, and the insulating layer 110 in regions overlapping with the regions 108L2 has a stacked-layer structure of the insulating layer 110a and the insulating layer 110b, one embodiment of the present invention is not limited thereto. As in a transistor 10D illustrated in FIG. 2B, the insulating layer 110 in the regions overlapping with the regions 108L2 may have a stacked-layer structure of the insulating layer 110a, the insulating layer 110b, and the insulating layer 110c. As in a transistor 10E illustrated in FIG. 2C, the insulating layer 110 in the regions overlapping with the regions 108L2 may have a single-layer structure of the insulating layer 110a.

Note that the insulating layer 110 may have a two-layer structure of the insulating layer 110a and the insulating layer 110c over the insulating layer 110a. Alternatively, the insulating layer 110 may have a single-layer structure. Any of the insulating layer 110a, the insulating layer 110b, and the insulating layer 110c described above can be selected as the insulating layer 110 appropriately in accordance with the purpose.

Structure Example 1-5

Figure 3A:
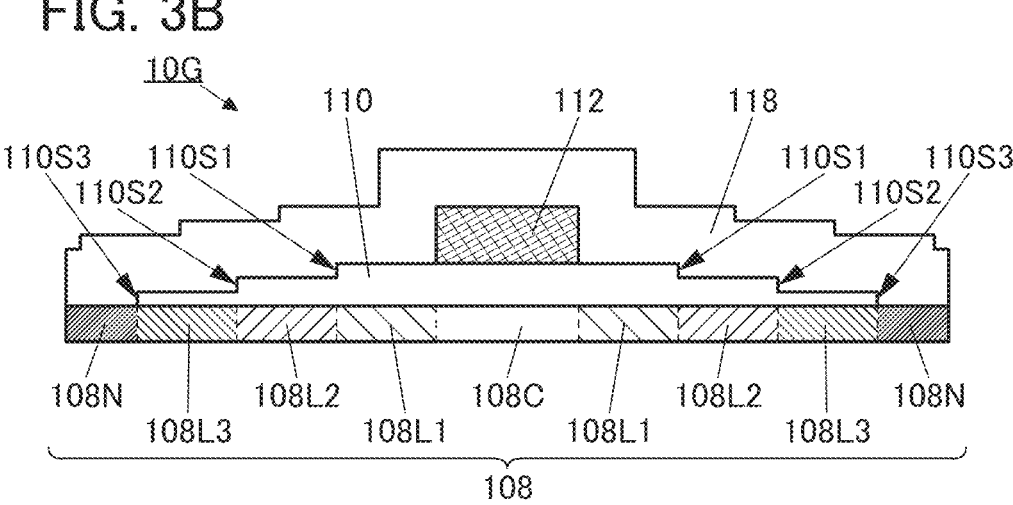

FIG. 3A illustrates a structure example different from that of the above-described transistor 10. FIG. 3A is a schematic cross-sectional view of a transistor 10F in the channel length direction. The transistor 10F is different from the transistor 10 mainly in including a metal oxide layer 114 between the insulating layer 110 and the conductive layer 112.

The metal oxide layer 114 has a function of supplying oxygen to the insulating layer 110. In the case where a conductive film containing a metal or an alloy that is easily oxidized is used for the conductive layer 112, the metal oxide layer 114 can function as a barrier layer that prevents the conductive layer 112 from being oxidized by oxygen in the insulating layer 110.

The metal oxide layer 114 also functions as a barrier film that prevents diffusion of hydrogen and water contained in the conductive layer 112 to the insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 into the semiconductor layer 108 through the insulating layer 110 can be prevented. Consequently, the carrier concentration in the region 108C can be extremely low.

For the metal oxide layer 114, an insulating material or a conductive material can be used. When the metal oxide layer 114 has an insulating property, the metal oxide layer 114 functions as part of the gate insulating layer. Meanwhile, when the metal oxide layer 114 has conductivity, the metal oxide layer 114 functions as part of the gate electrode.

The metal oxide layer 114 is preferably formed using an insulating material with a higher permittivity than silicon oxide. It is particularly preferable to use an aluminum oxide film, a hafnium oxide film, a hafnium aluminate film, or the like because driving voltage can be lowered.

A metal oxide can be used for the metal oxide layer 114. For example, an oxide containing indium, such as indium oxide, indium zinc oxide, indium tin oxide (ITO), or indium tin oxide containing silicon (ITSO), can be used. A conductive oxide containing indium is preferable because of its high conductivity. Moreover, ITSO is not easily crystallized owing to the contained silicon, has high planarity, and thus is highly adhesive to a film formed over the ITSO. A metal oxide such as zinc oxide or zinc oxide containing gallium can be used for the metal oxide layer 114. The metal oxide layer 114 may have a structure in which any of these metal oxides are stacked.

For the metal oxide layer 114, an oxide material containing one or more elements that are the same as those of the semiconductor layer 108 is preferably used. It is particularly preferable to use an oxide semiconductor material that can be used for the semiconductor layer 108. In that case, a metal oxide film formed using the same sputtering target as that for the semiconductor layer 108 is preferably used as the metal oxide layer 114 because an apparatus can be shared.

Alternatively, when a metal oxide material containing indium and gallium is used for both the semiconductor layer 108 and the metal oxide layer 114, a material in which composition (content ratio) of gallium is higher than that in the semiconductor layer 108 is preferably used because an oxygen-blocking property can be further increased. Here, when the semiconductor layer 108 is formed using a material in which the composition of indium is higher than that in the metal oxide layer 114, the field-effect mobility of the transistor 100 can be increased.

The metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 and the semiconductor layer 108.

Note that in the case where the metal oxide layer 114 is formed to supply oxygen to the insulating layer 110, a metal oxide film to be the metal oxide layer 114 is formed and then may be removed. The metal oxide layer 114 is not provided if unnecessary.

Structure Example 1-6

FIG. 3B illustrates a structure example different from that of the above-described transistor 10. FIG. 3B is a schematic cross-sectional view of a transistor 10G in the channel length direction. The transistor 10G is different from the transistor 10 mainly in including regions 108L3 between the regions 108N and the regions 108L2.

The semiconductor layer 108 includes the region 108C, the pair of regions 108L1, the pair of regions 108L2, the pair of regions 108L3, and the pair of regions 108N. The regions 108L3 are provided with the region 108C, the pair of regions 108L1, and the pair of regions 108L2 therebetween. The regions 108L3 include regions that do not overlap with the conductive layer 112 and overlap with the insulating layer 110. The above description can be referred to for the region 108C, the regions 108L1, and the regions 108L2; thus, the detailed description thereof is omitted.

It is preferable that the regions 108L1, the regions 108L2, and the regions 108L3 each have lower resistance than the region 108C and higher resistance than the regions 108N. The regions 108L1, the regions 108L2, and the regions 108L3 function as LDD regions.

It is further preferable that the regions 108L3 have lower resistance than the regions 108L2. When the resistance is the highest in the region 108C, followed in order by those in the regions 108L1, the regions 108L2, the regions 108L3, and the regions 108N, the electric field in the drain region can be effectively relieved, thereby further reducing a change in the threshold voltage of the transistor.

The thickness of the insulating layer 110 in regions overlapping with the regions 108L3 is preferably smaller than the thickness of the insulating layer 110 in the regions overlapping with the regions 108L2. That is, the thickness of the insulating layer 110 preferably becomes gradually smaller from the region 108C side toward the region 108N side, i.e., has a step-like shape.

With the insulating layer 110 having a step-like shape, the resistance of the semiconductor layer 108 can be the lowest in the regions 108N, followed in order by those in the regions 108L3, the regions 108L2, the regions 108L1, and the region 108C.

As illustrated in FIG. 3B, the insulating layer 110 has the first side surfaces 110S1, the second side surfaces 110S2, and third side surfaces 110S3. In the cross-sectional view in the channel length direction, the first side surfaces 110S1, the second side surfaces 110S2, and the third side surfaces 110S3 are positioned over the semiconductor layer 108. Also in the cross-sectional view in the channel length direction, the first side surfaces 110S1 are positioned outward from the end portions of the conductive layer 112, the second side surfaces 110S2 are positioned outward from the first side surfaces 110S1, and the third side surfaces 110S3 are positioned outward from the second side surfaces 110S2.

Structure Example 1-7

Although FIG. 1A to FIG. 1C, FIG. 2A to FIG. 2C, and FIG. 3A each illustrate the structure in which two LDD regions (the regions 108L1 and the regions 108L2) are provided between the region 108C and the regions 108N, and FIG. 3B illustrates the structure in which three LDD regions (the regions 108L1, the regions 108L2, and the regions 108L3) are provided between the region 108C and the regions 108N, one embodiment of the present invention is not limited thereto. A structure including p (p is two or more) LDD regions between the region 108C and the regions 108N can be employed.

Figures 4A, 4B:
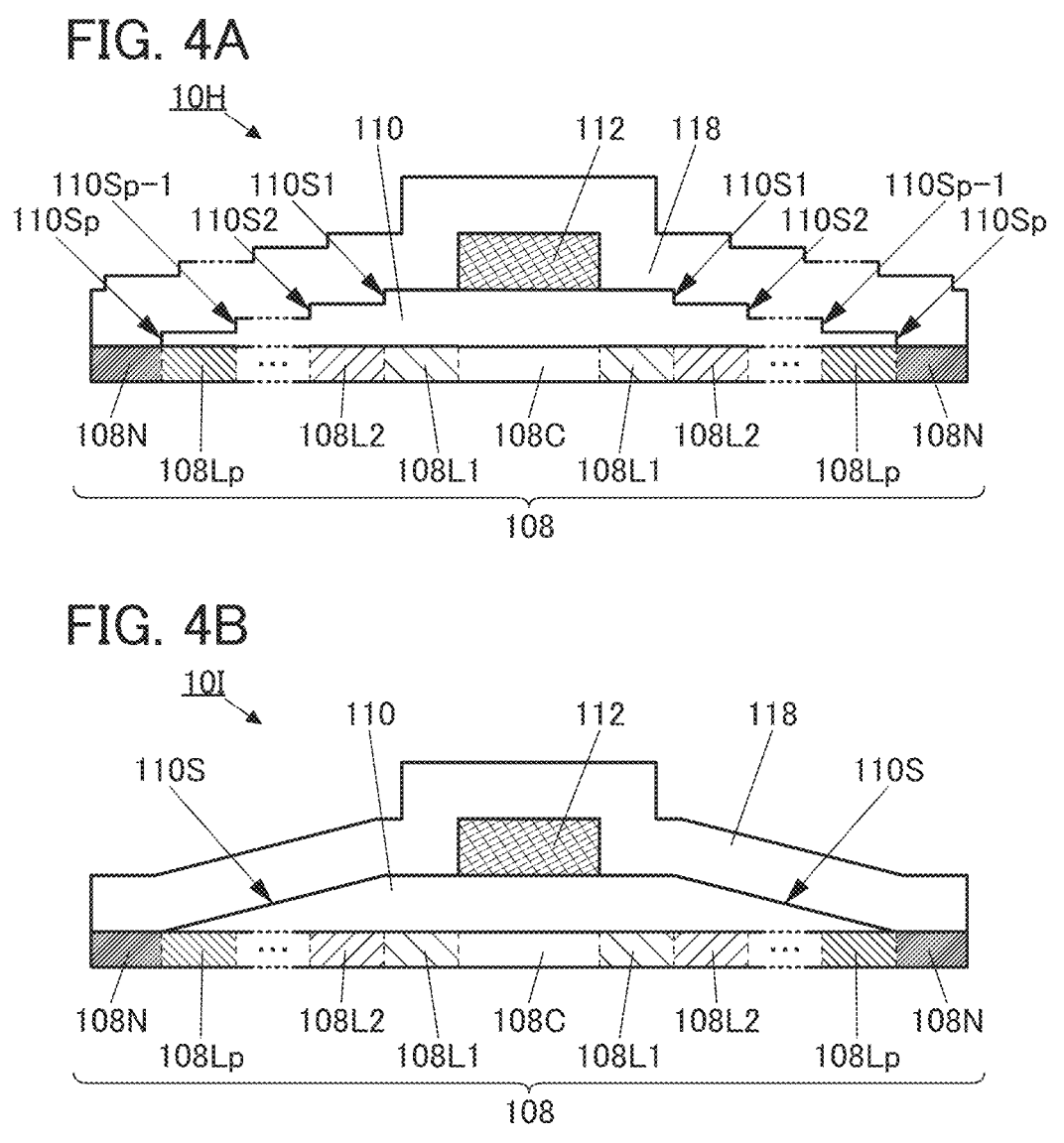

FIG. 4A is a schematic cross-sectional view of a transistor 10H in the channel length direction. The transistor 10H has a structure including the regions 108L1 to regions 108Lp between the region 108C and the regions 108N.

As illustrated in FIG. 4A, the insulating layer 110 has the first side surfaces 110S1 to p-th side surfaces 110Sp. In the cross-sectional view in the channel length direction, the first side surfaces 110S1 to the p-th side surfaces 110Sp are positioned over the semiconductor layer 108. Also in the cross-sectional view in the channel length direction, the first side surfaces 110S1 are positioned outward from the end portions of the conductive layer 112, the second side surfaces 110S2 are positioned outward from the first side surfaces 110S1, and the p-th side surfaces 110Sp are positioned outward from p−1-th side surfaces 110Sp−1.

Note that the insulating layer 110 does not necessarily have a step-like shape, and the thickness of the insulating layer 110 may continuously decrease from the region 108C side toward the region 108N side. FIG. 4B is a schematic cross-sectional view of a transistor 10I in the channel length direction. As illustrated in FIG. 4B, a side surface 110S of the insulating layer 110 may have a slope shape. The transistor 10I has a structure in which the thickness of the insulating layer 110 continuously decreases from the region 108C side toward the region 108N side, and the resistance is continuously lowered from the regions 108L1 toward the regions 108Lp.

Structure Example 2

A more specific structure example of a transistor is described below.

Structure Example 2-1

FIG. 5A is a top view of the transistor 100, FIG. 5B corresponds to a cross-sectional view of a cut plane along the dashed-dotted line A1-A2 shown in FIG. 5A, and FIG. 5C corresponds to a cross-sectional view of a cut plane along the dashed-dotted line B1-B2 shown in FIG. 5A. Note that in FIG. 5A, some components (e.g., a protective layer) of the transistor 100 are not illustrated.

In addition, the direction of the dashed-dotted line A1-A2 corresponds to the channel length direction, and the direction of the dashed-dotted line B1-B2 corresponds to the channel width direction. Furthermore, some components are not illustrated in top views of transistors in the following drawings, as in FIG. 5A.

Figure 6A:
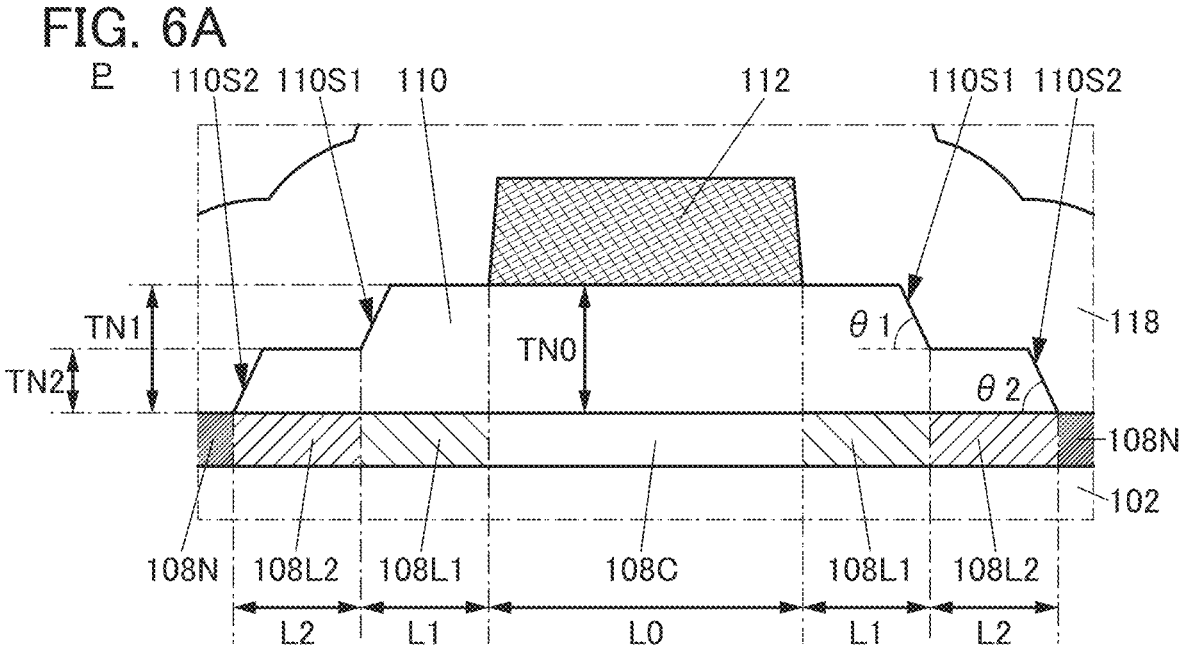
FIG. 6A and FIG. 6B are cross-sectional views of a semiconductor device.
Figure 6B:
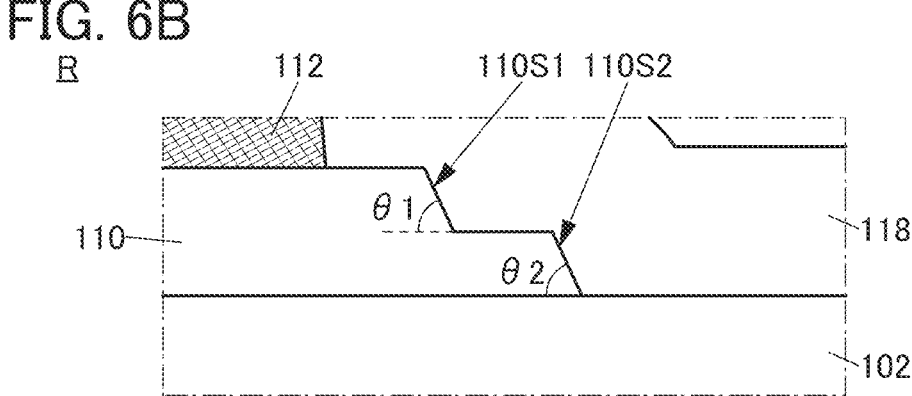

An enlarged view of a region P surrounded by a dashed-dotted line in FIG. 5B is shown in FIG. 6A. An enlarged view of a region R surrounded by a dashed-dotted line in FIG. 5C is shown in FIG. 6B.

The transistor 100 is provided over a substrate 102 and includes the semiconductor layer 108, the insulating layer 110, the conductive layer 112, the insulating layer 118, and the like. The semiconductor layer 108 having an island shape is provided over the substrate 102. The insulating layer 110 is provided to cover part of a top surface of the substrate 102, a side surface of the semiconductor layer 108, and part of a top surface of the semiconductor layer 108. The conductive layer 112 has a portion that is provided over the insulating layer 110 and overlaps with the semiconductor layer 108.

An end portion of the conductive layer 112 is positioned inward from an end portion of the insulating layer 110. In other words, the insulating layer 110 includes a portion extending beyond the end portion of the conductive layer 112 over at least the semiconductor layer 108.

Part of the end portion of the insulating layer 110 is positioned over the semiconductor layer 108. The insulating layer 110 includes a portion that overlaps with the conductive layer 112 and functions as the gate insulating layer, and portions not overlapping with the conductive layer 112 (i.e., portions overlapping with the regions 108L1 or the regions 108L2).

The semiconductor layer 108 includes the region 108C, the pair of regions 108L1, the pair of regions 108L2, and the pair of regions 108N. The region 108C includes the region overlapping with the conductive layer 112 and the insulating layer 110 and functions as the channel formation region. The regions 108L1 are provided with the region 108C therebetween. The regions 108L2 are provided with the region 108C and the pair of regions 108L1 therebetween. The regions 108L1 and the regions 108L2 each include a region that does not overlap with the conductive layer 112 and overlaps with the insulating layer 110. The regions 108N are provided with the region 108C, the pair of regions 108L1, and the pair of regions 108L2 therebetween. The regions 108N overlap with neither the conductive layer 112 nor the insulating layer 110.

The regions 108L1 and the regions 108L2 are each a region of the semiconductor layer 108 that overlaps with the insulating layer 110 and does not overlap with the conductive layer 112. In FIG. 6A, the width of the region 108C in the channel length direction of the transistor 100 is a width L0, the width of the regions 108L1 is a width L1, and the width of the regions 108L2 is a width L2. The thickness of the insulating layer 110 in a region overlapping with the region 108C is a thickness TN0, the thickness of the insulating layer 110 in regions overlapping with the regions 108L1 is a thickness TN1, and the thickness of the insulating layer 110 in regions overlapping with the regions 108L2 is a thickness TN2.

It is preferable that the thickness TN1 be substantially equal to the thickness TN0. The thickness TN2 is preferably more than or equal to 0.2 times and less than or equal to 0.9 times, further preferably more than or equal to 0.3 times and less than or equal to 0.8 times, still further preferably more than or equal to 0.4 times and less than or equal to 0.7 times the thickness TN1. With the thicknesses in the above ranges, the resistance of the regions 108L1 and the regions 108L2 can be controlled.

Since the regions 108L1 and the regions 108L2 can be formed in a self-aligned manner as described later, a photomask for forming the regions 108L1 and the regions 108L2 is not needed and the manufacturing cost can be reduced. In addition, forming the regions 108L1 and the regions 108L2 in a self-aligned manner does not cause misalignment of the regions 108L1 and the regions 108L2 relative to the conductive layer 112; hence, the widths of the regions 108L1 and the regions 108L2 in the semiconductor layer 108 can be substantially the same.

Between the region 108C functioning as the channel formation region and the low-resistance regions 108N, the regions 108L1 and the regions 108L2 functioning as offset regions to which a gate electric field is not applied (or to which the gate electric field is less likely to be applied compared to the region 108C) can be formed stably without variations. As a result, the source-drain withstand voltage of the transistor can be improved, so that the transistor can have high reliability. In addition, the current density at a boundary between the region 108C and the regions 108N can be reduced and heat generation at a boundary between the channel and the source or the drain can be inhibited, which enables a transistor and a semiconductor device to have high reliability.

The width L1 of the regions 108L1 and the width L2 of the regions 108L2 each range preferably from 50 nm to 1 μm, further preferably from 70 nm to 700 nm, still further preferably from 100 nm to 500 nm. Providing the regions 108L1 and the regions 108L2 reduces the concentration of an electric field around the drain, so that deterioration of the transistor particularly in a state where the drain voltage is high can be suppressed. In particular, making the total width of the width L1 and the width L2 larger than the thickness of the insulating layer 110 can effectively suppress electric field concentration around the drain. On the other hand, when the total width of the width L1 and the width L2 is longer than 2 μm, the source-drain resistance increases and the driving speed of the transistor may be low. When the width L1 and the width L2 are each set in the above range, a transistor and a semiconductor device that have high reliability and high driving speed can be obtained. Note that the width L1 and the width L2 can be determined in accordance with the thickness of the semiconductor layer 108, the thickness of the insulating layer 110, and the level of voltage applied between the source and the drain when the transistor 100 is driven.

The first side surfaces 110S1 and the second side surfaces 110S2 of the insulating layer 110 each preferably have a tapered shape. With the first side surfaces 110S1 and the second side surfaces 110S2 each having a tapered shape, the coverage with the layer formed over the insulating layer 110 (e.g., the insulating layer 118) can be improved and occurrence of a defect, such as a void or disconnection caused by a step, in the layer can be inhibited. Note that in the top view of FIG. 5A, the end portion of the insulating layer 110, the first side surface 110S1, and the second side surface 110S2 are shown by dashed lines.

An angle θ1 and an angle θ2 illustrated in FIG. 6A and FIG. 6B are described. The angle θ1 is an angle formed between the first side surface 110S1 and a plane that is extended to the inside of the insulating layer 110 from the top surface of the insulating layer 110 in contact with a lower end of the first side surface 110S1. The angle θ2 is an angle formed between the bottom surface of the insulating layer 110 and the second side surface 110S2. The angle θ1 and the angle θ2 are each preferably greater than or equal to 30° and less than 90°, further preferably greater than or equal to 35° and less than or equal to 85°, still further preferably greater than or equal to 40° and less than or equal to 80°, yet further preferably greater than or equal to 45° and less than or equal to 80°, yet still further preferably greater than or equal to 50° and less than or equal to 80°. With the angles in the above ranges, the insulating layer 118 provided over the insulating layer 110 can have increased coverage.

Note that in this specification and the like, the taper angle refers to an inclination angle formed by a side surface and a bottom surface of a specific layer when the layer is observed from the direction perpendicular to the cross section (e.g., the plane perpendicular to the surface of the substrate).

The regions 108N preferably have a concentration gradient such that the concentration of the first element is higher in a portion closer to the insulating layer 118. In that case, the total amount of the first element in the regions 108N can be smaller than that in the case where the concentration is uniform throughout the entire regions 108N; thus, the amount of the first element that might diffuse into the region 108C due to the influence of heat applied during the manufacturing process or the like can be kept small. In addition, an upper portion of the region 108N has lower resistance, and thus contact resistance with the conductive layer 120a (or the conductive layer 120b) can be more effectively reduced.

Treatment for adding the first element to the regions 108L1, the regions 108L2, and the regions 108N can be performed using the conductive layer 112 and the insulating layer 110 as masks. Accordingly, the regions 108L1, the regions 108L2, and the regions 108N can be formed in a self-aligned manner.

The regions 108N preferably include a region where the concentration of the first element is higher than or equal to $1 \times 10^{19}$ atoms/cm$^3$ and lower than or equal to $1 \times 10^{23}$ atoms/cm$^3$, preferably higher than or equal to $5 \times 10^{19}$ atoms/cm$^3$ and lower than or equal to $5 \times 10^{22}$ atoms/cm$^3$, further preferably higher than or equal to $1 \times 10^{20}$ atoms/cm$^3$ and lower than or equal to $1 \times 10^{22}$ atoms/cm$^3$.

In the case where an element that is easily oxidized, such as boron, phosphorus, magnesium, aluminum, or silicon, is used as the first element, the first element in an oxidized state preferably exists in each of the regions 108L1, the regions 108L2, and the regions 108N. Since such an element that is easily oxidized can exist stably in an oxidized state by being bonded to oxygen in the semiconductor layer 108, the element can be inhibited from being released even when a high temperature (e.g., higher than or equal to 400° C., higher than or equal to 600° C., or higher than or equal to 800° C.) is applied in a later step. Furthermore, when the first element takes oxygen in the semiconductor layer 108 away, oxygen vacancies (Vo) are generated in the regions 108L1, the regions 108L2, and the regions 108N. Defects (hereinafter, also referred to as VoH) generated by entry of hydrogen in the film into the oxygen vacancies (Vo) serve as carrier supply sources, lowering the resistance of the regions 108L1, the regions 108L2, and the regions 108N.

Here, the semiconductor layer 108 and oxygen vacancies that might be formed in the semiconductor layer 108 will be described.

Oxygen vacancies formed in the channel formation region of the semiconductor layer 108 affect the transistor characteristics and therefore cause a problem. For example, when an oxygen vacancy is formed in the semiconductor layer 108, the oxygen vacancy might be bonded with hydrogen to serve as a carrier supply source. The carrier supply source generated in the channel formation region causes a change in the electrical characteristics, typically, a shift in the threshold voltage, of the transistor 100. Therefore, the number of oxygen vacancies in the channel formation region is preferably as small as possible.

In view of this, one embodiment of the present invention has a structure in which insulating films in the vicinity of the channel formation region of the semiconductor layer 108, specifically, the insulating layer 110 positioned above the channel formation region and the insulating layer 103 positioned below the channel formation region each include an oxide film or an oxynitride film. When oxygen is moved from the insulating layer 103 and the insulating layer 110 to the channel formation region by heat during the manufacturing process or the like, the number of oxygen vacancies in the channel formation region can be reduced.

The semiconductor layer 108 preferably includes a region where the atomic ratio of In to the element M is higher than 1. A higher percentage of In content results in higher field-effect mobility of the transistor.

Here, in the case of a metal oxide containing In, Ga, and Zn, bonding strength between In and oxygen is weaker than bonding strength between Ga and oxygen; thus, with a higher percentage of In content, oxygen vacancies are likely to be generated in the metal oxide film. There is a similar tendency when the element M is used instead of Ga. The existence of a large number of oxygen vacancies in the metal oxide film leads to a reduction in electrical characteristics and a reduction in reliability of the transistor.

However, in one embodiment of the present invention, an extremely large amount of oxygen can be supplied into the channel formation region of the semiconductor layer 108 containing a metal oxide; thus, a metal oxide material with a high percentage of In content can be used. Accordingly, it is possible to achieve a transistor with extremely high field-effect mobility, stable electrical characteristics, and high reliability.

For example, a metal oxide in which the atomic ratio of In to the element M is 1.5 or higher, 2 or higher, 3 or higher, 3.5 or higher, or 4 or higher can be suitably used.

In particular, the atomic ratio of In to M and Zn in the semiconductor layer 108 is preferably In:M:Zn=4:2:3 or in the neighborhood thereof. Alternatively, the atomic ratio of In to M and Zn is preferably In:M:Zn=5:1:6 or in the neighborhood thereof. Furthermore, as the composition of the semiconductor layer 108, the atomic proportions of In, the element M, and Zn in the semiconductor layer 108 may be approximately equal to each other. That is, a material in which the atomic ratio of In to the element M and Zn is In:M:Zn=1:1:1 or in the neighborhood thereof may be included.

For example, with the use of the transistor with high field-effect mobility in a gate driver that generates a gate signal, a display device with a small frame width (also referred to as a narrow frame) can be provided. Furthermore, with the use of the transistor with high field-effect mobility in a source driver (particularly a demultiplexer connected to an output terminal of a shift register included in the source driver), a display device to which a small number of wirings are connected can be provided.

Note that even when the semiconductor layer 108 includes the region where the atomic ratio of In to the element M is higher than 1, the field-effect mobility might be low if the semiconductor layer 108 has high crystallinity. The crystallinity of the semiconductor layer 108 can be analyzed using X-ray diffraction (XRD) or a transmission electron microscope (TEM), for example.

Here, by reducing the impurity concentration and reducing the density of defect states (reducing oxygen vacancies) in the channel formation region of the semiconductor layer 108, the carrier concentration in the film can be reduced. A transistor using such a metal oxide film for the channel formation region of the semiconductor layer rarely has electrical characteristics with a negative threshold voltage (also referred to as normally-on). Furthermore, a transistor using such a metal oxide film can have characteristics of an extremely low off-state current.

When a metal oxide film with high crystallinity is used for the semiconductor layer 108, damage in the processing of the semiconductor layer 108 or in the deposition of the insulating layer 110 can be inhibited, so that a highly reliable transistor can be achieved. By contrast, when a metal oxide film with relatively low crystallinity is used for the semiconductor layer 108, the electrical conductivity is improved, so that a transistor with high field-effect mobility can be achieved.

As the semiconductor layer 108, a metal oxide film having a CAAC (c-axis aligned crystal) structure described later, a metal oxide film having an nc (nano crystal) structure, or a metal oxide film in which a CAAC structure and an nc structure are mixed is preferably used.

The semiconductor layer 108 may have a stacked-layer structure of two or more layers.

For example, the semiconductor layer 108 in which two or more metal oxide films with different compositions are stacked can be used. For example, in the case of using an In-M-Zn oxide, it is preferable to use a stack of two or more films each formed using a sputtering target in which the atomic ratio of In to the element M and Zn is In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

The semiconductor layer 108 in which two or more metal oxide films with different crystallinities are stacked can be used. In that case, the metal oxide films are preferably formed successively without exposure to the air using the same oxide target under different deposition conditions.

In this case, the semiconductor layer 108 can have a stacked-layer structure of a metal oxide film having an nc structure and a metal oxide film having a CAAC structure. Alternatively, a stacked-layer structure of a metal oxide film having an nc structure and a metal oxide film having an nc structure may be employed. Note that the description of a CAC (Cloud-Aligned Composite) given below can be referred to for a function or a material composition of a metal oxide that can be suitably used for the metal oxide films.

For example, the oxygen flow rate ratio at the time of forming an earlier-formed first metal oxide film is set lower than the oxygen flow rate ratio at the time of forming a subsequently formed second metal oxide film. Alternatively, a condition without oxygen flowing is employed at the time of forming the first metal oxide film. In such a manner, oxygen can be effectively supplied at the time of forming the second metal oxide film. The first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or forming the insulating layer 110 can be inhibited.

Specifically, the oxygen flow rate ratio at the time of forming the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the conditions at the time of the film formation, such as pressure, temperature, and power, may vary between the first metal oxide film and the second metal oxide film, it is preferable to employ the same conditions other than the oxygen flow rate ratio, in which case the time required for the film formation steps can be shortened.

With such a structure, the transistor 100 with excellent electrical characteristics and high reliability can be achieved.

As illustrated in FIG. 5A and FIG. 5B, the transistor 100 may include the conductive layer 120*a* and the conductive layer 120*b* over the insulating layer 118. The conductive layer 120*a* and the conductive layer 120*b* function as a source electrode and a drain electrode. The conductive layer 120*a* and the conductive layer 120*b* are electrically connected to the regions 108N through an opening portion 141*a* and an opening portion 141*b*, respectively, which are provided in the insulating layer 118.

The above is the description of Structure example 2-1.

A structure example of a transistor whose structure is partly different from that of Structure example 2-1 is described below. Note that description of the same portions as those in Structure example 2-1 is omitted below in some cases. Furthermore, in drawings that are referred to later, the same hatching pattern is applied to portions having functions similar to those in the above structure example, and the portions are not denoted by reference numerals in some cases.

Structure Example 2-2

Figure 7A:
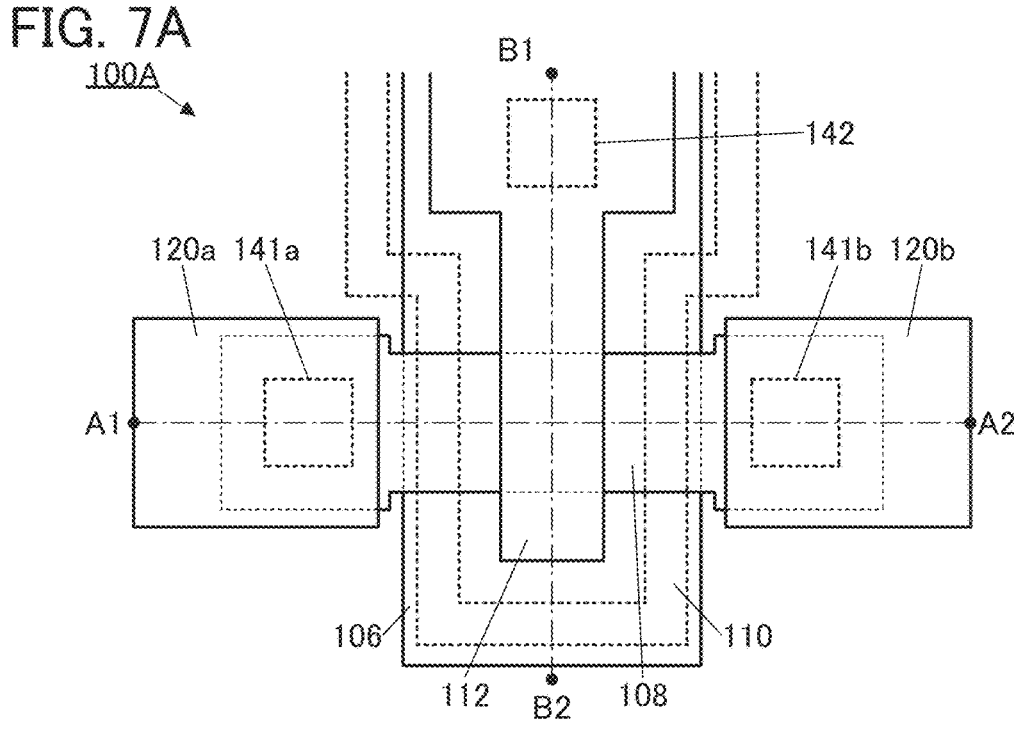
FIG. 7A is a top view of a semiconductor device.
Figure 7B:
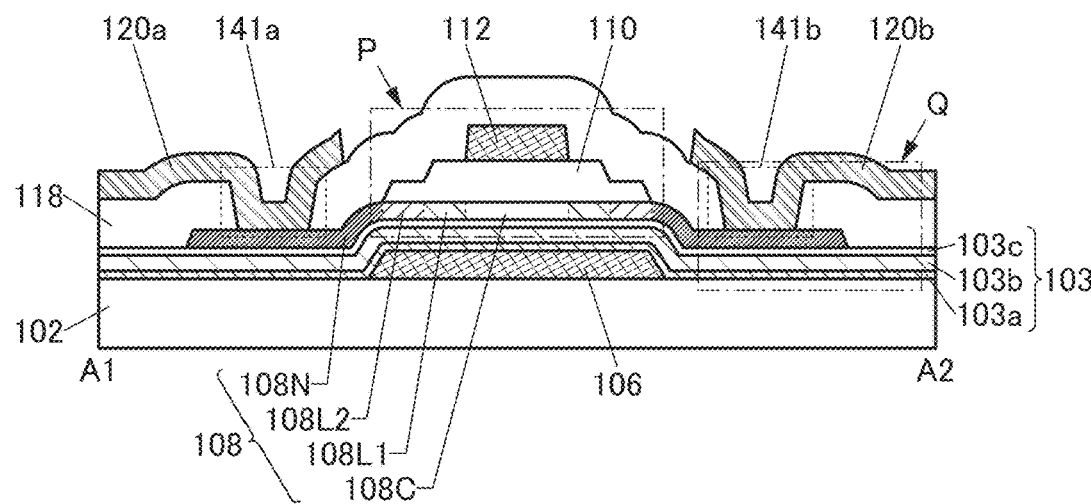
FIG. 7B and FIG. 7C are cross-sectional views of the semiconductor device.
Figure 7C:
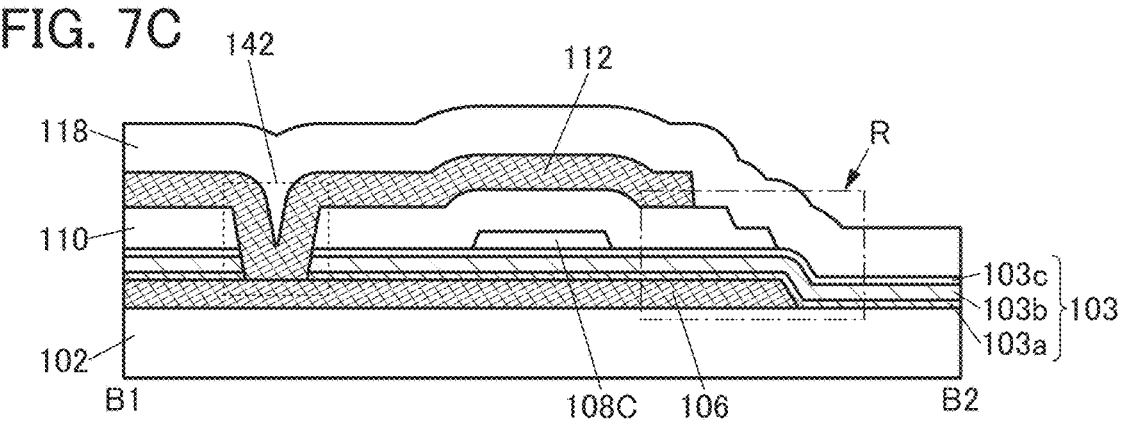
Figure 8A:
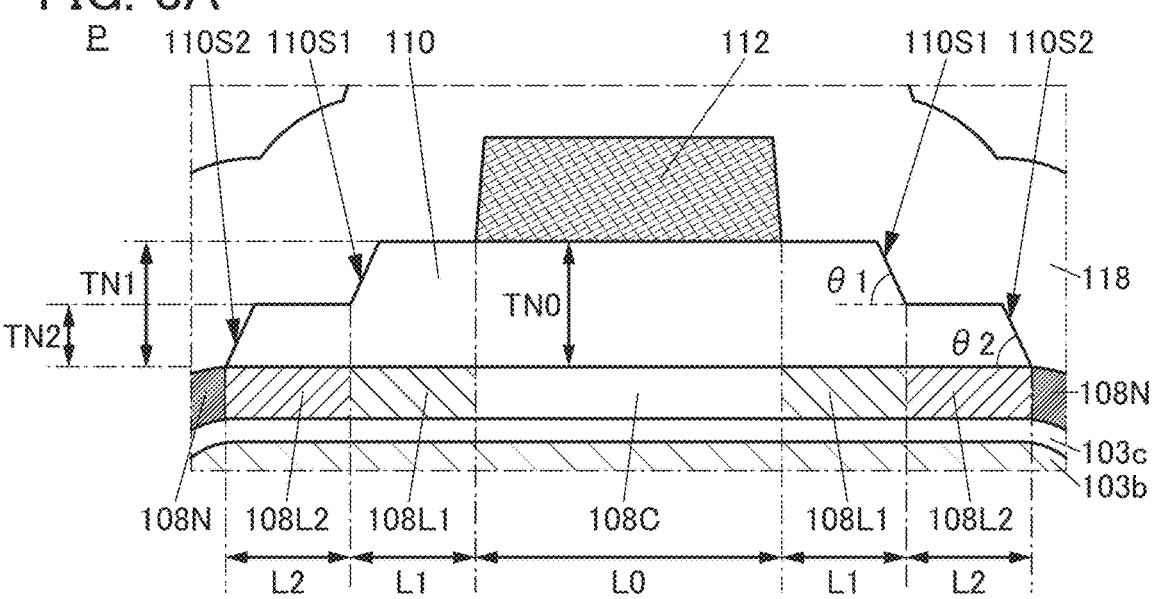
FIG. 8A, FIG. 8B, and FIG. 8C are cross-sectional views of a semiconductor device.
Figure 8B:
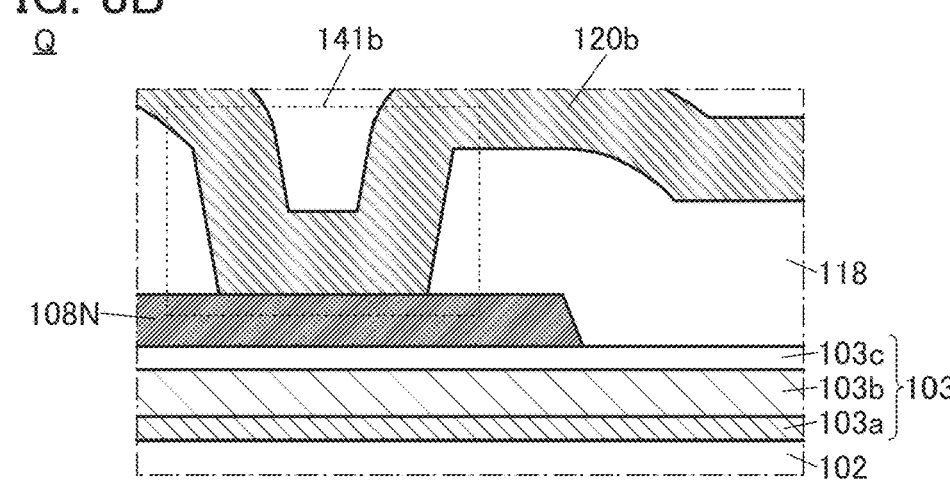
Figure 8C:
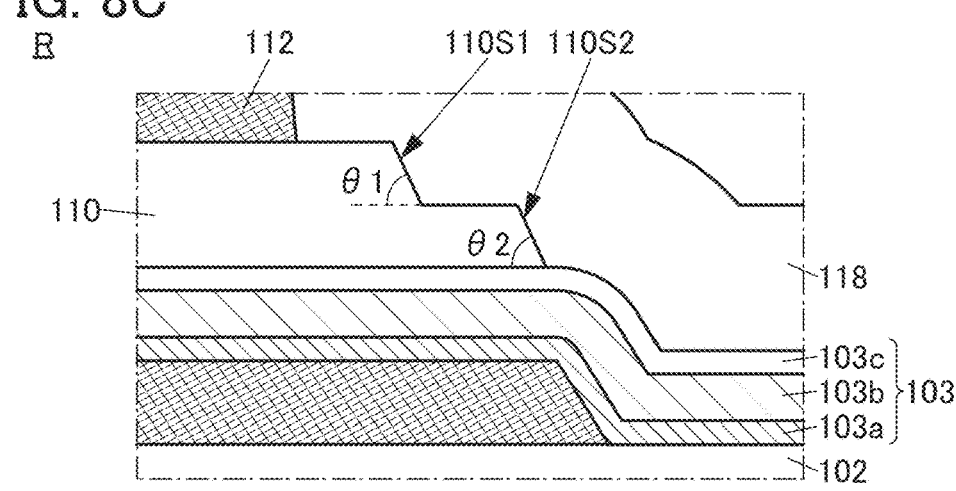

FIG. 7A is a top view of a transistor 100A, FIG. 7B is a cross-sectional view of the transistor 100A in the channel length direction, and FIG. 7C is a cross-sectional view of the transistor 100A in the channel width direction. An enlarged view of the region P and an enlarged view of the region Q surrounded by dashed-dotted lines in FIG. 7B are shown in FIG. 8A and FIG. 8B, respectively. An enlarged view of the region R surrounded by a dashed-dotted line in FIG. 7C is shown in FIG. 8C.

The transistor 100A is different from the transistor 100 mainly in including the insulating layer 103 and the conductive layer 106 between the substrate 102 and the semiconductor layer 108. The conductive layer 106 includes a region that overlaps with the region 108C.

In the transistor 100A, the conductive layer 106 has a function of a first gate electrode (also referred to as a bottom gate electrode), and the conductive layer 112 has a function of a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 is sometimes referred to as a channel formation region in the following description; however, a channel can also be actually formed in a portion that does not overlap with the conductive layer 112 and overlaps with the conductive layer 106.

As illustrated in FIG. 7A and FIG. 7C, the conductive layer 106 may be electrically connected to the conductive layer 112 through an opening portion 142 provided in the insulating layer 110 and the insulating layer 103. In that case, the same potential can be applied to the conductive layer 106 and the conductive layer 112.

For the conductive layer 106, a material that can be used for the conductive layer 112, the conductive layer 120*a*, or the conductive layer 120*b* can be used. In particular, a material containing copper is preferably used for the conductive layer 106, in which case wiring resistance can be reduced. When a material including a high-melting-point metal such as tungsten or molybdenum is used for the conductive layer 106, treatment in a later step can be performed at high temperatures.

As illustrated in FIG. 7A and FIG. 7C, the conductive layer 112 and the conductive layer 106 preferably extend beyond an end portion of the semiconductor layer 108 in the channel width direction. In that case, as illustrated in FIG. 7C, the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by the pair of gate electrodes. At this time, it is particularly preferable that the same potential be applied to the conductive layer 106 and the conductive layer 112. Accordingly, the electric field for inducing a channel can be effectively applied to the semiconductor layer 108, so that the on-state current of the transistor 100A can be increased. Thus, the transistor 100A can be reduced in size.

Note that a structure in which the conductive layer 112 and the conductive layer 106 are not connected to each other may be employed. In that case, a constant potential may be supplied to one of the pair of gate electrodes, and a signal for driving the transistor 100A may be supplied to the other. In that case, the potential supplied to one of the gate electrodes enables control of the threshold voltage at the time of driving the transistor 100A with the other gate electrode.

The insulating layer 103 can have a stacked-layer structure. FIG. 7B and FIG. 7C illustrate an example in which the insulating layer 103 has a three-layer structure in which the insulating layer 103*a*, the insulating layer 103*b*, and the insulating layer 103*c* are stacked in this order from the conductive layer 106 side. The insulating layer 103*a* is in contact with the conductive layer 106. The insulating layer 103*c* is in contact with the semiconductor layer 108. The above description can be referred to for the insulating layer 103; thus, the detailed description thereof is omitted.

In the case where a film of a metal or an alloy that is less likely to be diffused into the insulating layer 103 is used as the conductive layer 106, for example, a single-layer structure of the insulating layer 103*c* may be employed without providing the insulating layer 103*a* and the insulating layer 103*b*.

The transistor 100A includes a region where the insulating layer 103*c* is in contact with the insulating layer 118. Owing to the region where the insulating layer 103*c* is in contact with the insulating layer 118, oxygen contained in the insulating layer 118 diffuses into the semiconductor layer 108 through the insulating layer 103*c* and the oxygen vacancies in the semiconductor layer 108 can be reduced.

The above is the description of Structure example 2-2.

Structure Example 2-3

Figure 9A:
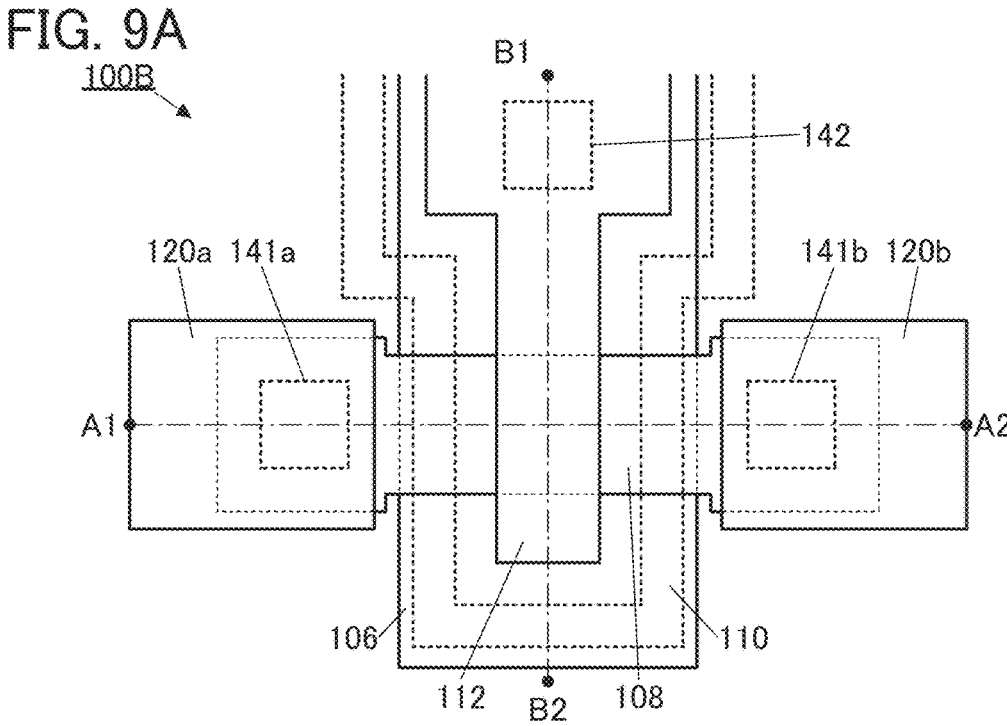
FIG. 9A is a top view of a semiconductor device.
Figure 9B:
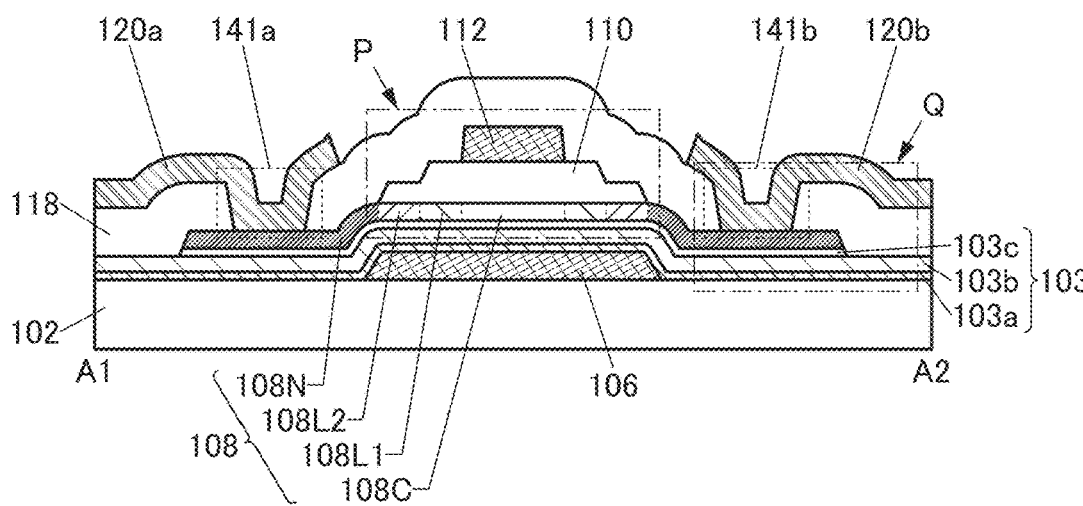
FIG. 9B and FIG. 9C are cross-sectional views of the semiconductor device.
Figure 9C:
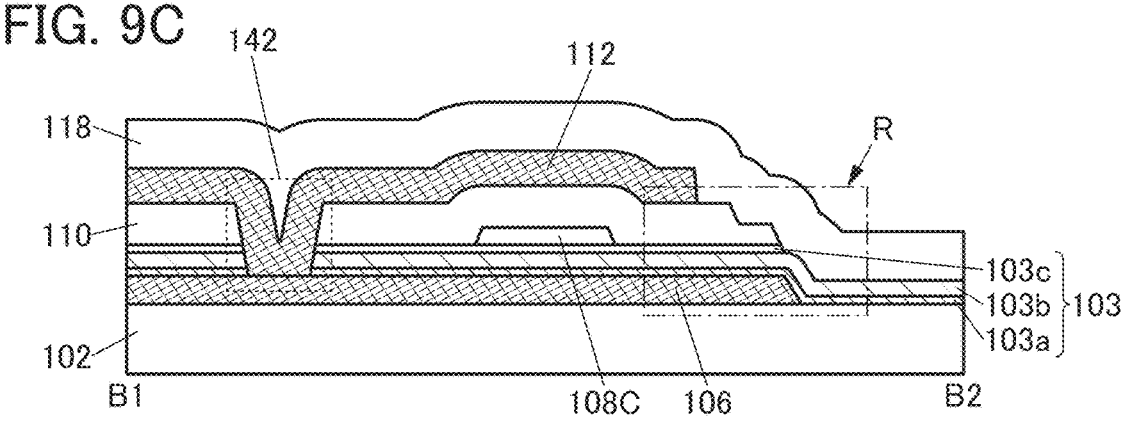
Figure 10A:
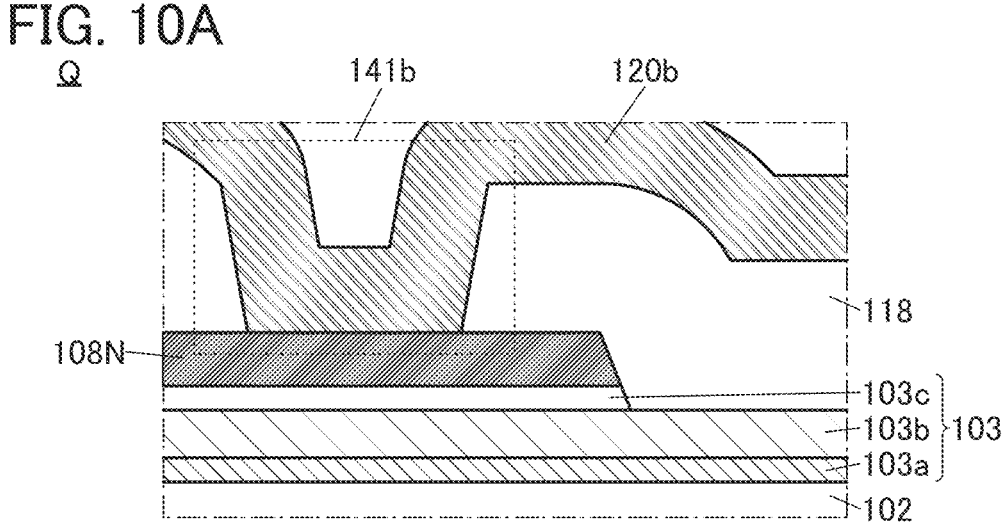
FIG. 10A and FIG. 10B are cross-sectional views of a semiconductor device.
Figure 10B:
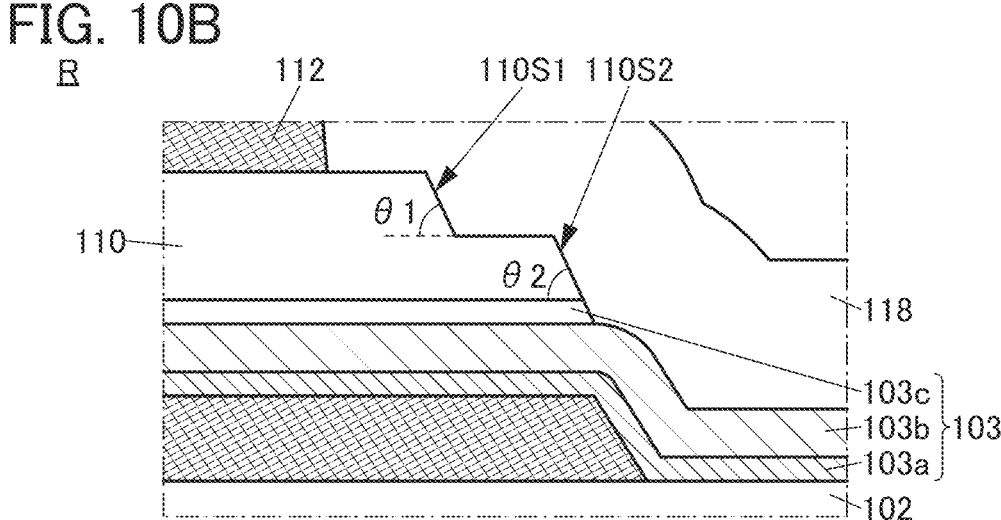

A structure different from that of the transistor 100A is illustrated in FIG. 9A to FIG. 9C. FIG. 9A is a top view of a transistor 100B, FIG. 9B is a cross-sectional view of the transistor 100B in the channel length direction, and FIG. 9C is a cross-sectional view of the transistor 100B in the channel width direction. FIG. 10A is an enlarged view of the region Q surrounded by the dashed-dotted line in FIG. 9B. FIG. 10B is an enlarged view of the region R surrounded by the dashed-dotted line in FIG. 9C. Refer to FIG. 8A for an enlarged view of the region P surrounded by the dashed-dotted line in FIG. 9B.

As illustrated in FIG. 10A and FIG. 10B, the transistor 100B is different from the transistor 100A mainly in including a region where the insulating layer 118 is in contact with the insulating layer 103b. The insulating layer 118 in a region that does not overlap with the semiconductor layer 108 is in contact with the insulating layer 103c. Moreover, an end portion of the insulating layer 103c is substantially aligned with the end portion of the semiconductor layer 108. For example, part of an insulating film to be the insulating layer 103c is removed to form the insulating layer 103c at the time of forming the insulating layer 110, whereby the end portion of the insulating layer 103c can be substantially aligned with the end portion of the semiconductor layer 108.

The above is the description of Structure example 2-3.

Structure Example 2-4

Figure 11A:
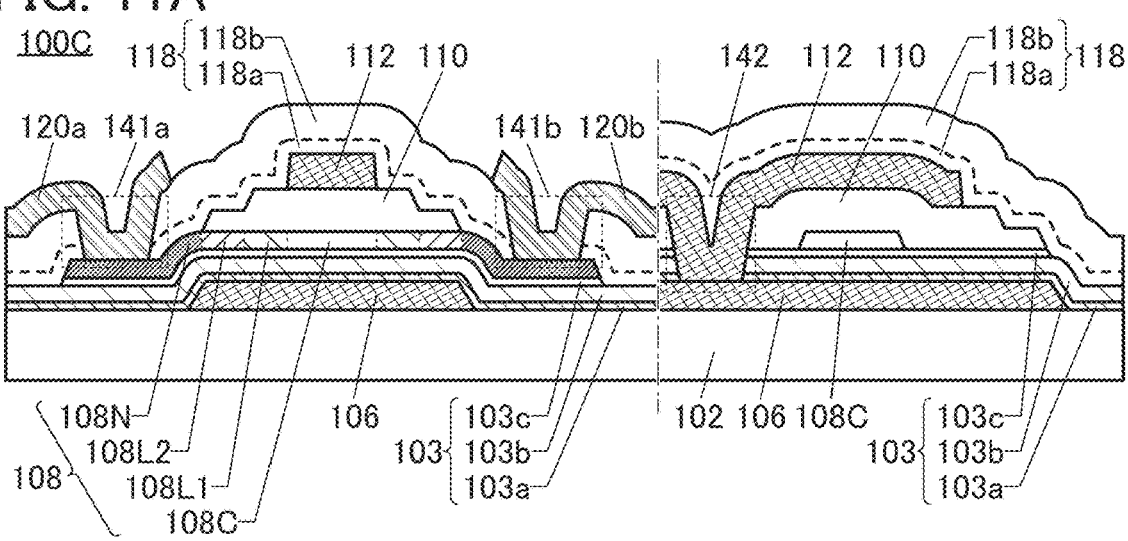
FIG. 11A, FIG. 11B, and FIG. 11C are cross-sectional views of semiconductor devices.

FIG. 11A is a cross-sectional view of a transistor 100C. In FIG. 11A, a cross section in the channel length direction is shown on the left side of the dashed-dotted line, and a cross section in the channel width direction is shown on the right side.

The transistor 100C is different from the transistor 100B mainly in that the insulating layer 118 has a stacked-layer structure. The insulating layer 118 can have a stacked-layer structure of two or more layers. In the case where the insulating layer 118 has a stacked-layer structure, a stacked-layer structure formed of different materials may be employed without limitation to a stacked-layer structure formed of the same material.

FIG. 11A illustrates an example in which the insulating layer 118 has a two-layer structure of an insulating layer 118a and an insulating layer 118b over the insulating layer 118a. The insulating layer 118a and the insulating layer 118b can be formed using a material that can be used for the insulating layer 118. The insulating layer 118a and the insulating layer 118b may be formed using the same material or different materials. Note that insulating films formed of the same kind of material can be used for the insulating layer 118a and the insulating layer 118b; thus, the interface between the insulating layer 118a and the insulating layer 118b cannot be clearly observed in some cases. Therefore, in FIG. 11A, the interface between the insulating layer 118a and the insulating layer 118b is shown by a dashed line.

Figure 11B:
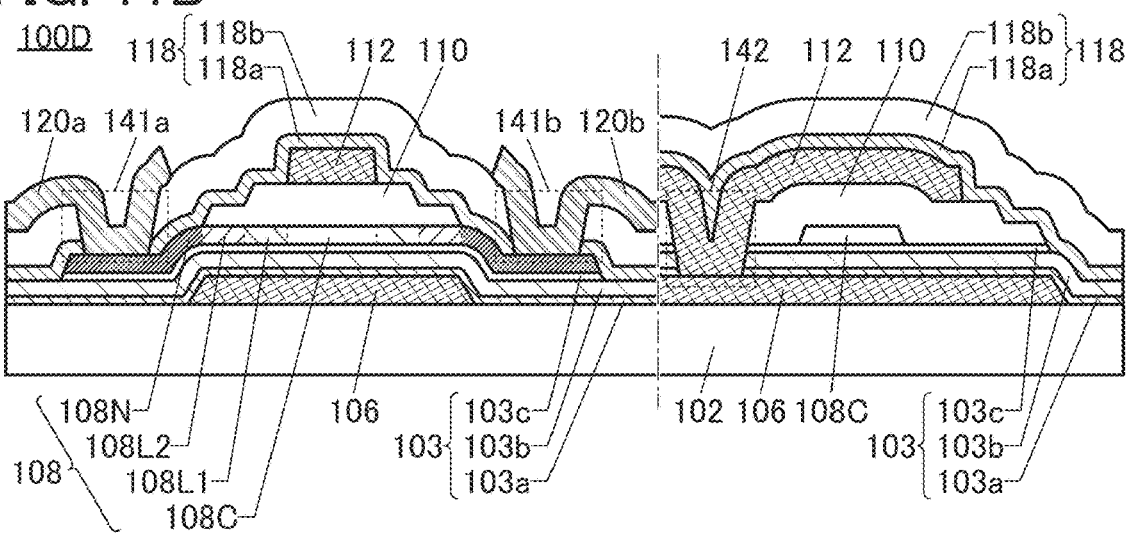
Figure 11C:
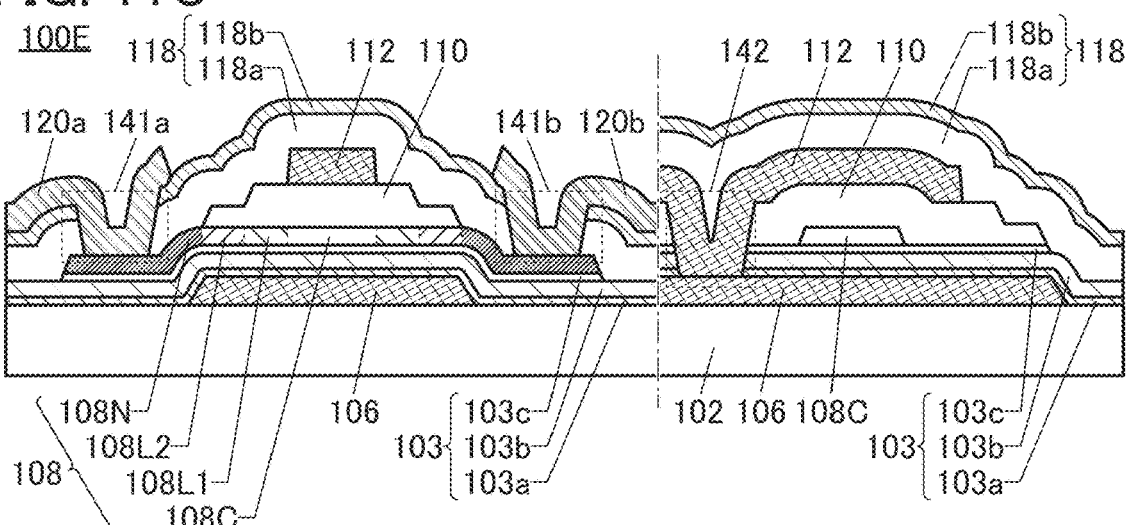

A structure different from that of the transistor 100C is illustrated in FIG. 11B and FIG. 11C. FIG. 11B is a cross-sectional view of a transistor 100D. FIG. 11C is a cross-sectional view of a transistor 100E. In each of FIG. 11B and FIG. 11C, a cross section in the channel length direction is shown on the left side of the dashed-dotted line, and a cross section in the channel width direction is shown on the right side.

The transistor 100D and the transistor 100E each have a structure in which different materials are used for the insulating layer 118a and the insulating layer 118b.

The transistor 100D has a structure in which the insulating layer 118a has a higher oxygen barrier property than the insulating layer 118b. For example, a nitride or a nitride oxide can be used for the insulating layer 118a, and an oxide or an oxynitride can be used for the insulating layer 118b.

The transistor 100E has a structure in which the insulating layer 118b has a higher oxygen barrier property than the insulating layer 118a. For example, an oxide or an oxynitride can be used for the insulating layer 118a, and a nitride or a nitride oxide can be used for the insulating layer 118b.

The resistance of the region 108N might increase if much oxygen is supplied from the outside of the transistor or a film near the region 108N to the region 108N at the time of performing high-temperature treatment after the formation of the insulating layer 118. For that reason, in the case where high-temperature treatment is performed, the treatment is preferably performed with the semiconductor layer 108 covered with the insulating layer that has a high oxygen barrier property.

The above is the description of Structure example 2-4.

Structure Example 2-5

Figure 12:
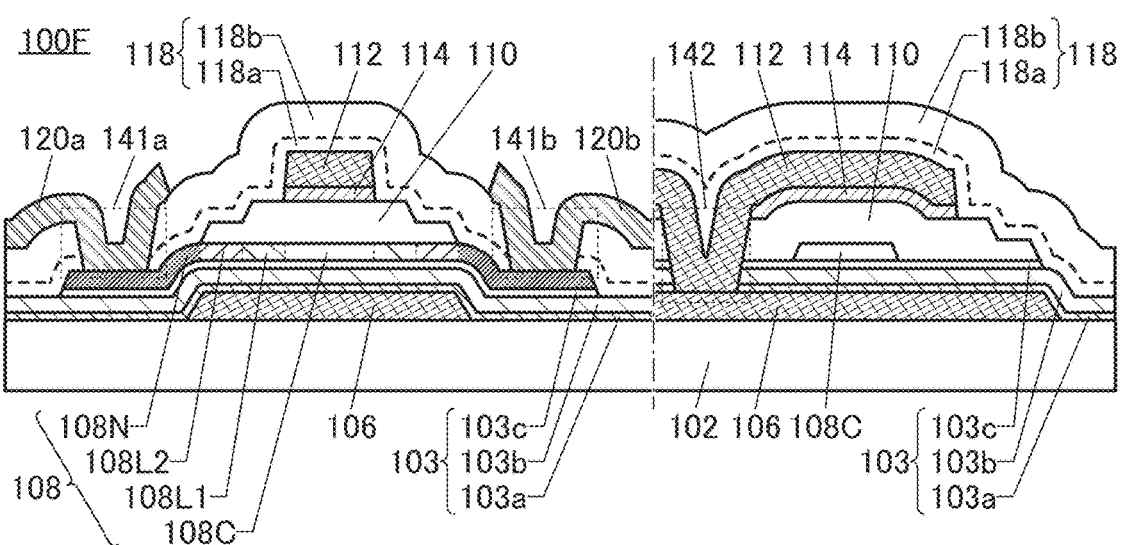
FIG. 12 is a cross-sectional view of a semiconductor device.

FIG. 12 is a cross-sectional view of a transistor 100F. In FIG. 12, a cross section in the channel length direction is shown on the left side of the dashed-dotted line, and a cross section in the channel width direction is shown on the right side.

The transistor 100F is different from the transistor 100C mainly in including the metal oxide layer 114 between the insulating layer 110 and the conductive layer 112. The above description can be referred to for the material that can be used for the metal oxide layer 114; thus, the detailed description thereof is omitted.

FIG. 12 illustrates an example in which the end portions of the conductive layer 112 are substantially aligned with end portions of the metal oxide layer 114. Forming the metal oxide layer 114 at the same time as forming the conductive layer 112 enables the end portions of the conductive layer 112 to be substantially aligned with the end portions of the metal oxide layer 114. Note that the end portions of the conductive layer 112 are not necessarily substantially aligned with the end portions of the metal oxide layer 114. For example, the end portions of the conductive layer 112 may be positioned inward from the end portions of the metal oxide layer 114.

The above is the description of Structure example 2-5.

Structure Example 2-6

Figure 13A:
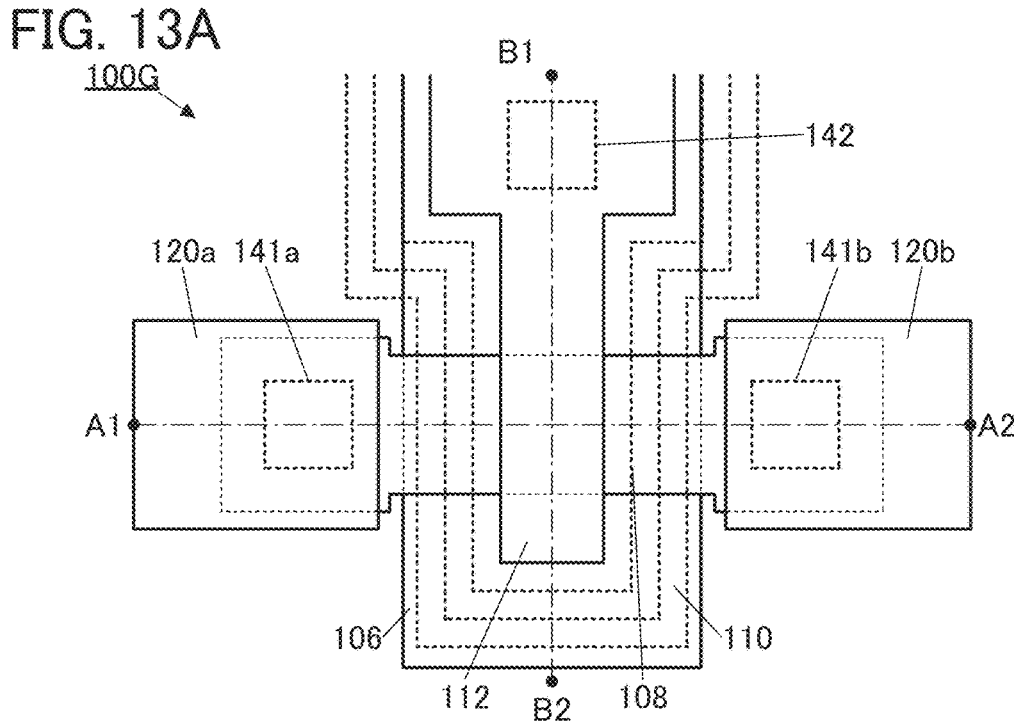
FIG. 13A is a top view of a semiconductor device.
Figure 13B:
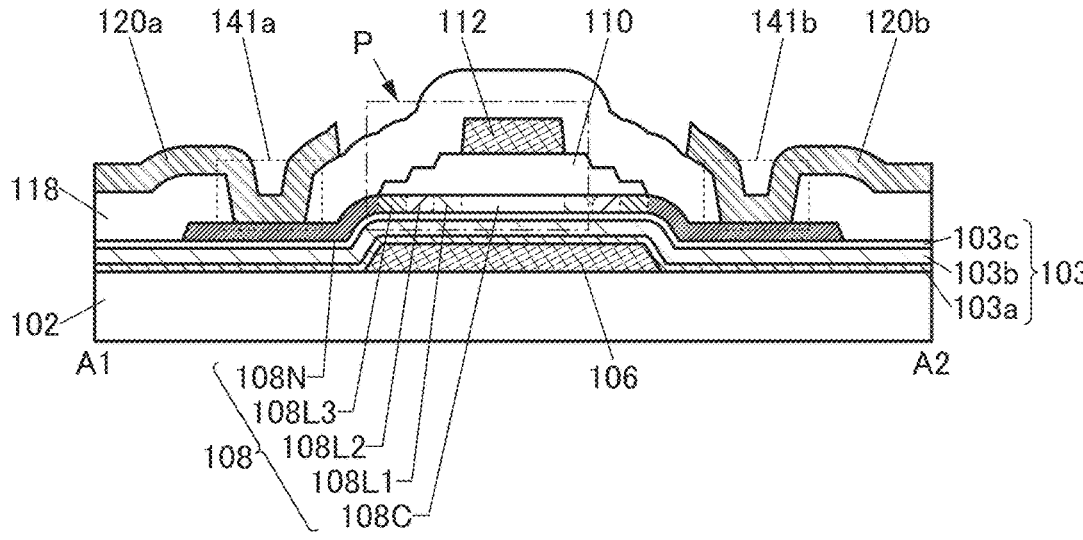
FIG. 13B and FIG. 13C are cross-sectional views of the semiconductor device.
Figure 13C:
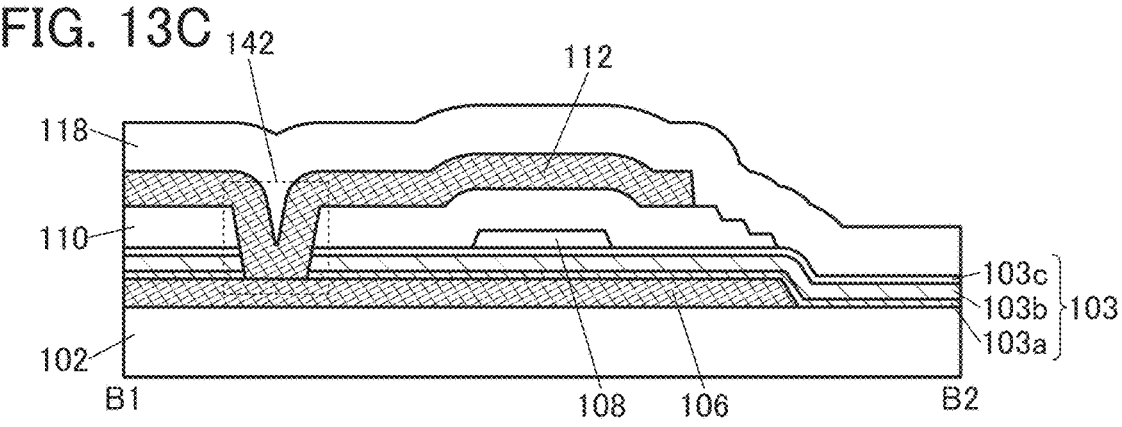
Figure 14:
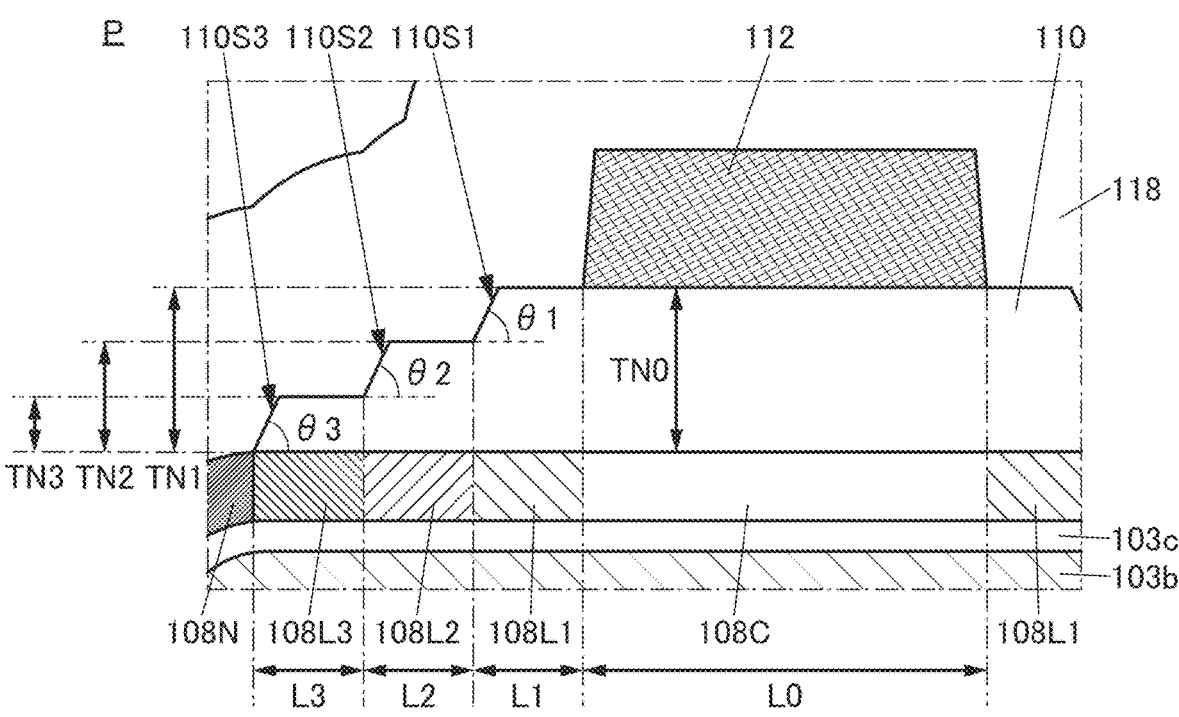
FIG. 14 is a cross-sectional view of a semiconductor device.

A structure different from that of the transistor 100B is illustrated in FIG. 13A to FIG. 13C. FIG. 13A is a top view of a transistor 100G, FIG. 13B is a cross-sectional view of the transistor 100G in the channel length direction, and FIG. 13C is a cross-sectional view of the transistor 100G in the channel width direction. FIG. 14 is an enlarged view of the region P surrounded by the dashed-dotted line in FIG. 13B.

As illustrated in FIG. 13B, FIG. 13C, and FIG. 14, the transistor 100G is different from the transistor 100B mainly in including the region 108L3 between the region 108N and the region 108L2.

In FIG. 14, the width of the region 108C in the channel length direction of the transistor 100G is the width L0, the width of the region 108L1 is the width L1, the width of the region 108L2 is the width L2, and the width of the region 108L3 is a width L3. The thickness of the insulating layer 110 in the region overlapping with the region 108C is the thickness TN0, the thickness of the insulating layer 110 in the region overlapping with the region 108L1 is the thickness TN1, the thickness of the insulating layer 110 in the region overlapping with the region 108L2 is the thickness TN2, and the thickness of the insulating layer 110 in a region overlapping with the region 108L3 is a thickness TN3.

It is preferable that the thickness TN1 be substantially equal to the thickness TN0. The thickness TN2 is preferably more than or equal to 0.2 times and less than or equal to 0.9 times, further preferably more than or equal to 0.3 times and less than or equal to 0.8 times, still further preferably more than or equal to 0.4 times and less than or equal to 0.7 times the thickness TN1. The thickness TN3 is preferably more than or equal to 0.1 times and less than or equal to 0.6 times, further preferably more than or equal to 0.15 times and less than or equal to 0.5 times, still further preferably more than or equal to 0.2 times and less than or equal to 0.4 times the thickness TN1. With the thicknesses in the above ranges, the resistance of the region 108L1, the region 108L2, and the region 108L3 can be controlled.

The width L1, the width L2, and the width L3 each range preferably from 50 nm to 1 μm, further preferably from 70 nm to 700 nm, still further preferably from 100 nm to 500 nm. In particular, making the total width of the width L1, the width L2, and the width L3 larger than the thickness of the insulating layer 110 can effectively suppress electric field concentration around the drain. On the other hand, when the total width of the width L1, the width L2, and the width L3 is longer than 2 μm, the source-drain resistance increases and the driving speed of the transistor may be low. When the width L1, the width L2, and the width L3 are each set in the above range, a transistor and a semiconductor device that have high reliability and high driving speed can be obtained. Note that the width L1, the width L2, and the width L3 can be determined in accordance with the thickness of the semiconductor layer 108, the thickness of the insulating layer 110, and the level of voltage applied between the source and the drain when the transistor 100 is driven.

The first side surfaces 110S1, the second side surfaces 110S2, and the third side surfaces 110S3 of the insulating layer 110 each preferably have a tapered shape. With the first side surfaces 110S1, the second side surfaces 110S2, and the third side surfaces 110S3 each having a tapered shape, the coverage with the layer formed over the insulating layer 110 (e.g., the insulating layer 118) can be improved and occurrence of a defect, such as a void or disconnection caused by a step, in the layer can be inhibited.

FIG. 14 illustrates the angle θ1 formed between the first side surface 110S1 and a plane in contact with the lower end of the first side surface 110S1, the angle θ2 formed between the second side surface 110S2 and a plane in contact with the lower end of the second side surface 110S2, and an angle θ3 formed between the third side surface 110S3 and a plane in contact with the lower end of the third side surface 110S3. The angle θ1, the angle θ2, and the angle θ3 are each preferably greater than or equal to 30° and less than 90°, further preferably greater than or equal to 35° and less than or equal to 85°, still further preferably greater than or equal to 40° and less than or equal to 80°, yet further preferably greater than or equal to 45° and less than or equal to 75°. With the angles in the above ranges, the insulating layer 118 provided over the insulating layer 110 can have increased coverage.

The angle θ1, the angle θ2, and the angle θ3 illustrated in FIG. 14 are described. The angle θ1 is an angle formed between the first side surface 110S1 and a plane that is extended to the inside of the insulating layer 110 from the top surface of the insulating layer 110 in contact with the lower end of the first side surface 110S1. The angle θ2 is an angle formed between the second side surface 110S2 and a plane that is extended to the inside of the insulating layer 110 from the top surface of the insulating layer 110 in contact with a lower end of the second side surface 110S2. The angle θ3 is an angle formed between the bottom surface of the insulating layer 110 and the third side surface 110S3. The angle θ1, the angle θ2, and the angle θ3 are each preferably greater than or equal to 30° and less than 90°, further preferably greater than or equal to 35° and less than or equal to 85°, still further preferably greater than or equal to 40° and less than or equal to 80°, yet still further preferably greater than or equal to 45° and less than or equal to 75°. With the angles in the above ranges, the insulating layer 118 provided over the insulating layer 110 can have increased coverage.

The above is the description of Structure example 2-6.

Manufacturing Method Example 1

A method for manufacturing the semiconductor device of one embodiment of the present invention is described below with reference to drawings. Here, the method is described using, as an example, the transistor 100C exemplified in the above structure example.

Note that thin films that constitute the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. As an example of the thermal CVD method, a metal organic chemical vapor deposition (MOCVD: Metal Organic CVD) method can be given.

The thin films that constitute the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical photolithography methods. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light or X-rays may be used. Instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

Each drawing in FIG. 15A to FIG. 15D, FIG. 16A to FIG. 16C, FIG. 17A to FIG. 17C, and FIG. 18A to FIG. 18C illustrates a cross section at a stage in the manufacturing process of the transistor 100C. In each drawing, a cross section in the channel length direction is shown on the left side of the center dashed line, and a cross section in the channel width direction is shown on the right side.

[Formation of Conductive Layer 106]

A conductive film is formed over the substrate 102 and processed by etching to form the conductive layer 106 functioning as a first gate electrode. At this time, the conductive layer 106 is preferably processed to have an end portion with a tapered shape. This can improve step coverage with the insulating layer 103 to be formed in the next step.

When a conductive film containing copper is used as the conductive film to be the conductive layer 106, wiring resistance can be reduced. For example, a conductive film containing copper is preferably used in the case where the semiconductor device of one embodiment of the present invention is used in a large display device or in the case of a display device with a high resolution. Even in the case where a conductive film containing copper is used as the conductive layer 106, diffusion of copper to the semiconductor layer 108 side can be suppressed by the insulating layer 103, whereby a highly reliable transistor can be obtained.

[Formation of Insulating Layer 103]

Figure 15A:
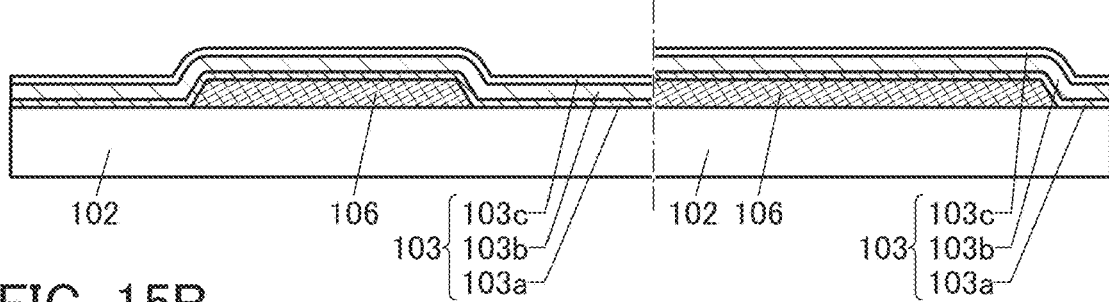
FIG. 15A, FIG. 15B, FIG. 15C, and FIG. 15D are cross-sectional views illustrating a method for manufacturing a semiconductor device.

Then, the insulating layer 103 is formed to cover the substrate 102 and the conductive layer 106 (FIG. 15A). The insulating layer 103 can be formed by a PECVD method, an ALD method, a sputtering method, or the like.

Here, the insulating layer 103 is formed by stacking the insulating layer 103a, the insulating layer 103b, and the insulating layer 103c. In particular, each of the insulating layers included in the insulating layer 103 is preferably formed by a PECVD method. The above description in Structure example 1 can be referred to for the formation of the insulating layer 103; thus, the detailed description thereof is omitted.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

[Formation of Semiconductor Layer 108]

Figure 15B:
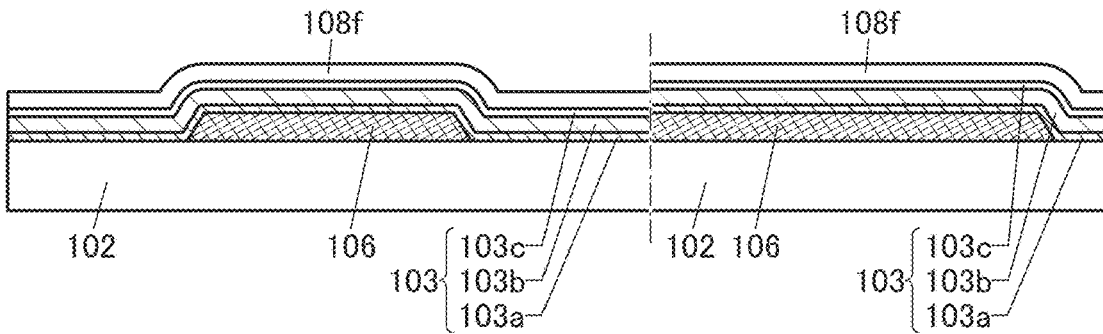

Next, a metal oxide film 108f to be the semiconductor layer 108 is formed over the insulating layer 103 (FIG. 15B).

The metal oxide film 108f is preferably formed by a sputtering method using a metal oxide target.

The metal oxide film 108f is preferably a dense film with as few defects as possible. The metal oxide film 108f is preferably a highly purified film in which impurities such as hydrogen and water are reduced as much as possible. It is particularly preferable to use a metal oxide film having crystallinity as the metal oxide film 108f.

In forming the metal oxide film 108f, an oxygen gas and an inert gas (e.g., a helium gas, an argon gas, or a xenon gas) may be mixed. Note that when the proportion of an oxygen gas in the whole deposition gas (hereinafter, also referred to as oxygen flow rate ratio) at the time of forming the metal oxide film is higher, the crystallinity of the metal oxide film can be higher and a transistor with higher reliability can be obtained. By contrast, when the oxygen flow rate ratio is lower, the crystallinity of the metal oxide film is lower and a transistor with a higher on-state current can be obtained.

In the case where the semiconductor layer 108 has a stacked-layer structure, successive deposition is preferably performed using the same sputtering target in the same deposition chamber because the interface can be favorable. Although the deposition conditions such as pressure, temperature, and power at the time of the deposition may vary between the metal oxide films, it is particularly preferable to employ the same conditions except for the oxygen flow rate ratio because the time required for deposition steps can be shortened. Furthermore, in the case where metal oxide films having different compositions are stacked, successive deposition without exposure to the air is preferably performed.

The deposition conditions are preferably set such that the metal oxide film 108f becomes a metal oxide film having a CAAC structure, a metal oxide film having an nc structure, or a metal oxide film in which a CAAC structure and an nc structure are mixed. Note that the deposition conditions in which the formed metal oxide film has a CAAC structure and the deposition conditions in which the formed metal oxide film has an nc structure are different depending on the compositions of the sputtering targets to be used; therefore, the substrate temperature, the oxygen flow rate ratio, the pressure, the power, and the like are set as appropriate in accordance with the compositions.

The metal oxide film 108f is formed at a substrate temperature preferably higher than or equal to room temperature and lower than or equal to 450° C., further preferably higher than or equal to room temperature and lower than or equal to 300° C., still further preferably higher than or equal to room temperature and lower than or equal to 200° C., yet still further preferably higher than or equal to room temperature and lower than or equal to 140° C. For example, in the case where a large-sized glass substrate or a resin substrate is used as the substrate 102, the substrate temperature is preferably higher than or equal to room temperature and lower than 140° C., in which case the productivity can be increased. Furthermore, when the metal oxide film is formed with the substrate temperature set at room temperature or without heating, the crystallinity can be made low.

Before formation of the metal oxide film 108f, it is preferable to perform treatment for desorbing water, hydrogen, an organic substance, or the like adsorbed onto a surface of the insulating layer 103 or treatment for supplying oxygen into the insulating layer 103. For example, heat treatment can be performed at a temperature higher than or equal to 70° C. and lower than or equal to 200° C. in a reduced-pressure atmosphere. Alternatively, plasma treatment may be performed in an oxygen-containing atmosphere. When plasma treatment is performed in an oxygen-containing atmosphere, e.g., in an atmosphere containing a dinitrogen monoxide gas, oxygen can be supplied to the insulating layer 103. When plasma treatment is performed in an atmosphere containing a dinitrogen monoxide gas, an organic substance on the surface of the insulating layer 103 can be suitably removed. After such treatment, the metal oxide film 108f is preferably formed successively without exposure of the surface of the insulating layer 103 to the air.

Figure 15C:
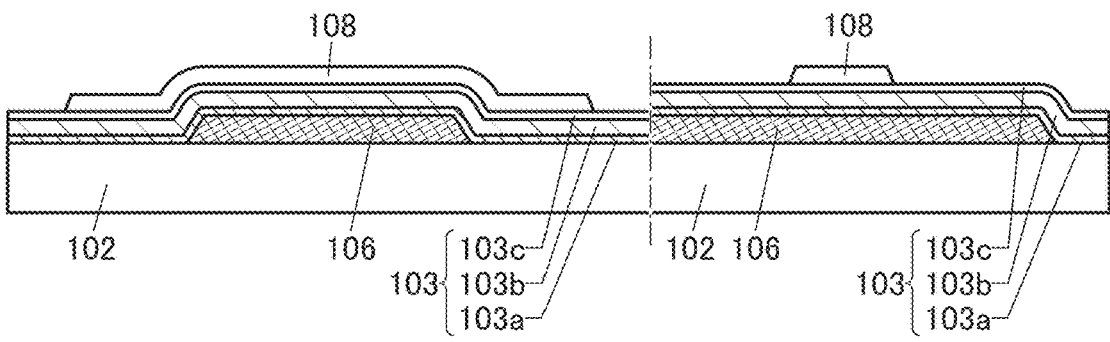

Next, the metal oxide film 108f is processed, so that the island-shaped semiconductor layer 108 is formed (FIG. 15C).

For processing of the metal oxide film 108f, either one or both of a wet etching method and a dry etching method are used. At this time, part of the insulating layer 103c that does not overlap with the semiconductor layer 108 may be etched and removed. Removing part of the insulating layer 103c makes the semiconductor layer 108 and the insulating layer 103c have substantially the same top surface shapes. Moreover, removing part of the insulating layer 103c makes part of the insulating layer 103b to be exposed, resulting in a structure in which the insulating layer 118 to be formed later is in contact with the insulating layer 103b.

After the metal oxide film 108f is formed or the metal oxide film 108f is processed into the semiconductor layer 108, heat treatment may be performed to remove hydrogen or water in the metal oxide film or the semiconductor layer 108. By the heat treatment, hydrogen or water contained in the metal oxide film 108f or the semiconductor layer 108 or adsorbed on the surface of the metal oxide film 108f or the semiconductor layer 108 can be removed. Furthermore, the film quality of the metal oxide film 108f or the semiconductor layer 108 is improved (e.g., the number of defects is reduced or crystallinity is increased) by the heat treatment in some cases.

Oxygen can be supplied from the insulating layer 103 to the metal oxide film 108f or the semiconductor layer 108 by heat treatment. In the case where oxygen is supplied from the insulating layer 103, it is further preferable that heat treatment be performed before processing of the semiconductor layer 108.

The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C. Note that heat treatment is not necessarily performed after the metal oxide film 108f is formed or the metal oxide film 108f is processed into the semiconductor layer 108. The heat treatment may be performed at any stage as long as it is after the formation of the metal oxide film. The heat treatment may also serve as heat treatment or a heat application step that is to be performed later.

The heat treatment can be performed in an atmosphere containing a rare gas or nitrogen. Alternatively, heating may be performed in the atmosphere, and then heating may be performed in an oxygen-containing atmosphere. As a nitrogen-containing atmosphere or an oxygen-containing atmosphere, clean dry air (CDA) may be used. It is preferable that the atmosphere of the above heat treatment not contain hydrogen, water, or the like. When a gas that is highly purified to have a dew point of −60° C. or lower, preferably −100° C. or lower is used, hydrogen, water, or the like can be prevented from being taken into the semiconductor layer 108 as much as possible. An electric furnace, a rapid thermal annealing (RTA) apparatus, or the like can be used for the heat treatment. The use of the RTA apparatus can shorten the heat treatment time.

Note that an insulating film 110f is preferably formed immediately after the formation of the semiconductor layer 108. In a state where the surface of the semiconductor layer 108 is exposed, water is adsorbed on the surface of the semiconductor layer 108 in some cases. When water is adsorbed on the surface of the semiconductor layer 108, hydrogen is diffused into the semiconductor layer 108 by later heat treatment or the like, so that VoH is formed in some cases. Since VoH might be a carrier generation source, the amount of water adsorbed on the semiconductor layer 108 is preferably small.

[Formation of Insulating Film 110f]

Figure 15D:
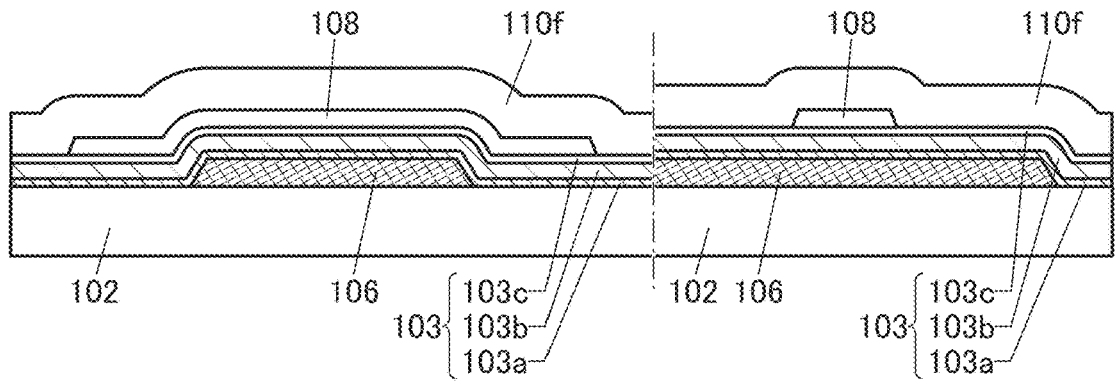

Next, the insulating film 110f is formed to cover the insulating layer 103 and the semiconductor layer 108 (FIG. 15D).

The insulating film 110f is a film to be the insulating layer 110 later. As the insulating film 110f, for example, an oxide film or an oxynitride film such as a silicon oxide film or a silicon oxynitride film is preferably formed with a plasma-enhanced chemical vapor deposition apparatus (referred to as a PECVD apparatus or a plasma CVD apparatus). Alternatively, the insulating film 110f may be formed by a PECVD method using a microwave.

Heat treatment may be performed after the formation of the insulating film 110f. Performing the heat treatment can remove impurities in the insulating film 110f and adsorbed water on the surface of the insulating film 110f. The heat treatment can be performed at a temperature higher than or equal to 200° C. and lower than or equal to 400° C. in an atmosphere containing one or more of nitrogen, oxygen, and a rare gas. Note that heat treatment is not necessarily performed after the formation of the insulating film 110f. The heat treatment may be performed at any stage as long as it is after the formation of the insulating film 110f. The heat treatment may also serve as heat treatment or a heat application step that is to be performed later.

It is preferable to perform plasma treatment on a surface of the semiconductor layer 108 before formation of the insulating film 110f. By the plasma treatment, impurities adsorbed onto the surface of the semiconductor layer 108, such as water, can be reduced. Thus, impurities at the interface between the semiconductor layer 108 and the insulating film 110f can be reduced, achieving a highly reliable transistor. The plasma treatment is particularly suitable in the case where the surface of the semiconductor layer 108 is exposed to the air after the formation of the semiconductor layer 108 before the formation of the insulating film 110f. For example, the plasma treatment can be performed in an atmosphere of oxygen, ozone, nitrogen, dinitrogen monoxide, argon, or the like. The plasma treatment and the formation of the insulating film 110f are preferably performed successively without exposure to the air.

Here, heat treatment is preferably performed after the insulating film 110f is formed. By the heat treatment, hydrogen or water contained in the insulating film 110f or adsorbed on its surface can be removed. Moreover, the number of defects in the insulating film 110f can be reduced.

The above description can be referred to for the conditions of the heat treatment.

After the insulating film 110f is formed or after the above heat treatment for removing hydrogen or water is performed, treatment for supplying oxygen to the insulating film 110f may be performed. For example, plasma treatment, heat treatment, or the like can be performed in an oxygen-containing atmosphere. Alternatively, oxygen may be supplied to the insulating film 110f by a plasma ion doping method, an ion implantation method, or the like. As the plasma treatment, a PECVD apparatus can be suitably used, for example. In the case where the insulating film 110f is formed with a PECVD apparatus, plasma treatment is preferably performed in vacuum in succession after the formation of the insulating film 110f. By successively performing the formation of the insulating film 110f and the plasma treatment in vacuum, the productivity can be increased.

In the case where heat treatment is performed after treatment for supplying oxygen to the insulating film 110f, the heat treatment is preferably performed after a film (e.g., a metal oxide film 114f) is formed over the insulating film 110f. When the heat treatment is performed while the insulating film 110f is exposed, oxygen supplied to the insulating film 110f might be released to the outside from the insulating film 110f. Performing the heat treatment after the film (e.g., the metal oxide film 114*f*) is formed over the insulating film 110*f* can inhibit release of oxygen, which has been supplied to the insulating film 110*f*, to the outside from the insulating film 110*f*.

[Formation of Opening Portion 142]

Figure 16A:
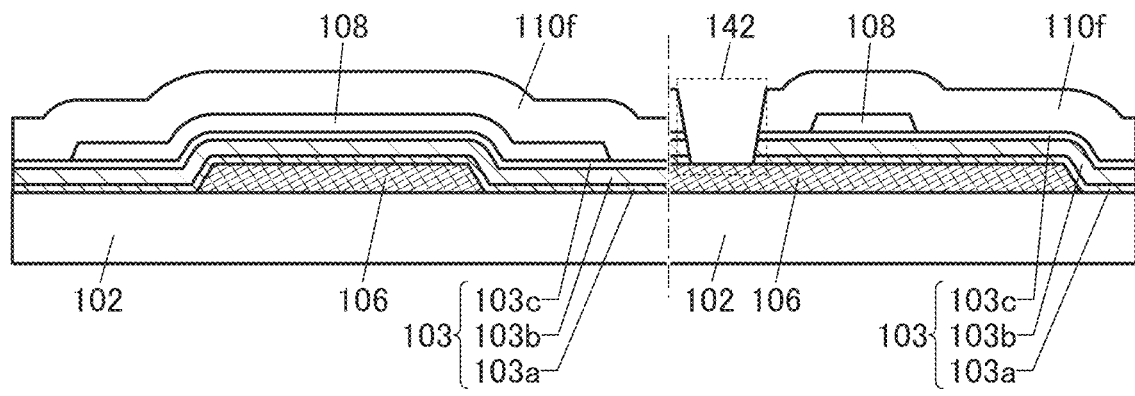
FIG. 16A, FIG. 16B, and FIG. 16C are cross-sectional views illustrating a method for manufacturing a semiconductor device.

Then, the insulating layer 110 and the insulating layer 103 are partly removed to form the opening portion 142 reaching the conductive layer 106 (FIG. 16A). Accordingly, the conductive layer 112 to be formed later can be electrically connected to the conductive layer 106 through the opening portion 142.

[Formation of Conductive Film 112*f*]

Figure 16B:
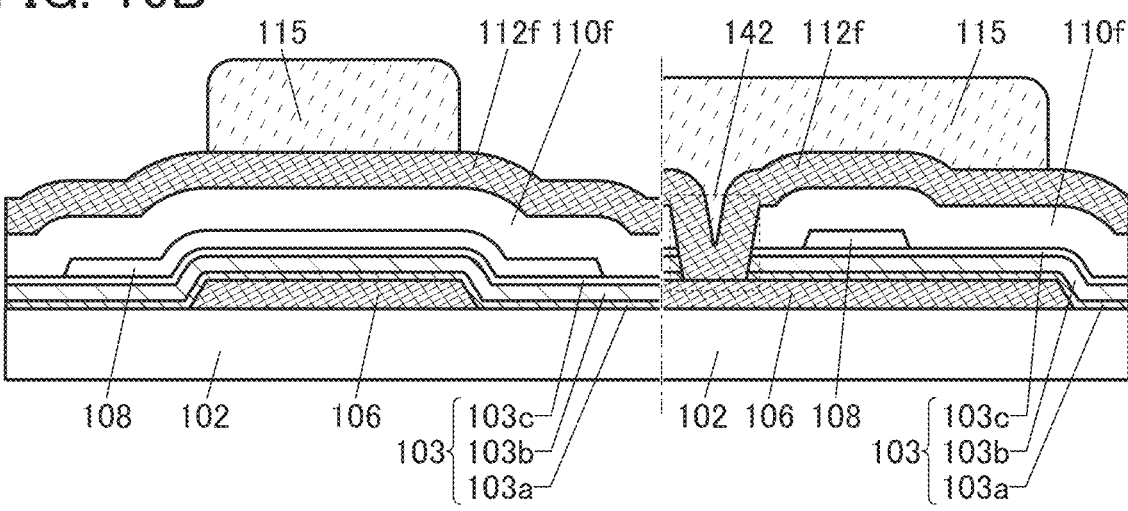

Next, a conductive film 112*f* to be the conductive layer 112 is formed (FIG. 16B). The conductive film 112*f* is preferably formed by a sputtering method using a sputtering target of a metal or an alloy.

[Formation of Insulating Layer 110 and Conductive Layer 112]

Next, a resist mask 115 is formed over the conductive film 112*f* (FIG. 16B). After that, the conductive film 112*f* in a region not covered with the resist mask 115 is removed, so that the conductive layer 112 is formed (FIG. 16C).

A wet etching method can be suitably used to form the conductive layer 112. In a wet etching method, for example, an etchant containing hydrogen peroxide can be used. For example, an etchant containing one or more of phosphoric acid, acetic acid, nitric acid, hydrochloric acid, and sulfuric acid can be used. In particular, in the case where a material containing copper is used for the conductive layer 112, an etchant containing phosphoric acid, acetic acid, and nitric acid can be suitably used.

Figure 16C:
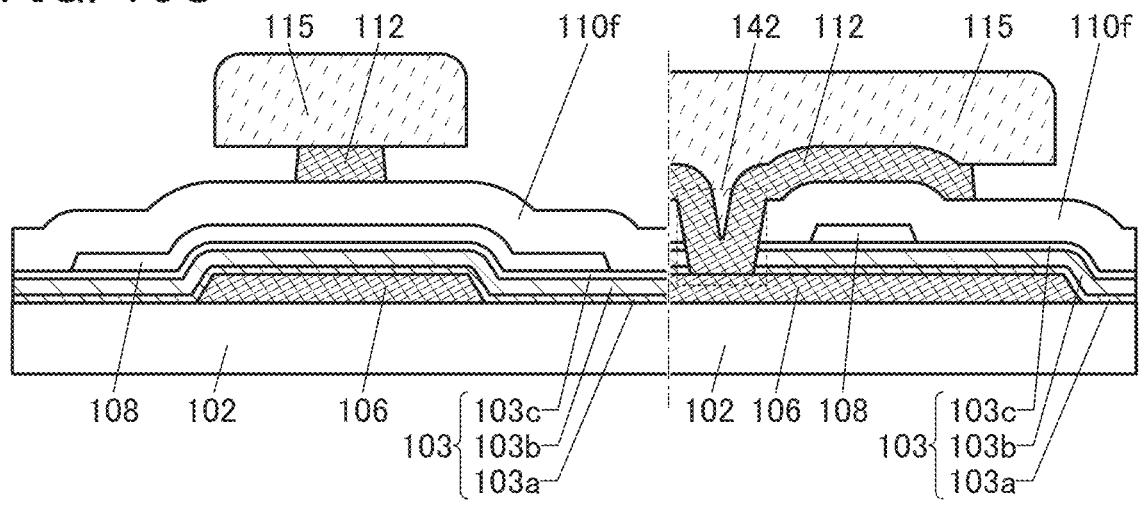

As illustrated in FIG. 16C, the processing is performed such that the end portion of the conductive layer 112 is positioned inward from the outline of the resist mask 115. A wet etching method is suitably used to form the conductive layer 112. The width L0 of the region 108C can be controlled by adjustment of the etching time.

For the formation of the conductive layer 112, etching may be performed at least twice using different etching conditions or methods. For example, the conductive film 112*f* may be etched by an anisotropic etching method, and then a side surface of the conductive film 112*f* may be etched by an isotropic etching method to make the end surfaces recede (also referred to as side etching). Consequently, the conductive layer 112 positioned inward from the insulating layer 110 in a plan view can be formed.

Figure 17A:
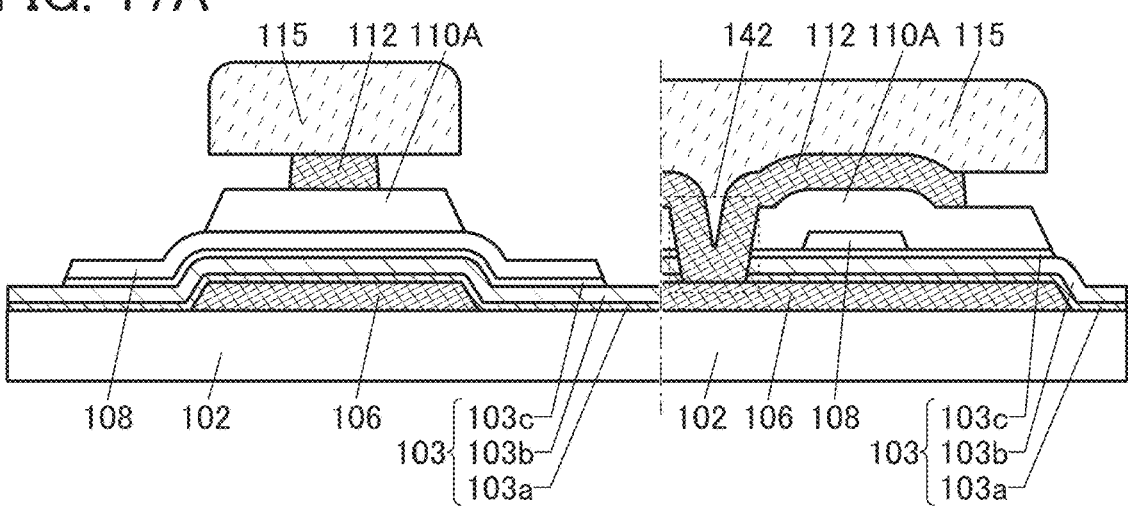
FIG. 17A, FIG. 17B, and FIG. 17C are cross-sectional views illustrating a method for manufacturing a semiconductor device.

Next, the insulating film 110*f* in a region not covered with the resist mask 115 is removed to form an insulating layer 110A (FIG. 17A). Anisotropic etching is preferably used to form the insulating layer 110A. In particular, a dry etching method can be suitably used. With the use of a dry etching method, end portions of the resist mask 115 can be substantially aligned with end portions of the insulating layer 110A.

Figure 17B:
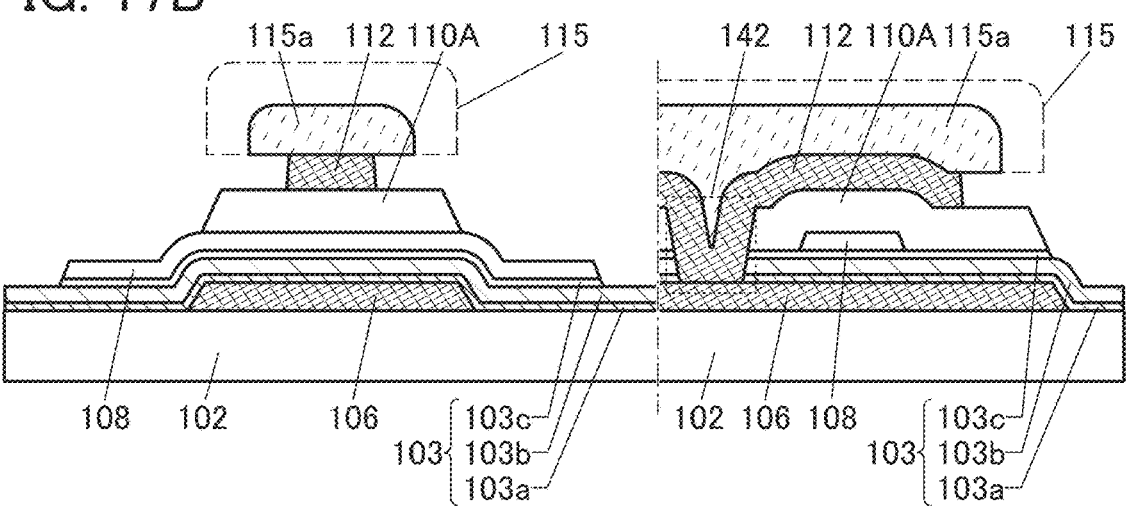

Next, the resist mask 115 is shrunk to form a resist mask 115*a* (FIG. 17B). FIG. 17B illustrates the resist mask 115*a* after shrinkage, and also illustrates the resist mask 115 before shrinkage by dashed lines. End portions of the resist mask 115*a* are preferably positioned outward from the end portions of the conductive layer 112. That is, the end portions of the resist mask 115*a* are preferably positioned between the end portions of the conductive layer 112 and the end portions of the insulating layer 110A.

The resist mask 115*a* can be suitably formed by an ashing method. For example, a plasma ashing method in which a gas such as oxygen or ozone is made into plasma with a high-frequency wave or the like and a reaction with the resist mask is caused using the plasma may be employed as an ashing method. Alternatively, photoexcitation ashing in which a gas such as oxygen or ozone is irradiated with light such as ultraviolet light to promote a reaction between the gas and the resist mask may be employed. Note that the thickness of the resist mask 115 may be reduced by an ashing method at the same time as a reduction in the area of the resist mask 115 in a plan view.

Figure 17C:
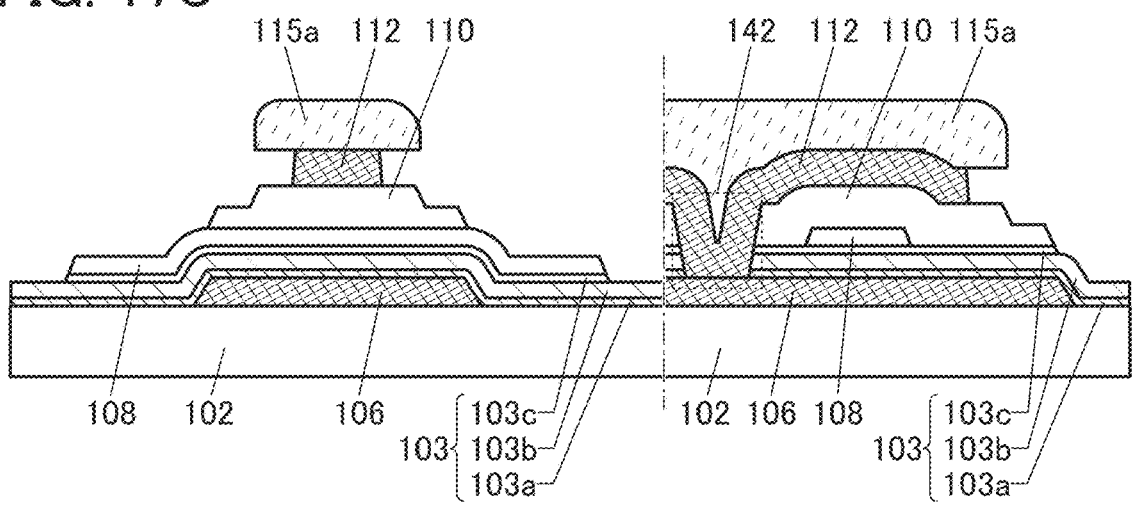

Next, part of the insulating layer 110A in a region not covered with the resist mask 115*a* is removed to form the insulating layer 110 (FIG. 17C). Anisotropic etching is preferably used to form the insulating layer 110. In particular, a dry etching method can be suitably used. In that case, processing is preferably performed such that the exposed region of the insulating layer 110A is not entirely removed and part of the upper portion of the insulating layer 110A in that region is removed (hereinafter, also referred to as half etching) to reduce the thickness. As described above, the resist mask used for processing the insulating layer is shrunk, and the insulating layer is processed again using the shrunk resist mask, whereby the insulating layer 110 having a step-like shape can be formed. Furthermore, adjusting the shrinkage of the resist mask allows the width L2 of the region 108L2 to be controlled.

Since half etching is used for forming the insulating layer 110, it is preferable that the etching rate of the film to be the insulating layer 110A be checked and the etching time required for obtaining the desired thickness TN2 be calculated in advance. The half etching is performed in the calculated etching time, whereby the insulating layer 110 can be formed with high accuracy. With the use of a dry etching method for the formation of the insulating layer 110, the thickness TN2 can be minutely adjusted; thus, the transistor can have favorable electrical characteristics and high reliability.

After the formation of the insulating layer 110, the resist mask 115 is removed.

Here, cleaning may be performed to remove impurities. Performing cleaning can remove impurities attached to the exposed regions of the insulating layer 110 and the semiconductor layer 108 and inhibit a reduction in the electrical characteristics and reliability of the transistor. Examples of impurities include a component of the etching gas or the etchant attached during etching of the insulating film 110*f*, a component of the conductive film 112*f*, and a component of the metal oxide film 114*f*.

As the cleaning method, wet cleaning using a cleaning solution or the like, plasma treatment, or the like can be used. Alternatively, such cleaning methods may be performed in combination as appropriate. For the wet cleaning, a cleaning solution containing oxalic acid, phosphoric acid, ammonia water, hydrofluoric acid, or the like can be used.

[Formation of Insulating Layer 118]

Next, the insulating layer 118 is formed to cover the insulating layer 103, the semiconductor layer 108, the insulating layer 110, and the conductive layer 112. Here, a structure in which the insulating layer 118 has a stacked-layer structure of the insulating layer 118*a* and the insulating layer 118*b* is described.

Figure 18A:
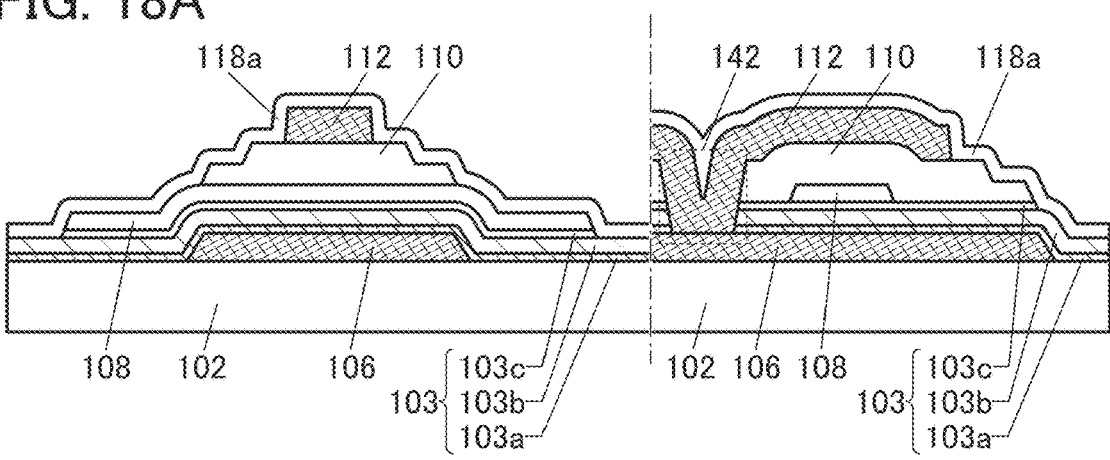
FIG. 18A, FIG. 18B, and FIG. 18C are cross-sectional views illustrating a method for manufacturing a semiconductor device.

The insulating layer 118*a* is formed to cover the insulating layer 103, the semiconductor layer 108, the insulating layer 110, and the conductive layer 112 (FIG. 18A).

The insulating layer 118*a* is preferably formed by a plasma CVD method using a deposition gas containing hydrogen. For example, a silicon nitride film is formed using a deposition gas containing a silane gas and an ammonia gas. Using the ammonia gas in addition to the silane gas enables the film to contain a large amount of hydrogen. Furthermore, hydrogen can be supplied to the exposed portion of the semiconductor layer 108 at the time of the deposition. By supplying hydrogen, the regions 108N having extremely low resistance can be formed in the semiconductor layer 108.

Figure 18B:
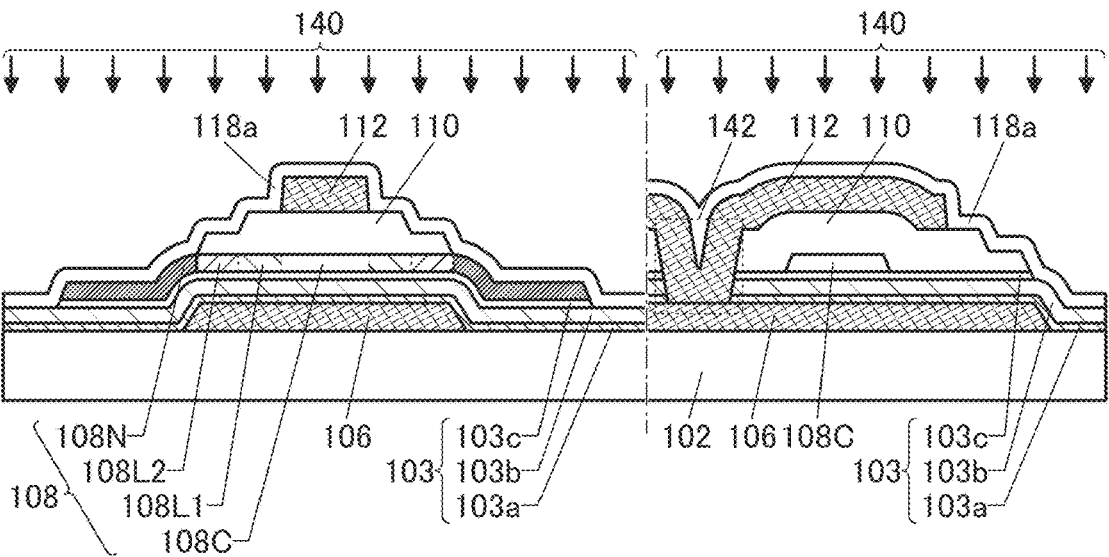

Next, a first element 140 is supplied (added or injected) to the semiconductor layer 108 through the insulating layer 110 and the insulating layer 118a with the use of the conductive layer 112 as a mask (FIG. 18B). The first element 140 supplied to the semiconductor layer 108 lowers the resistance of the semiconductor layer 108 in a region not covered with the conductive layer 112, so that the region 108L1, the region 108L2, and the region 108N can be formed. In that case, the total thickness of the insulating layer 118a and the insulating layer 110 provided over the region 108L1, the region 108L2, and the region 108N is the smallest in the region 108N, followed in order by those in the region 108L2 and the region 108L1. Thus, the amount of first element 140 to be supplied is the largest and the resistance is the lowest in the region 108N, followed in order by those in the region 108L2 and the region 108L1. Adjustment of the thickness of the insulating layer 110, the thickness of the insulating layer 118a, and the conditions for supplying the first element 140 enables the resistance of the region 108L1, the region 108L2, and the region 108N to be controlled.

The conditions for supplying the first element 140 are preferably determined in consideration of the material and thickness of the conductive layer 112 so that the amount of first element 140 supplied to the region 108C of the semiconductor layer 108 that overlaps with the conductive layer 112 is as small as possible. Accordingly, the region 108C with sufficiently reduced impurity concentration can be formed in the region of the semiconductor layer 108 that overlaps with the conductive layer 112.

The above description can be referred to for an element that can be used as the first element 140; thus, the detailed description thereof is omitted.

Plasma treatment can be suitably employed for supplying the first element 140. In the case of employing plasma treatment, plasma is generated in a gas atmosphere containing the first element 140 to be added and plasma treatment is performed, so that the first element 140 can be added. A dry etching apparatus, an ashing apparatus, a plasma CVD apparatus, a high-density plasma CVD apparatus, or the like can be used as an apparatus for generating the plasma.

The first element 140 may be supplied successively after formation of the insulating layer 118a without exposure to the air. For example, with the use of a plasma CVD apparatus, the first element 140 can be supplied successively after formation of the insulating layer 118a without exposure to the air. By successively performing these steps, the productivity of the semiconductor device can be increased.

In the case of performing plasma treatment, a gas containing the first element can be used as a gas for supplying the first element 140. It is particularly preferable to use a gas containing hydrogen; addition of hydrogen to the region 108L1, the region 108L2, and the region 108N allows the resistance of the regions to be controlled. As the gas containing the first element 140, for example, hydrogen ($H_2$), ammonia ($NH_3$), or silane ($SiH_4$) can be suitably used.

The substrate temperature during the plasma treatment is preferably higher than or equal to room temperature and lower than or equal to 450° C., further preferably higher than or equal to 150° C. and lower than or equal to 400° C., still further preferably higher than or equal to 200° C. and lower than or equal to 350° C. The substrate temperature in the above range promotes a reaction between the material included in the semiconductor layer 108 and the first element 140; thus, the resistance of the semiconductor layer 108 can be lowered.

The pressure in a treatment chamber during the plasma treatment is preferably higher than or equal to 50 Pa and lower than or equal to 1500 Pa, further preferably higher than or equal to 100 Pa and lower than or equal to 1000 Pa, still further preferably higher than or equal to 120 Pa and lower than or equal to 500 Pa, yet further preferably higher than or equal to 150 Pa and lower than or equal to 300 Pa. With the pressure in the above range, plasma can be stably generated.

By appropriate selection of the conditions of the plasma treatment, the amount of first element 140 added to the semiconductor layer 108 can be adjusted and a resistance value can be controlled. Since the first element 140 is added to the semiconductor layer 108 through the insulating layer 118a and the insulating layer 110, the thickness of the insulating layer 118a and the thickness of the insulating layer 110 are preferably adjusted such that the desired resistance can be obtained.

Alternatively, the first element 140 may be supplied by treatment utilizing thermal diffusion by heating using the gas containing the first element 140.

Alternatively, the first element 140 may be supplied by a plasma ion doping method or an ion implantation method. In these methods, the concentration profile in the depth direction can be controlled with high accuracy by the acceleration voltage and the dosage of ions, or the like. The use of a plasma ion doping method can increase productivity. In addition, the use of an ion implantation method with mass separation can increase the purity of the first element to be supplied. As the first element 140, one or more of boron, phosphorus, aluminum, magnesium, and silicon can be particularly suitably used.

In the treatment for supplying the first element 140, treatment conditions are preferably controlled such that the concentration is the highest at an interface between the semiconductor layer 108 and the insulating layer 110, a portion in the semiconductor layer 108 near the interface, or a portion in the insulating layer 110 near the interface. Accordingly, the first element 140 at an optimal concentration can be supplied to both the semiconductor layer 108 and the insulating layer 110 in one treatment.

In the case of employing a plasma ion doping method or an ion implantation method, the above-described gas containing the first element can be used as the gas for supplying the first element 140. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used. Besides, any of $CH_4$, $N_2$, $NH_3$, $AlH_3$, $AlCl_3$, $SiH_4$, $Si_2H_6$, $F_2$, $HF$, $H_2$, $(C_5H_5)_2Mg$, a rare gas, and the like can be used as the gas for supplying the first element 140. An ion source is not limited to a gas, and a solid or a liquid that is vaporized by heating may be used.

Addition of the first element 140 can be controlled by setting the conditions such as the acceleration voltage and the dosage in consideration of the compositions, densities, thicknesses, and the like of the insulating layer 110 and the semiconductor layer 108.

For example, in the case where boron is added by an ion implantation method or a plasma ion doping method, the acceleration voltage can be, for example, higher than or equal to 5 kV and lower than or equal to 100 kV, preferably higher than or equal to 7 kV and lower than or equal to 70 kV, further preferably higher than or equal to 10 kV and lower than or equal to 50 kV. The dosage can be, for example, greater than or equal to $1\times10^{13}$ ions/cm$^2$ and less than or equal to $1\times10^{17}$ ions/cm$^2$, preferably greater than or equal to $1\times10^{14}$ ions/cm$^2$ and less than or equal to $5\times10^{16}$ ions/cm$^2$, further preferably greater than or equal to $1\times10^{15}$ ions/cm$^2$ and less than or equal to $3\times10^{16}$ ions/cm$^2$.

In the case where phosphorus ions are added by an ion implantation method or a plasma ion doping method, the acceleration voltage can be, for example, higher than or equal to 10 kV and lower than or equal to 100 kV, preferably higher than or equal to 30 kV and lower than or equal to 90 kV, further preferably higher than or equal to 40 kV and lower than or equal to 80 kV. The dosage can be, for example, greater than or equal to $1\times10^{13}$ ions/cm$^2$ and less than or equal to $1\times10^{17}$ ions/cm$^2$, preferably greater than or equal to $1\times10^{14}$ ions/cm$^2$ and less than or equal to $5\times10^{16}$ ions/cm$^2$, further preferably greater than or equal to $1\times10^{15}$ ions/cm$^2$ and less than or equal to $3\times10^{16}$ ions/cm$^2$.

In one embodiment of the present invention, the first element 140 can be supplied to the semiconductor layer 108 through the insulating layer 110 and the insulating layer 118a. Thus, even in the case where the semiconductor layer 108 has crystallinity, damage on the semiconductor layer 108 is reduced at the time of supplying the first element 140, and degradation of crystallinity can be inhibited. Therefore, this is suitable for the case where a reduction in crystallinity increases electric resistance.

Although the manufacturing method in which the first element 140 is supplied to the semiconductor layer 108 after the formation of the insulating layer 118a is described here, one embodiment of the present invention is not limited thereto. The first element 140 may be supplied to the semiconductor layer 108 before the formation of the insulating layer 118a. Moreover, the first element 140 may be supplied to the semiconductor layer 108 after the formation of the insulating layer 118b.

Figure 18C:
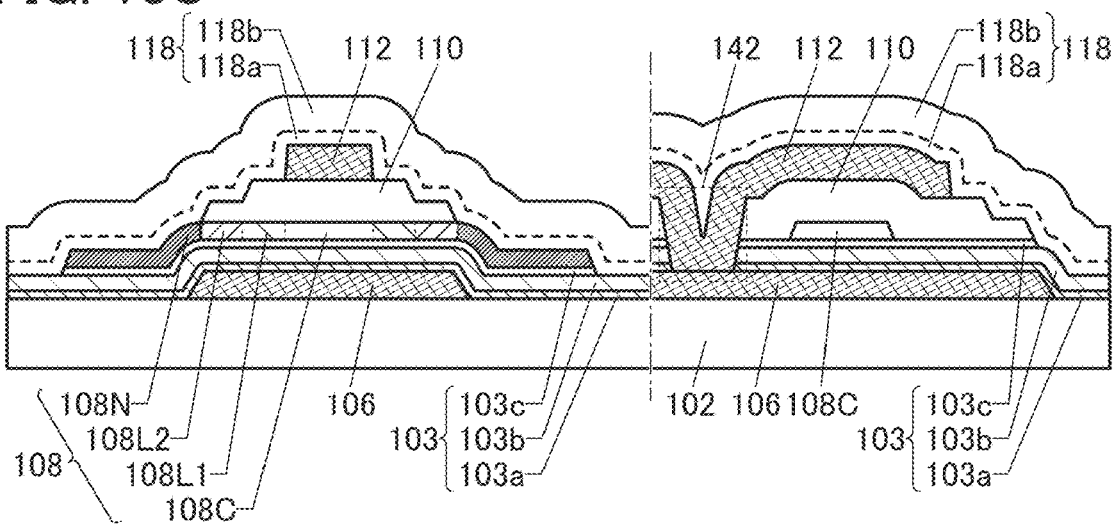

Next, the insulating layer 118b is formed to cover the insulating layer 118a (FIG. 18C).

With the use of a plasma CVD apparatus for the formation of the insulating layer 118a, the supply of the first element 140, and the formation of the insulating layer 118b, these steps can be successively performed. The successive processings in the plasma CVD apparatus can suppress attachment of impurities to the interface between the insulating layer 118a and the insulating layer 118b. Moreover, the productivity of the semiconductor device can be increased.

When the insulating layer 118 is formed by a plasma CVD method at a too high deposition temperature, some impurities contained in the regions 108N and the like might be diffused into a peripheral portion including the region 108C. As a result, the resistance of the region 108C might be lowered, and the resistance of the regions 108N might be increased, for example. The deposition temperature of the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. By forming the insulating layer 118 at low temperatures, even a transistor with a short channel length can have favorable electrical characteristics.

Heat treatment may be performed after the formation of the insulating layer 118.

[Formation of Opening Portion 141a and Opening Portion 141b]

Next, the insulating layer 118 is partly removed to form the opening portion 141a and the opening portion 141b that reach the regions 108N.

[Formation of Conductive Layer 120a and Conductive Layer 120b]

Subsequently, a conductive film is formed over the insulating layer 118 to cover the opening portion 141a and the opening portion 141b, and the conductive film is processed, so that the conductive layer 120a and the conductive layer 120b are formed (FIG. 11A).

Through the above steps, the transistor 100C can be manufactured.

Manufacturing Method Example 2

The following description is made using, as an example, the structure including the metal oxide layer 114 between the conductive layer 112 and the insulating layer 110, which is exemplified in the transistor 100F.

The steps up to the formation of the insulating film 110f are similar to those in <Manufacturing Method Example 1>above (see FIG. 15A to FIG. 15D).

[Formation of Metal Oxide Film 114f]

Then, the metal oxide film 114f is formed to cover the insulating film 110f (FIG. 19A).

The metal oxide film 114f is a film to be the metal oxide layer 114 later. The metal oxide film 114f is preferably formed by a sputtering method in an oxygen-containing atmosphere, for example. Thus, oxygen can be supplied to the insulating film 110f at the time of forming the metal oxide film 114f.

The above description can be referred to for the case where the metal oxide film 114f is formed by a sputtering method using an oxide target containing a metal oxide similar to that in the case of the semiconductor layer 108.

As the metal oxide film 114f, a metal oxide film may be formed by a reactive sputtering method with a metal target using oxygen as a deposition gas. In the case where aluminum is used for the metal target, an aluminum oxide film can be formed.

At the time of forming the metal oxide film 114f, the proportion of the oxygen flow rate to the total flow rate of the deposition gas introduced into a deposition chamber of a deposition apparatus (the oxygen flow rate ratio) or the oxygen partial pressure in the deposition chamber is preferably higher, in which case the amount of oxygen supplied into the insulating layer 110 can be increased. The oxygen flow rate ratio or the oxygen partial pressure is, for example, higher than 0% and lower than or equal to 100%, preferably higher than or equal to 10% and lower than or equal to 100%, further preferably higher than or equal to 20% and lower than or equal to 100%, still further preferably higher than or equal to 30% and lower than or equal to 100%, yet still further preferably higher than or equal to 40% and lower than or equal to 100%. It is particularly preferred that the oxygen flow rate ratio be 100% and the oxygen partial pressure be as close to 100% as possible.

When the metal oxide film 114f is formed by a sputtering method in an oxygen-containing atmosphere in the above manner, oxygen can be supplied to the insulating film 110f and release of oxygen from the insulating film 110f can be prevented during the formation of the metal oxide film 114f. As a result, an extremely large amount of oxygen can be enclosed in the insulating film 110f. Then, by heat treatment performed later, a large amount of oxygen is supplied to the channel formation region of the semiconductor layer 108, so that oxygen vacancies in the channel formation region can be reduced, and thus the transistor can have high reliability.

The substrate temperature at the time of forming the metal oxide film 114$f$ is preferably higher than or equal to room temperature and lower than or equal to 450° C., further preferably higher than or equal to room temperature and lower than or equal to 300° C., still further preferably higher than or equal to room temperature and lower than or equal to 200° C., yet still further preferably higher than or equal to room temperature and lower than or equal to 140° C. For example, in the case where a large-sized glass substrate or a resin substrate is used as the substrate 102, the substrate temperature is preferably higher than or equal to room temperature and lower than 140° C., in which case the productivity can be increased. In addition, when the substrate temperature at the time of forming the metal oxide film 114$f$ is high, the crystallinity of the metal oxide film 114$f$ is increased and the etching rate is decreased in some cases. When the substrate temperature is low, the crystallinity of the metal oxide film 114$f$ is decreased and the etching rate is increased in some cases. The deposition temperature of the metal oxide film 114$f$ may be selected as appropriate so that the etching rate is desirable with respect to an etchant used for processing the metal oxide film 114$f$.

Oxygen may be supplied from the insulating film 110$f$ to the semiconductor layer 108 by heat treatment performed after the formation of the metal oxide film 114$f$ The heat treatment can be performed at a temperature higher than or equal to 200° C. and lower than or equal to 400° C. in an atmosphere containing one or more of nitrogen, oxygen, and a rare gas. Note that heat treatment is not necessarily performed after the formation of the metal oxide film 114$f$. The heat treatment may be performed at any stage as long as it is after the formation of the metal oxide film 114$f$. The heat treatment may also serve as heat treatment or a heat application step that is to be performed later.

[Formation of Opening Portion 142]

Then, the metal oxide film 114$f$, the insulating layer 110$f$, and the insulating layer 103 are partly removed to form the opening portion 142 reaching the conductive layer 106. Thus, the conductive layer 112 to be formed later can be electrically connected to the conductive layer 106 through the opening portion 142.

[Formation of Conductive Film 112$f$]

Next, the conductive film 112$f$ to be the conductive layer 112 is formed (FIG. 19B). The above description can be referred to for the conductive film 112$f$; thus, the detailed description thereof is omitted.

[Formation of Insulating Layer 110, Metal Oxide Layer 114, and Conductive Layer 112]

Next, a resist mask (not illustrated) is formed over the conductive film 112$f$, and the conductive film 112$f$ and the metal oxide film 114$f$ that are in a region not covered with the resist mask are removed, so that the conductive layer 112 and the metal oxide layer 114 are formed (FIG. 19C).

A wet etching method can be suitably used to form the conductive layer 112 and the metal oxide layer 114. The above description can be referred to for the wet etching method; thus, the detailed description thereof is omitted.

For the formation of the conductive layer 112 and the metal oxide layer 114, etching may be performed at least twice using different etching conditions or methods. For example, the conductive film 112$f$ and the metal oxide film 114$f$ are etched by an anisotropic etching method, and then side surfaces of the conductive film 112$f$ and the metal oxide film 114$f$ are etched by an isotropic etching method to make the end surfaces recede (also referred to as side etching). Consequently, the conductive layer 112 and the metal oxide film 114 that are positioned inward from the insulating layer 110 in a plan view can be formed.

Next, the insulating film 110$f$ in a region not covered with the resist mask is removed to form the insulating layer 110 (FIG. 19D). The above description can be referred to for the formation of the insulating layer 110; thus, the detailed description thereof is omitted.

After the formation of the insulating layer 110, the resist mask is removed.

Here, cleaning may be performed to remove impurities. The above description can be referred to for the cleaning; thus, the detailed description thereof is omitted.

The description of <Manufacturing method example 1> can be referred to for the subsequent steps including and after the formation of the insulating layer 118; thus, the details are omitted.

Through the above steps, the transistor 100F can be manufactured.

Manufacturing Method Example 3

The following description is made using, as an example, the structure including the region 108L1, the region 108L2, and the region 108L3 between the region 108N and the region 108C, which is exemplified in the transistor 100G.

The steps up to the formation of the insulating layer 110A are similar to those in <Manufacturing method example 1> above (see FIG. 15A to FIG. 15D, FIG. 16A to FIG. 16C, and FIG. 17A).

[Formation of Insulating Layer 110]

Figure 20A:
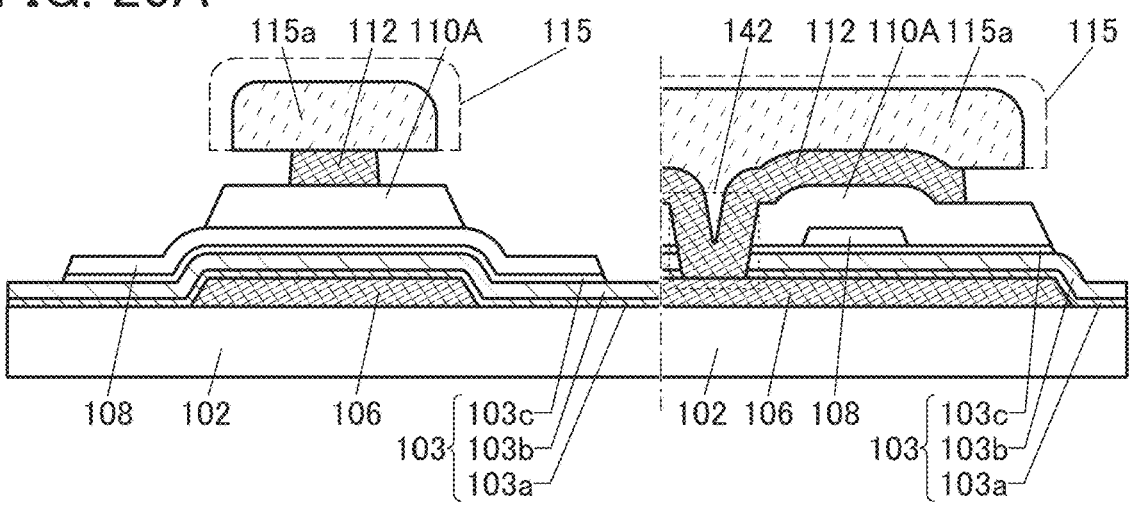
FIG. 20A, FIG. 20B, and FIG. 20C are cross-sectional views illustrating a method for manufacturing a semiconductor device.

Next, the resist mask 115 is shrunk to form the resist mask 115$a$ (FIG. 20A). FIG. 20A illustrates the resist mask 115$a$ after shrinkage, and also illustrates the resist mask 115 before shrinkage by dashed lines. The end portions of the resist mask 115$a$ are preferably positioned outward from the end portions of the conductive layer 112. That is, the end portions of the resist mask 115$a$ are preferably positioned between the end portions of the conductive layer 112 and the end portions of the insulating layer 110A.

The resist mask 115$a$ can be suitably formed by an ashing method. The thickness of the resist mask 115 may be reduced by an ashing method at the same time as a reduction in the area of the resist mask 115 in a plan view.

Figure 20B:
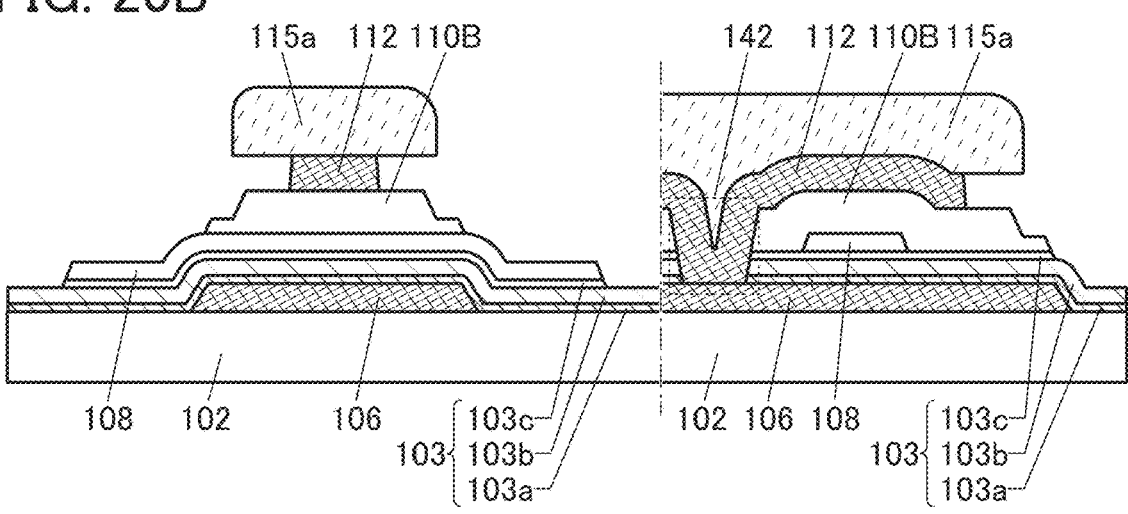

Next, an upper portion of the insulating layer 110A in a region not covered with the resist mask 115$a$ is partly removed to form an insulating layer 110B (FIG. 20B). Anisotropic etching is preferably used to form the insulating layer 110B. In particular, a dry etching method can be suitably used.

Figure 20C:
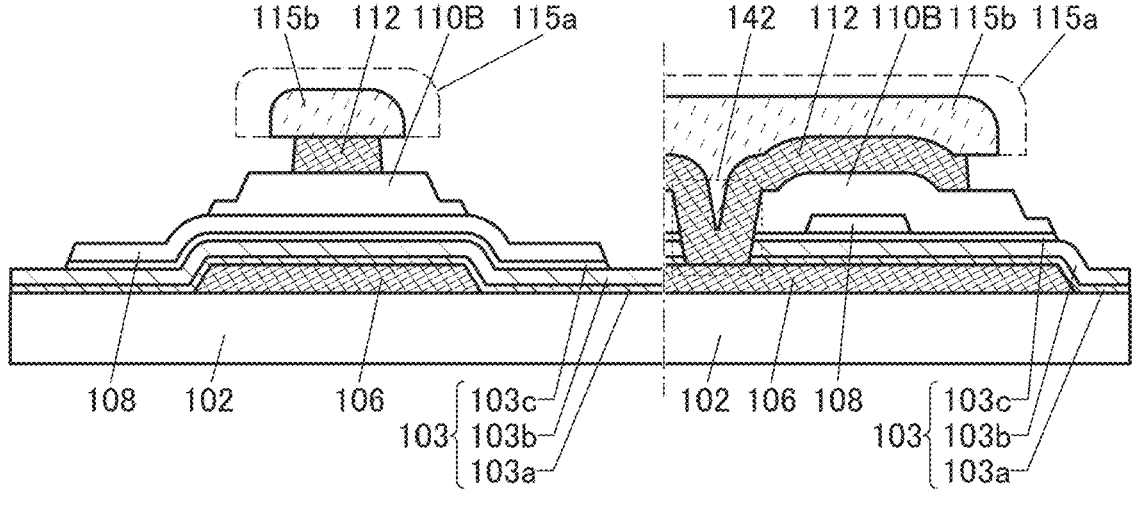

Next, the resist mask 115$a$ is shrunk to form a resist mask 115$b$ (FIG. 20C). FIG. 20C illustrates the resist mask 115$b$ after shrinkage, and also illustrates the resist mask 115$a$ before shrinkage by dashed lines. End portions of the resist mask 115$b$ are preferably positioned outward from the end portions of the conductive layer 112. That is, the end portions of the resist mask 115$b$ are preferably positioned between the end portions of the conductive layer 112 and end portions of the insulating layer 110B.

The resist mask 115$b$ can be suitably formed by an ashing method. The thickness of the resist mask 115$a$ may be reduced by an ashing method at the same time as a reduction in the area of the resist mask 115$a$ in a plan view.

Figure 21:
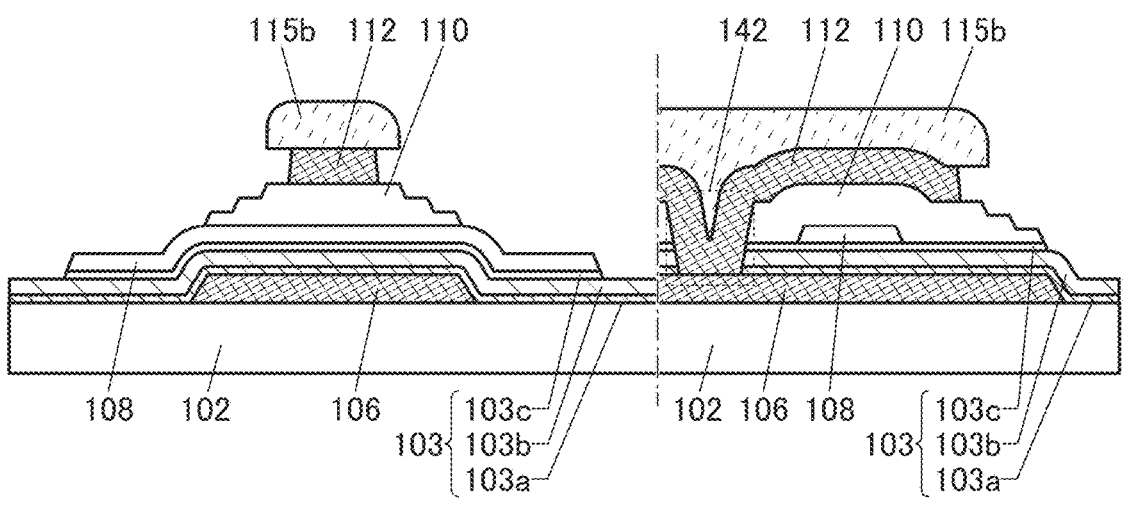
FIG. 21 is a cross-sectional view illustrating a method for manufacturing a semiconductor device.

Next, an upper portion of the insulating layer 110B in a region not covered with the resist mask 115$b$ is partly removed to form the insulating layer 110 (FIG. 21). Anisotropic etching is preferably used to form the insulating layer 110. In particular, a dry etching method can be suitably used.

Adjusting the shrinkage of the resist mask 115 and the resist mask 115*a* allows the width L1 of the region 108L1, the width L2 of the region 108L2, and the width L3 of the region 108L3 to be controlled.

After the formation of the insulating layer 110, the resist mask 115*b* is removed.

Here, cleaning may be performed to remove impurities. The above description can be referred to for the cleaning; thus, the detailed description thereof is omitted.

The description of <Manufacturing method example 1> can be referred to for the subsequent steps including and after the formation of the insulating layer 118; thus, the details are omitted.

Through the above steps, the transistor 100G can be manufactured.

<Components of Semiconductor Device>

Next, components of the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates on which a semiconductor element is provided may be used as the substrate 102.

A flexible substrate may be used as the substrate 102, and the transistor 100 and the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

[Insulating Layer 103]

The insulating layer 103 can be formed by a sputtering method, a CVD method, an evaporation method, a pulsed laser deposition (PLD) method, or the like as appropriate. For example, the insulating layer 103 can be formed using a single layer or stacked layers of an oxide insulating film, an oxynitride insulating film, a nitride oxide insulating film, or a nitride insulating film. To improve the properties of the interface with the semiconductor layer 108, at least a region of the insulating layer 103 that is in contact with the semiconductor layer 108 is preferably formed using an oxide insulating film or an oxynitride film. The insulating layer 103 is preferably formed using a film from which oxygen is released by heating.

For example, a single layer or stacked layers using silicon oxide, silicon oxynitride, silicon nitride oxide, silicon nitride, aluminum oxide, hafnium oxide, gallium oxide, a Ga—Zn oxide, or the like can be provided as the insulating layer 103.

In the case where a film other than an oxide film or an oxynitride film, e.g., a silicon nitride film, is used for the side of the insulating layer 103 that is in contact with the semiconductor layer 108, pretreatment such as oxygen plasma treatment is preferably performed on the surface in contact with the semiconductor layer 108 to oxidize the surface or the vicinity of the surface.

[Conductive Film]

The conductive layer 106, the conductive layer 120*a* functioning as one of the source electrode and the drain electrode, and the conductive layer 120*b* functioning as the other of the source electrode and the drain electrode can each be formed using a metal element selected from chromium, copper, aluminum, gold, silver, zinc, molybdenum, tantalum, titanium, tungsten, manganese, nickel, iron, and cobalt; an alloy containing the metal element as its component; an alloy including a combination of the metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used for the conductive layer 106, the conductive layer 120*a*, and the conductive layer 120*b*.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive layer 106 and the like may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Among the above metal elements, it is particularly preferable that any one or more selected from titanium, tungsten, tantalum, and molybdenum be included in the conductive layer 106, the conductive layer 120*a*, and the conductive layer 120*b*. It is particularly preferable to use a tantalum nitride film. Since the tantalum nitride film has conductivity and a high barrier property against copper, oxygen, or hydrogen and releases little hydrogen from itself, it can be suitably used as the conductive film in contact with the semiconductor layer 108 or the conductive film in the vicinity of the semiconductor layer 108.

[Insulating Layer 110]

The insulating layer 110 functioning as the gate insulating film of the transistor 100 and the like can be formed by a PECVD method, a sputtering method, or the like. For the insulating layer 110, an insulating layer including one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

The insulating layer 110 that is in contact with the semiconductor layer 108 is preferably an oxide insulating film or an oxynitride film and further preferably includes a region containing oxygen in excess of that in the stoichiometric composition. In other words, the insulating layer 110 is an insulating film capable of releasing oxygen. It is also possible to supply oxygen into the insulating layer 110 by forming the insulating layer 110 in an oxygen atmosphere, performing heat treatment on the formed insulating layer 110 in an oxygen atmosphere, performing plasma treatment or the like on the formed insulating layer 110 in an oxygen atmosphere, or forming an oxide film or an oxynitride film over the insulating layer 110 in an oxygen atmosphere, for example. Note that an oxidizing gas (e.g., dinitrogen monoxide or ozone) may be used instead of oxygen or in addition to oxygen in each of the above treatments for supplying oxygen.

For the insulating layer 110, a material having a higher dielectric constant than silicon oxide or silicon oxynitride, such as hafnium oxide, can also be used. In that case, the insulating layer 110 can be thick, and leakage current due to tunnel current can be inhibited. In particular, hafnium oxide having crystallinity is preferable because it has a higher dielectric constant than amorphous hafnium oxide.

[Semiconductor Layer]

In the case where the semiconductor layer 108 is an In-M-Zn oxide, a sputtering target used for forming the In-M-Zn oxide preferably has the atomic ratio of In to the element M higher than or equal to 1. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer 108 having crystallinity is easily formed. Note that the atomic ratio in the formed semiconductor layer 108 may vary in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the formed semiconductor layer 108 is sometimes in the neighborhood of In:Ga:Zn=4:2:3 [atomic ratio].

Note that when the atomic ratio is described as In:Ga:Zn=4:2:3 or in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or in the neighborhood thereof, the case is included where Ga is greater than 0.1 and less than or equal to 2 and Zn is greater than 0.1 and less than or equal to 2 with In being 1.

The energy gap of the semiconductor layer 108 is 2 eV or more, preferably 2.5 eV or more. With the use of such a metal oxide having a wider energy gap than silicon, the off-state current of the transistor can be reduced.

A metal oxide with a low carrier concentration is preferably used for the semiconductor layer 108. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in the metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In some cases, bonding of part of hydrogen to oxygen bonded to a metal atom generates electrons serving as carriers. Thus, a transistor using a metal oxide containing much hydrogen is likely to have normally-on characteristics.

A defect that is an oxygen vacancy into which hydrogen has entered can function as a donor of the metal oxide. However, it is difficult to evaluate the defects quantitatively. Thus, the metal oxide is evaluated by carrier concentration, not by donor concentration, in some cases. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, hydrogen in the metal oxide is preferably reduced as much as possible. Specifically, the hydrogen concentration of the metal oxide obtained by secondary ion mass spectrometry (SIMS) is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

The carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

The semiconductor layer 108 preferably has a non-single-crystal structure. The non-single-crystal structure includes, for example, a CAAC structure which is described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) is described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including a CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

In an image obtained with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image of the nc-OS film observed with a TEM, for example, a crystal grain boundary cannot be clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, the nc-OS film cannot be distinguished from an amorphous oxide semiconductor film by some analysis methods. For example, when the nc-OS film is subjected to structural analysis by an out-of-plane method with an XRD apparatus using an X-ray having a diameter larger than the diameter of a crystal part, a peak indicating a crystal plane does not appear. Furthermore, a diffraction pattern like a halo pattern is observed when the nc-OS film is subjected to electron diffraction using an electron beam with a probe diameter (e.g., 50 nm or larger) that is larger than the diameter of a crystal part (also referred to as selected-area electron diffraction). Meanwhile, in some cases, a circular (ring-like) region with high luminance is observed and a plurality of spots are observed in the region when the nc-OS film is subjected to electron diffraction using an electron beam with a probe diameter (e.g., 1 nm or larger and 30 nm or smaller) close to or smaller than the size of a crystal part (also referred to as nanobeam electron diffraction).

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier concentration and higher electron mobility than the CAAC-OS film in some cases. Accordingly, a transistor using the nc-OS film may have high field-effect mobility.

The nc-OS film can be formed at a lower oxygen flow rate ratio in deposition than the CAAC-OS film. The nc-OS film can also be formed at a lower substrate temperature in deposition than the CAAC-OS film. For example, the nc-OS film can be formed at a relatively low substrate temperature (e.g., a temperature of 130° C. or lower) or without heating of the substrate and thus is suitable for the case of using a large-sized glass substrate, a resin substrate, or the like, and productivity can be increased.

An example of a crystal structure of a metal oxide is described. Note that a metal oxide formed by a sputtering method using an In—Ga—Zn oxide target (In:Ga:Zn=4:2: 4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated.

<Composition of Metal Oxide>

The composition of a CAC (Cloud-Aligned Composite)-OS that can be used in a transistor disclosed in one embodiment of the present invention will be described below.

Note that in this specification and the like, CAAC (c-axis aligned crystal) and CAC (Cloud-Aligned Composite) may be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

The above is the description of the components.

At least part of this embodiment can be implemented in appropriate combination with the other embodiments described in this specification.

Embodiment 2

In this embodiment, an example of a display device that includes the transistor exemplified in the above embodiment will be described.

Structure Example

FIG. 22A is a top view of a display device 700. The display device 700 includes a first substrate 701 and a second substrate 705 that are bonded to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be in the form of an IC chip obtained by packaging a circuit portion formed separately on a semiconductor substrate or the like. The IC chips can be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. Examples of the light-emitting element include self-luminous light-emitting elements such as an LED (Light Emitting Diode), an OLED (Organic LED), a QLED (Quantum-dot LED), and a semiconductor laser. It is also possible to use, for example, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like.

A display device 700A illustrated in FIG. 22B is an example of a display device that includes a flexible resin layer 743 instead of the first substrate 701 and can be used as a flexible display.

In the display device 700A, the pixel portion 702 does not have a rectangular shape but has arc-shaped corner portions. The display device 700A includes a notch portion in which part of the pixel portion 702 and part of the resin layer 743 are cut as shown in a region P1 in FIG. 22B. A pair of gate driver circuit portions 706 is provided on the opposite sides with the pixel portion 702 therebetween. The gate driver circuit portions 706 are provided along a curved outline at the corners of the pixel portion 702.

The resin layer 743 has a protrusion where the FPC terminal portion 708 is provided. Furthermore, part of the resin layer 743 that includes the FPC terminal portion 708 can be bent backward in a region P2 in FIG. 22B. When part of the resin layer 743 is bent backward, the display device 700A can be mounted on an electronic device with the FPC 716 overlapping with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can be configured to include at least one of a protection circuit, a buffer circuit, a demultiplexer circuit, and the like.

A display device 700B illustrated in FIG. 22C is a display device that can be suitably used for an electronic device with a large screen. For example, the display device 700B can be suitably used for a television device, a monitor device, a personal computer (including a laptop type and a desktop type), a tablet terminal, digital signage, and the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

Meanwhile, the gate driver circuit portions 722 are provided over the first substrate 701. Thus, an electronic device with a narrow bezel can be achieved.

With such a structure, a large-size and high-resolution display device can be achieved. For example, a display device with a screen diagonal of 30 inches or more, 40 inches or more, 50 inches or more, or 60 inches or more can be achieved. Furthermore, a display device with extremely high resolution such as 4K2K or 8K4K can be achieved.

Cross-Sectional Structure Example

Figure 23:
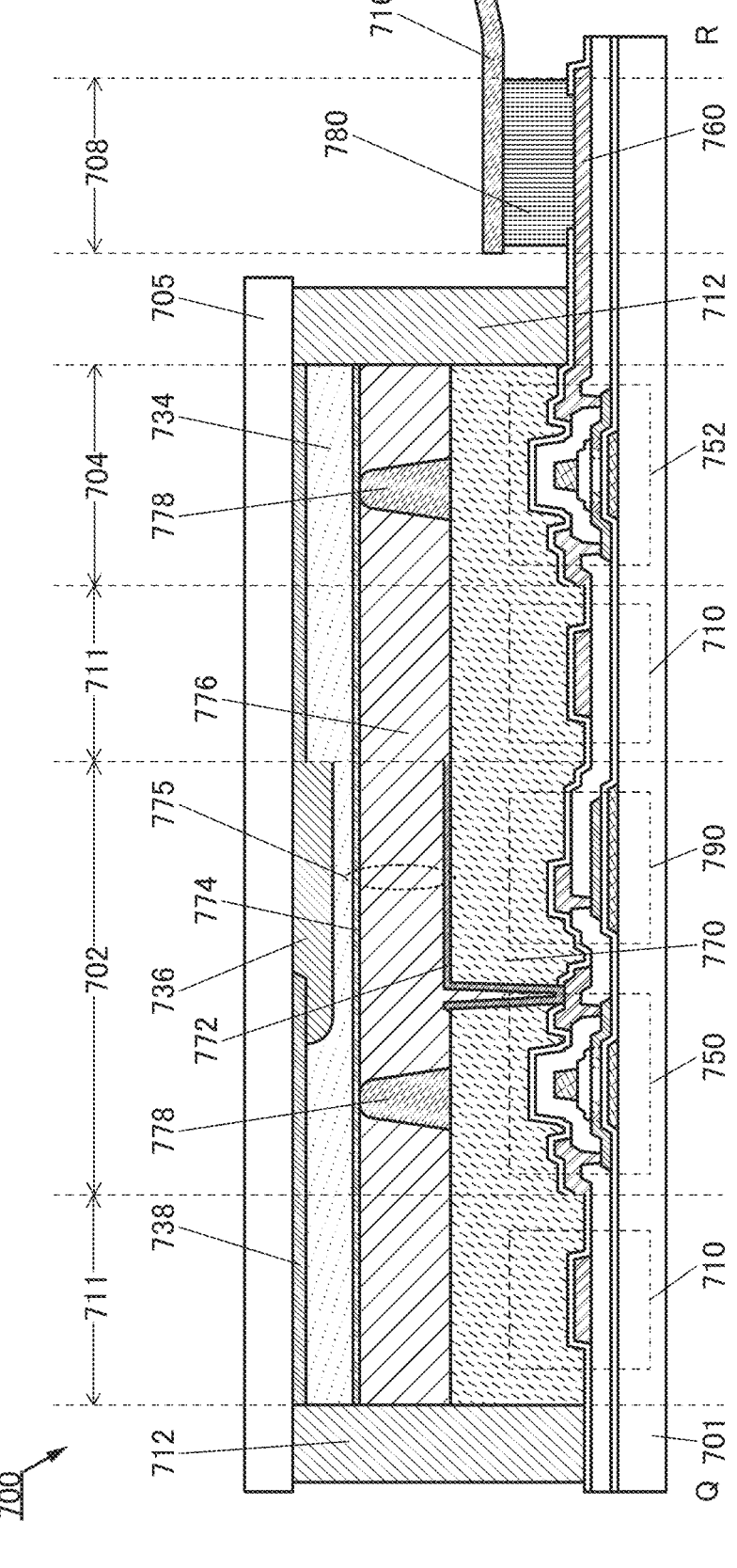
FIG. 23 is a cross-sectional view of a display device.
Figure 24:
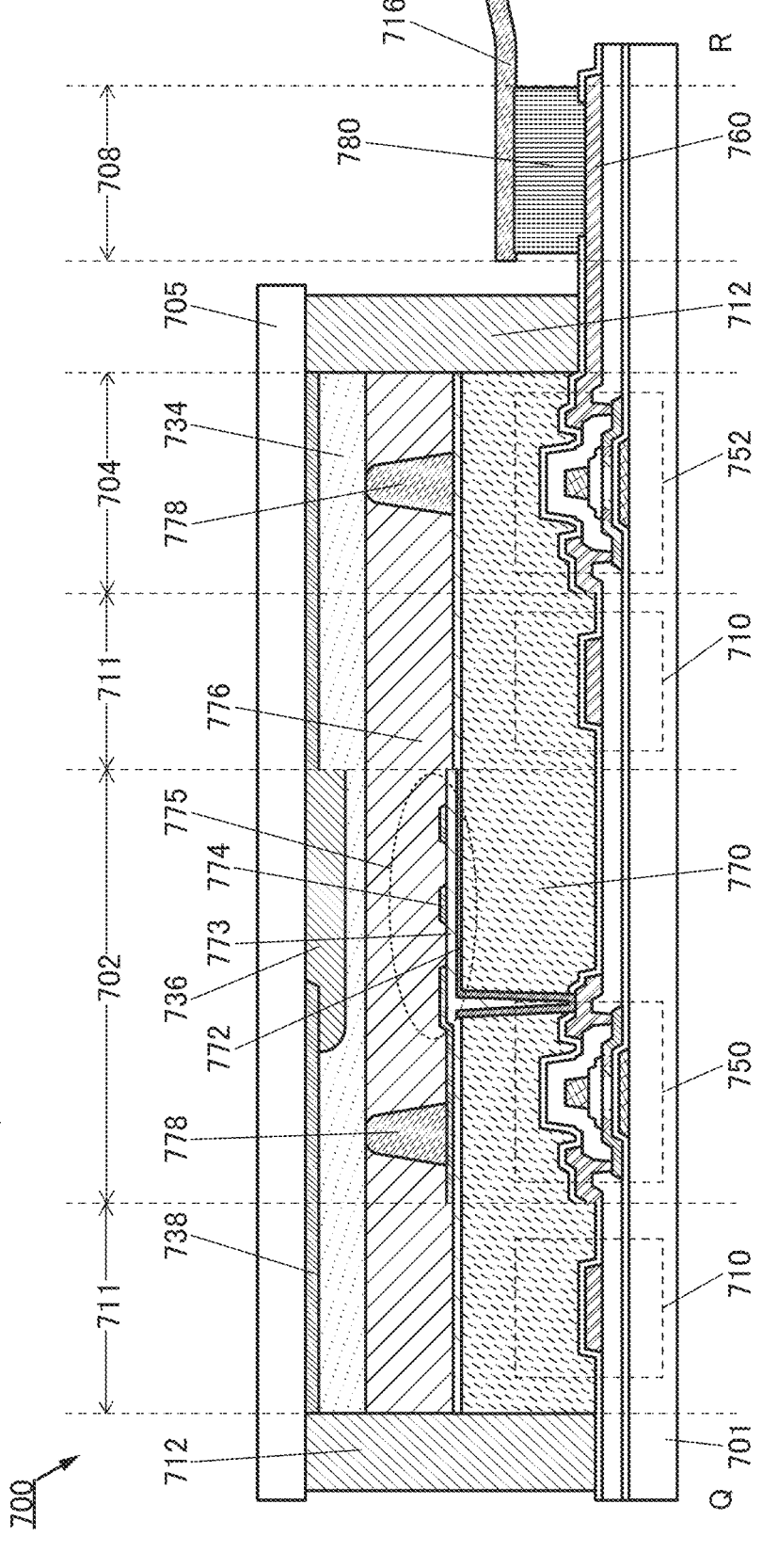
FIG. 24 is a cross-sectional view of a display device.
Figure 25:
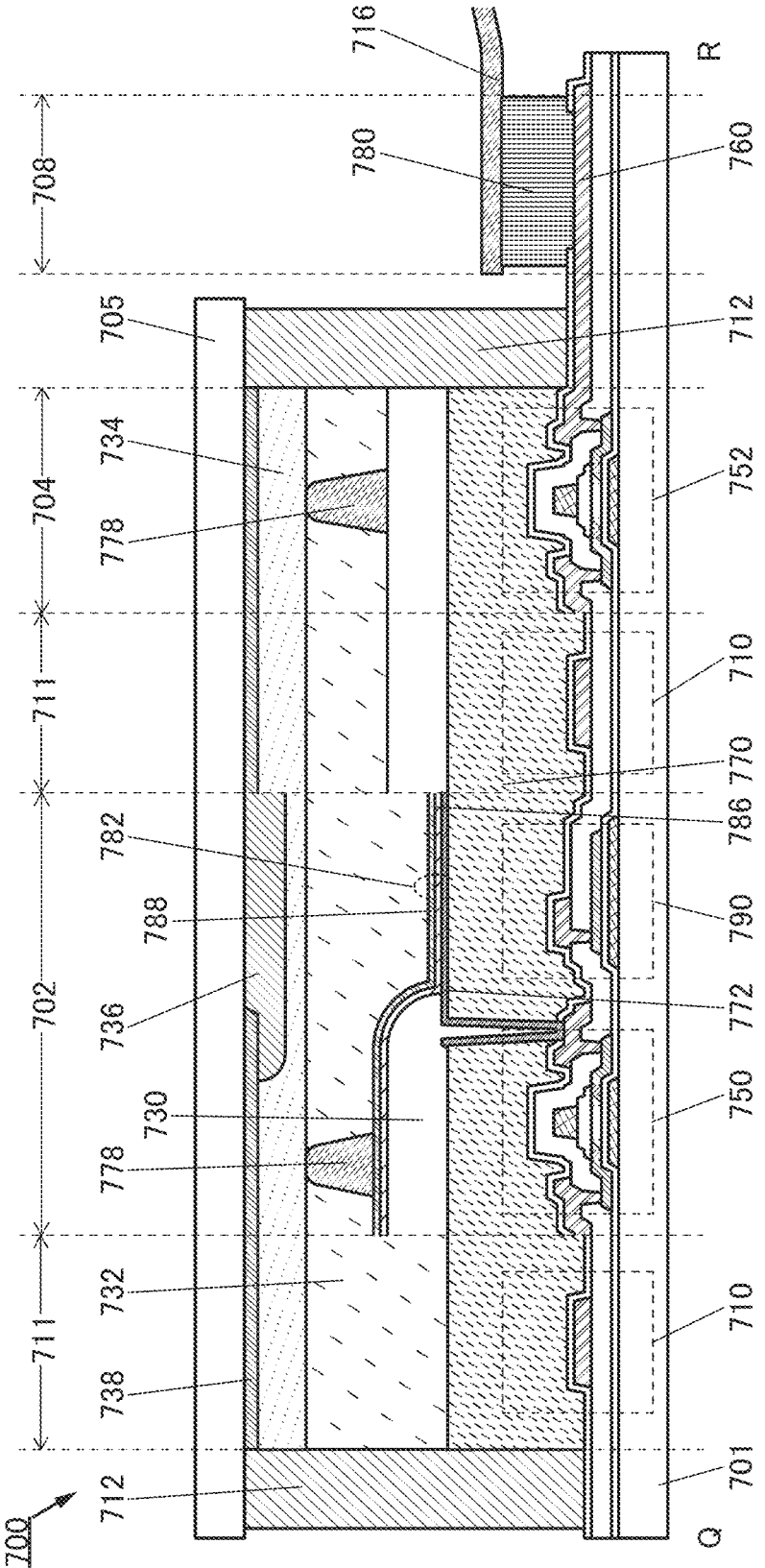
FIG. 25 is a cross-sectional view of a display device.
Figure 26:
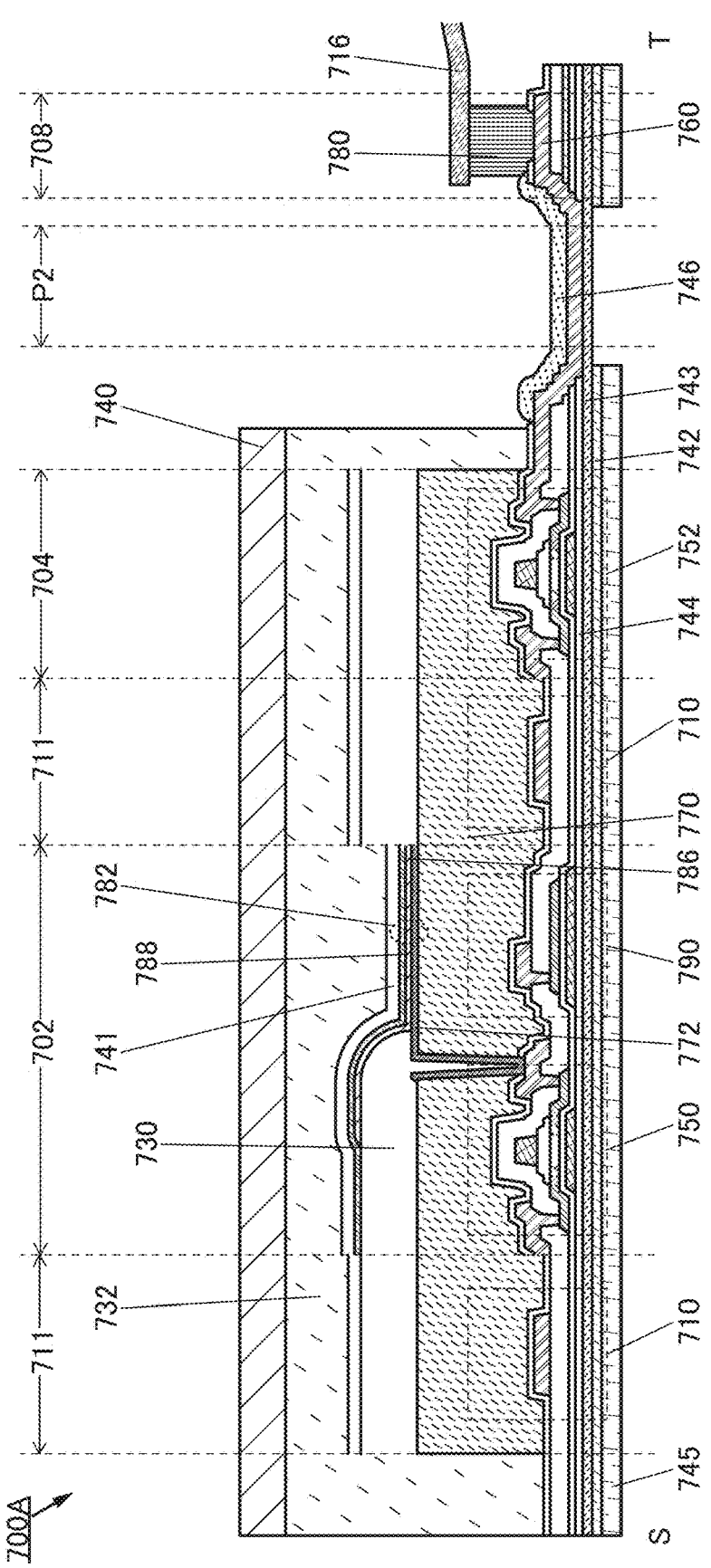
FIG. 26 is a cross-sectional view of a display device.

Structures using a liquid crystal element or an EL element as a display element are described below with reference to FIG. 23 to FIG. 26. Note that FIG. 23 to FIG. 25 are cross-sectional views along the dashed-dotted line Q-R in FIG. 22A. FIG. 26 is a cross-sectional view along the dashed-dotted line S-T in the display device 700A in FIG. 22B. FIG. 23 and FIG. 24 each illustrate a structure using a liquid crystal element as a display element, and FIG. 25 and FIG. 26 each illustrate a structure using an EL element.

[Description of Common Portions in Display Devices]

Display devices illustrated in FIG. 23 to FIG. 26 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 24 shows the case where the capacitor 790 is not provided.

The transistors exemplified in Embodiment 1 can be used as the transistor 750 and the transistor 752.

The transistor used in this embodiment includes a highly purified oxide semiconductor film in which formation of oxygen vacancies is suppressed. Such a transistor can have a low off-state current. Accordingly, an electric signal such as an image signal can be retained for a longer period, and the interval between writes of an image signal and the like can be set longer. As a result, the frequency of refresh operations can be reduced, resulting in an effect of reducing power consumption.

The transistor used in this embodiment can have comparatively high field-effect mobility and thus is capable of high-speed operation. For example, with the use of such a transistor capable of high-speed operation for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, when transistors capable of high-speed operation are used also in the pixel portion, a high-quality image can be provided.

The capacitor 790 illustrated in each of FIG. 23, FIG. 25, and FIG. 26 includes a lower electrode formed by processing the same film as a first gate electrode of the transistor 750 and an upper electrode formed by processing the same metal oxide as the semiconductor layer. The resistance of the upper electrode is reduced as that of a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

The transistor 750 included in the pixel portion 702 and the transistor 752 included in the source driver circuit portion 704 may have different structures. For example, a top-gate transistor may be used as one of the transistors and a bottom-gate transistor may be used as the other. Note that the same can be said for the gate driver circuit portion 706, as the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

On the second substrate 705 side, a light-blocking film 738, a coloring film 736, and an insulating film 734 that is in contact with these films are provided.

[Structure Example of Display Device using Liquid Crystal Element]

The display device 700 illustrated in FIG. 23 includes a liquid crystal element 775 and a spacer 778. The liquid crystal element 775 includes a conductive layer 772, a conductive layer 774, and a liquid crystal layer 776 positioned therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As the light-transmitting material, for example, an oxide material containing indium, zinc, tin, or the like is preferably used. As the reflective material, for example, a material containing aluminum, silver, or the like is preferably used.

When a reflective material is used for the conductive layer 772, the display device 700 is a reflective liquid crystal display device. Meanwhile, when a light-transmitting material is used for the conductive layer 772, the display device 700 is a transmissive liquid crystal display device. In the case of a reflective liquid crystal display device, a polarizing plate is provided on the viewer side. On the other hand, in the case of a transmissive liquid crystal display device, a pair of polarizing plates is provided such that the liquid crystal element is sandwiched therebetween.

The display device 700 illustrated in FIG. 24 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 24, a storage capacitor can be formed with a stacked-layer structure of the conductive layer 774, the insulating layer 773, and the conductive layer 772. Thus, another capacitor need not be provided, and thus the aperture ratio can be increased.

Although not illustrated in FIG. 23 and FIG. 24, an alignment film in contact with the liquid crystal layer 776 may be provided. An optical member (an optical substrate) such as a polarizing member, a retardation member, or an anti-reflection member and a light source such as a backlight or a side light can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case of employing a horizontal electric field mode, a liquid crystal exhibiting a blue phase for which an alignment film is not used may be used.

The mode of the liquid crystal element can be a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

A scattering liquid crystal employing a polymer dispersed liquid crystal, a polymer network liquid crystal, or the like can be used for the liquid crystal layer 776. In this case, monochrome image display may be performed without providing the coloring film 736, or color display may be performed using the coloring film 736.

As a method for driving the liquid crystal element, a time-division display method (also referred to as a field-sequential driving method) by which color display is performed by a successive additive color mixing method may be used. In that case, a structure without the coloring film 736 can be employed. In the case where the time-division display method is employed, advantages such as an increase in the aperture ratio of pixels and an increase in definition can be obtained because it is not necessary to provide subpixels that emit light of, for example, R (red), G (green), and B (blue).

[Display Device Using Light-Emitting Element]

The display device 700 illustrated in FIG. 25 includes a light-emitting element 782. The light-emitting element 782 includes the conductive layer 772, an EL layer 786, and a conductive film 788. The EL layer 786 includes an organic compound or an inorganic compound such as quantum dots.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material.

In the display device 700 illustrated in FIG. 25, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided at a position overlapping with the light-emitting element 782, and the light-blocking film 738 is provided at a position overlapping with the insulating film 730 and in the lead wiring portion 711 and the source driver circuit portion 704. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by a side-by-side method.

FIG. 26 illustrates a structure of a display device suitably applicable to a flexible display. FIG. 26 is a cross-sectional view along the dashed-dotted line S—T in the display device 700A illustrated in FIG. 22B.

The display device 700A illustrated in FIG. 26 has a structure in which a support substrate 745, a bonding layer 742, the resin layer 743, and an insulating layer 744 are stacked instead of the first substrate 701 in FIG. 25. The transistor 750, the capacitor 790, and the like are provided over the insulating layer 744 over the resin layer 743.

The support substrate 745 includes an organic resin, glass, or the like and is thin enough to have flexibility. The resin layer 743 is a layer including an organic resin such as polyimide or acrylic. The insulating layer 744 includes an inorganic insulating film of silicon oxide, silicon oxynitride, silicon nitride, or the like. The resin layer 743 and the support substrate 745 are bonded to each other with the bonding layer 742. The resin layer 743 is preferably thinner than the support substrate 745.

The display device 700 illustrated in FIG. 26 includes a protective layer 740 instead of the second substrate 705 in FIG. 25. The protective layer 740 is bonded to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided in an island shape over the insulating film 730 and the conductive layer 772. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. It is further preferable to employ a stacked-layer structure including one or more inorganic insulating films and one or more organic insulating films.

FIG. 26 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When the region P2 that can be bent has a structure in which an inorganic insulating film is not provided as much as possible and has a structure in which only a conductive layer containing a metal or an alloy and a layer containing an organic material are stacked, a crack can be prevented from being caused at the time of bending. When the support substrate 745 is not provided in the region P2, part of the display device 700A can be bent with an extremely small radius of curvature.

[Structure Example of Display Device Provided with Input Device]

An input device may be provided in the display devices illustrated in FIG. 23 to FIG. 26. An example of the input device includes a touch sensor.

A variety of types such as a capacitive type, a resistive type, a surface acoustic wave type, an infrared type, an optical type, and a pressure-sensitive type can be used as the sensor type, for example. Alternatively, two or more of these types may be used in combination.

Examples of a touch panel structure include what is called an in-cell touch panel in which an input device is formed between a pair of substrates, what is called an on-cell touch panel in which an input device is formed over a display device, and what is called an out-cell touch panel in which an input device is attached to a display device.

At least part of the structure examples, the drawings corresponding thereto, and the like exemplified in this embodiment can be implemented in combination with the other structure examples, the other drawings, and the like as appropriate.

At least part of this embodiment can be implemented in appropriate combination with the other embodiments described in this specification.

Embodiment 3

In this embodiment, a display device that includes the semiconductor device of one embodiment of the present invention will be described with reference to FIG. 27.

Figure 27A:
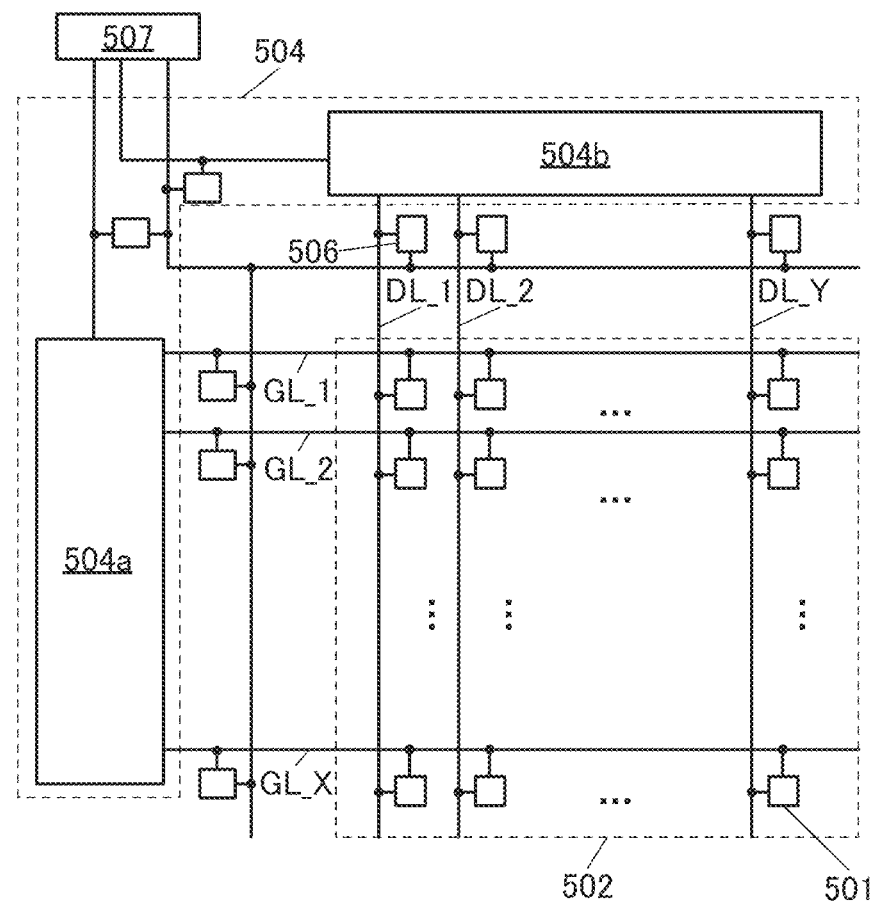
FIG. 27A is a block diagram of a display device.

A display device illustrated in FIG. 27A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scan signal to gate lines GL_1 to GL_X and a source driver 504b that supplies a data signal to data lines DL_1 to DL_Y. The gate driver 504a includes at least a shift register. The source driver 504b is configured using a plurality of analog switches, for example. Alternatively, the source driver 504b may be configured using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 27A is connected to a variety of wirings such as the gate lines GL_1 to GL_X that are wirings between the gate driver 504a and the pixel circuits 501 and the data lines DL_1 to DL_Y that are wirings between the source driver 504b and the pixel circuits 501, for example.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

Figure 27B:
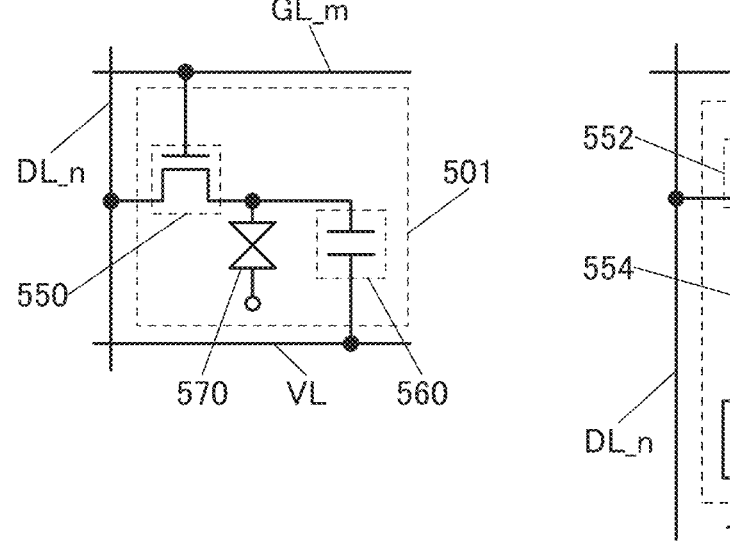
FIG. 27B and FIG. 27C are circuit diagrams of the display device.
Figure 27C:
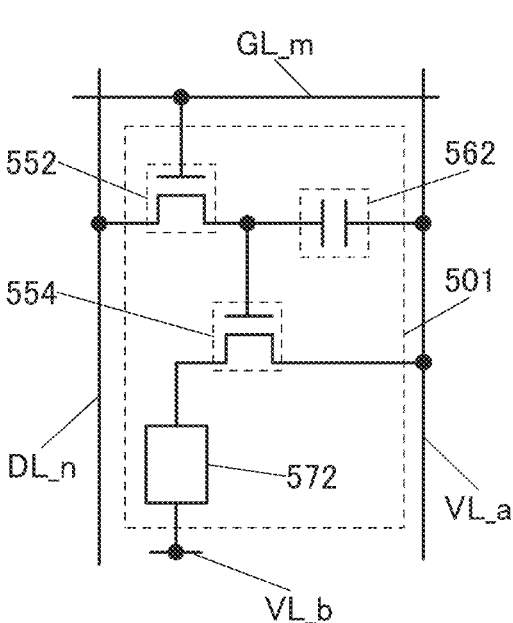

The plurality of pixel circuits 501 illustrated in FIG. 27A can have a structure illustrated in FIG. 27B or FIG. 27C, for example.

The pixel circuit 501 illustrated in FIG. 27B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set as appropriate in accordance with the specifications of the pixel circuit 501. The alignment state in the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 27C includes a transistor 552, a transistor 554, a capacitor 562, and a light-emitting element 572. The data line DL_n, the gate line GL_m, a potential supply line VL_a, a potential supply line VL_b, and the like are connected to the pixel circuit 501.

Note that a high power supply potential (VDD) is supplied to one of the potential supply line VL_a and the potential supply line VL_b, and a low power supply potential (VSS) is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in appropriate combination with the other embodiments described in this specification.

Embodiment 4

A pixel circuit including a memory for correcting gray levels displayed by pixels and a display device including the pixel circuit will be described below. The transistor described in Embodiment 1 can be used as a transistor used in the pixel circuit described below.

<Circuit Structure>

Figure 28A:
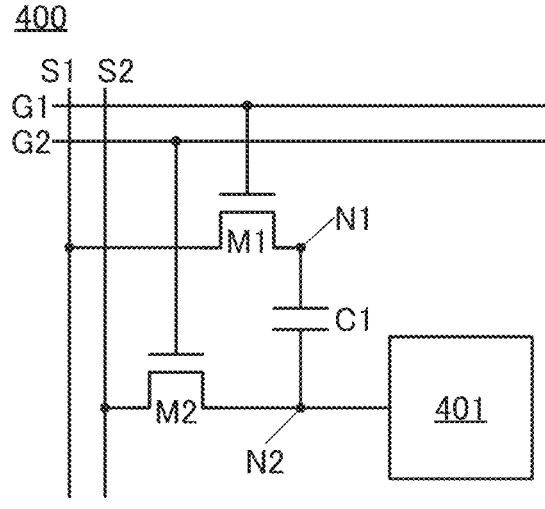
FIG. 28A, FIG. 28C, and FIG. 28D are circuit diagrams of display devices.

FIG. 28A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node that connects the transistor M1 and the capacitor C1 is denoted as a node N1, and a node that connects the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

<Operation Method Example>

Figure 28B:
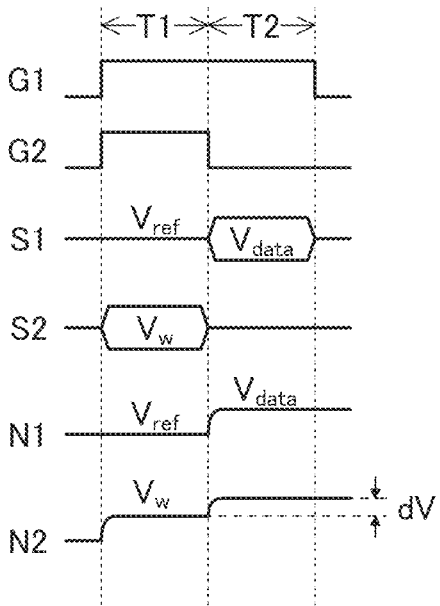
FIG. 28B is a timing chart for the display device.

Next, an example of a method for operating the pixel circuit 400 is described with reference to FIG. 28B. FIG. 28B is a timing chart of the operation of the pixel circuit 400. Note that for simplification of description, the influence of various kinds of resistance such as wiring resistance, parasitic capacitance of a transistor, a wiring, and the like, the threshold voltage of the transistor, and the like is not taken into account here.

In the operation shown in FIG. 28B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Thus, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 by a potential dV in accordance with the second data potential $V_{data}$. That is, a potential that is the sum of the first data potential $V_w$ and the potential dV is input to the circuit 401. Note that although dV is shown as a positive value in FIG. 28B, dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high dynamic range (HDR) display or the like can be performed. In the case of using a liquid crystal element, overdriving or the like can be achieved.

Application Examples

[Example using Liquid Crystal Element]

Figure 28C:
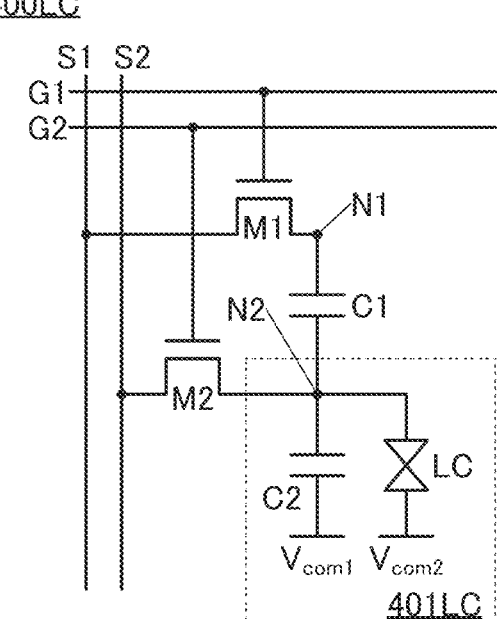

A pixel circuit 400LC illustrated in FIG. 28C includes a circuit 401LC. The circuit 401LC includes a liquid crystal element LC and a capacitor C2.

In the liquid crystal element LC, one electrode is connected to the other electrode of the capacitor C1, the other of the source and the drain of the transistor M2, and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example using Light-Emitting Element]

Figure 28D:
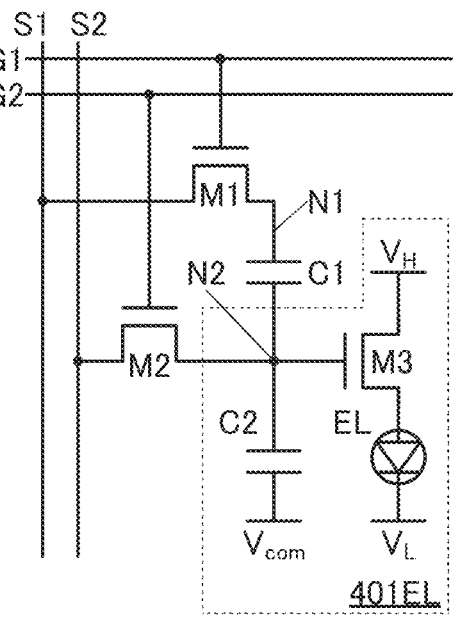

A pixel circuit 400EL illustrated in FIG. 28D includes a circuit 401EL. The circuit 401EL includes a light-emitting element EL, a transistor M3, and the capacitor C2.

In the transistor M3, a gate is connected to one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, variations in the electrical characteristics of the transistor M3 and the light-emitting element EL can be corrected by supply of a correction signal to the wiring S1 or the wiring S2.

Note that the structure is not limited to the circuits illustrated in FIG. 28C and FIG. 28D, and a structure to which a transistor, a capacitor, or the like is further added may be employed.

At least part of this embodiment can be implemented in appropriate combination with the other embodiments described in this specification.

Embodiment 5

In this embodiment, a display module that can be fabricated using one embodiment of the present invention will be described.

Figure 29A:
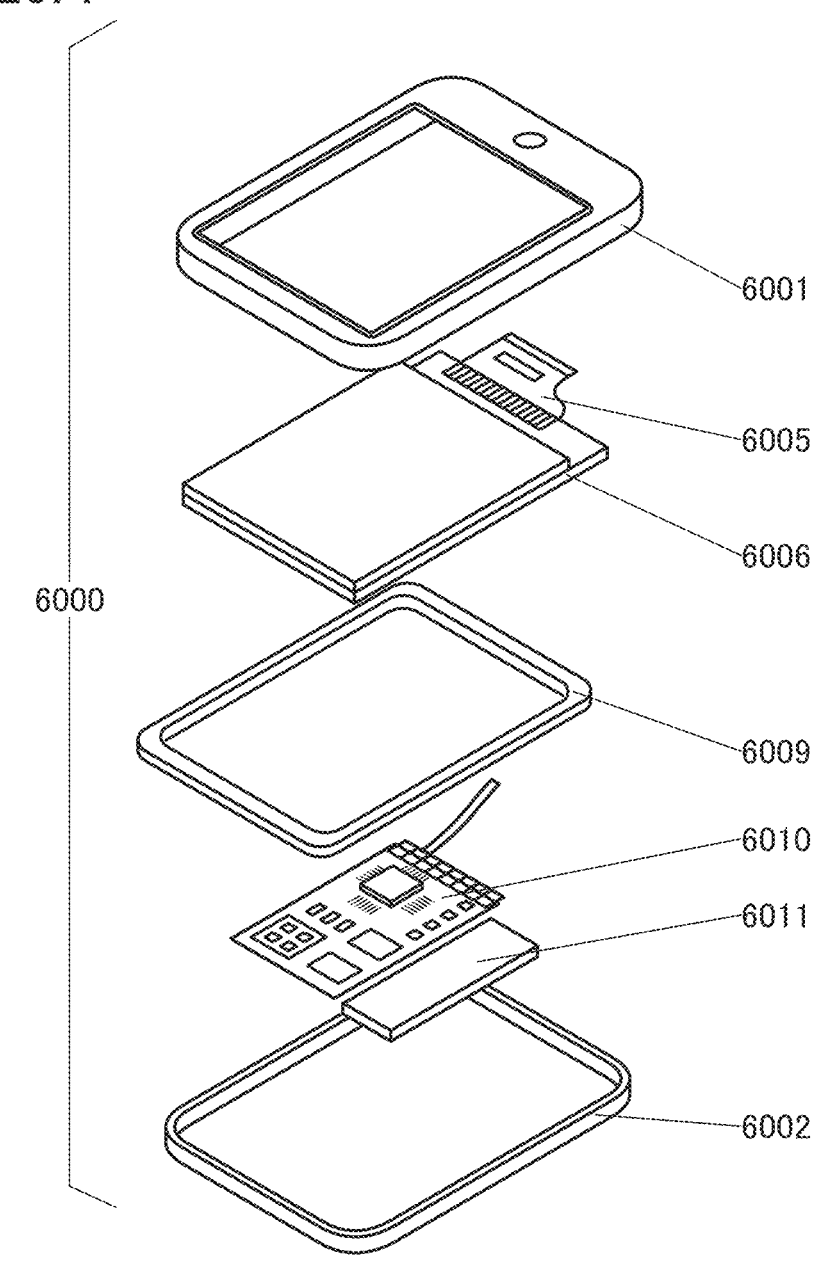
FIG. 29A is a diagram illustrating a structure example of a display module.

In a display module 6000 illustrated in FIG. 29A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 29B:
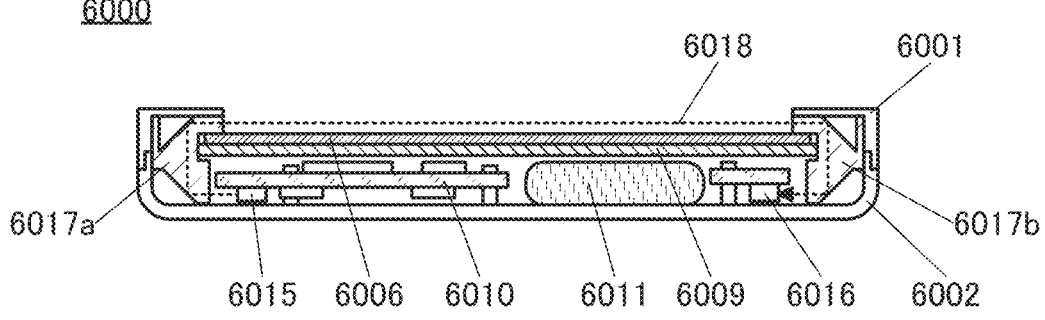
FIG. 29B is a schematic cross-sectional view of the display module.

FIG. 29B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) is provided in a region surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b that transmit the light 6018, the light-emitting portion 6015 and the light-receiving portion 6016 can be placed under the display device 6006, and a malfunction of the touch sensor due to external light reaching the light-receiving portion 6016 can be inhibited. Particularly when a resin that absorbs visible light and transmits infrared rays is used, a malfunction of the touch sensor can be more effectively inhibited.

At least part of this embodiment can be implemented in appropriate combination with the other embodiments described in this specification.

Embodiment 6

In this embodiment, an example of an electronic device in which the display device of one embodiment of the present invention can be used will be described.

Figure 30A:
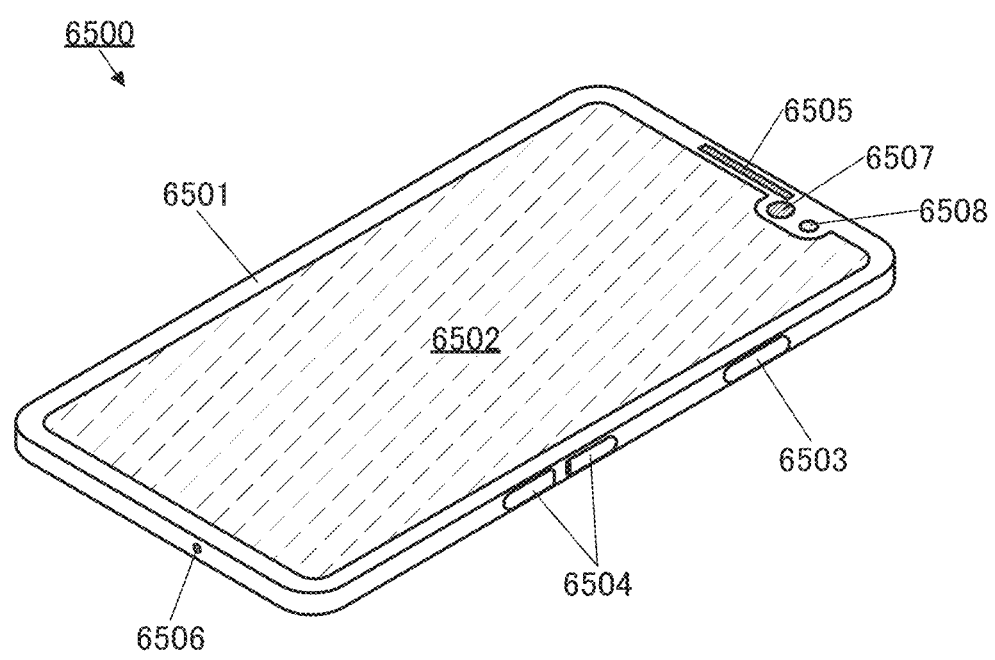
FIG. 30A is a diagram illustrating a structure example of an electronic device.

An electronic device 6500 illustrated in FIG. 30A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 30B:
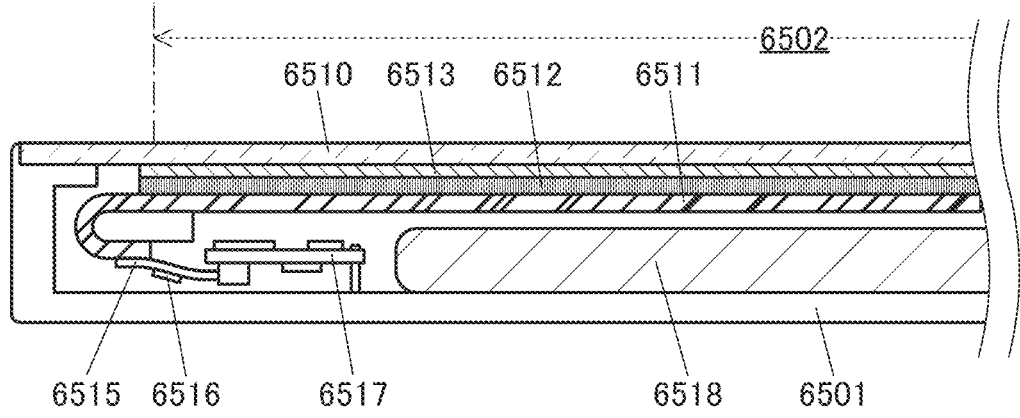
FIG. 30B is a schematic cross-sectional view of the electronic device.

FIG. 30B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided on the printed circuit board 6517.

A flexible display panel of one embodiment of the present invention can be used as the display panel 6511. Thus, an extremely lightweight electronic device can be achieved.

Furthermore, since the display panel 6511 is extremely thin, the battery 6518 with a high capacity can be provided without an increase in the thickness of the electronic device. An electronic device with a narrow frame can be obtained when part of the display panel 6511 is bent back so that the portion connected to the FPC 6515 is positioned on the back side of a pixel portion.

At least part of this embodiment can be implemented in appropriate combination with the other embodiments described in this specification.

Embodiment 7

In this embodiment, electronic devices each including a display device manufactured using one embodiment of the present invention will be described.

Electronic devices exemplified below include the display device of one embodiment of the present invention in a display portion. Thus, the electronic devices achieve high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

The electronic device using one embodiment of the present invention can be incorporated along a flat surface or a curved surface of an inside wall or an outside wall of a house or a building, an interior or an exterior of a car, or the like.

FIG. 31A is a diagram illustrating the appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video and the like received from the camera 8000 on the display portion 8102.

The button 8103 has a function of a power button or the like.

The display device of one embodiment of the present invention can be used in the display portion 8002 of the camera 8000 and the display portion 8102 of the finder 8100. Note that a finder may be incorporated in the camera 8000.

FIG. 31B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and information on the movement of the user's eyeball and eyelid can be used as an input means.

The mounting portion 8201 may include a plurality of electrodes capable of sensing current flowing in response to the movement of the user's eyeball in a position in contact with the user, to have a function of recognizing the user's line of sight. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used in the display portion 8204.

FIG. 31C, FIG. 31D, and FIG. 31E are diagrams illustrating the appearance of a head-mounted display 8300. The head-mounted display 8300 includes a housing 8301, a display portion 8302, a band-shaped fixing unit 8304, and a pair of lenses 8305.

The user can see display on the display portion 8302 through the lenses 8305. Note that the display portion 8302 is preferably placed to be curved, in which case the user can feel a high realistic sensation. When another image displayed in a different region of the display portion 8302 is viewed through the lenses 8305, three-dimensional display using parallax or the like can also be performed. Note that the structure is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has extremely high resolution; thus, even when a video is magnified using the lenses 8305 as in FIG. 31E, the user does not perceive pixels, and a more realistic video can be displayed.

Electronic devices illustrated in FIG. 32A to FIG. 32G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 32A to FIG. 32G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 32A to FIG. 32G are described below.

FIG. 32A is a perspective view illustrating a television device 9100. The television device 9100 can include the display portion 9001 having a large screen size of, for example, 50 inches or more, or 100 inches or more.

FIG. 32B is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters and image information on its plurality of surfaces. FIG. 32B illustrates an example in which three icons 9050 are displayed. Information 9051 indicated by dashed rectangles can be displayed on another surface of the display portion 9001. Examples of the information 9051 include notification of reception of an e-mail, a message of SNS, or an incoming call, the title and sender of an e-mail, a message of SNS, or the like, the date, the time, remaining battery, and the reception strength of an antenna. Alternatively, the icon 9050 or the like may be displayed at the position where the information 9051 is displayed.

FIG. 32C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 32D is a perspective view illustrating a watch-type portable information terminal 9200. The portable information terminal 9200 can be used as a smartwatch (registered trademark), for example. A display surface of the display portion 9001 is curved, and display can be performed along the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

FIG. 32E, FIG. 32F, and FIG. 32G are perspective views illustrating a foldable portable information terminal 9201. FIG. 32E is a perspective view of an opened state of the portable information terminal 9201, FIG. 32G is a perspective view of a folded state thereof, and FIG. 32F is a perspective view of a state in the middle of change from one of FIG. 32E and FIG. 32G to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figures 33A, 33B, 33C, 33D:
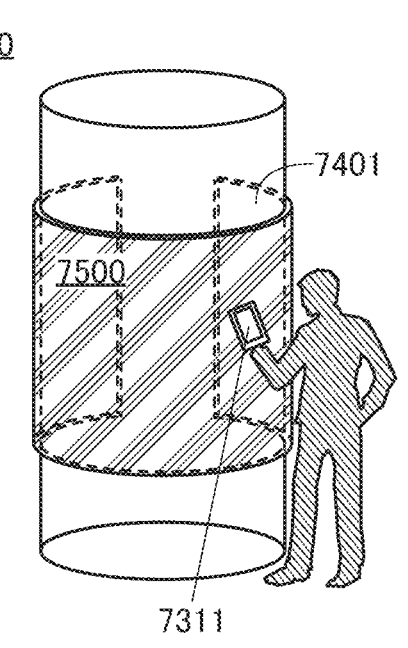
FIG. 33A, FIG. 33B, FIG. 33C, and FIG. 33D are diagrams illustrating structure examples of electronic devices.

FIG. 33A illustrates an example of a television device. In a television device 7100, a display portion 7500 is incorporated in a housing 7101. Here, a structure in which the housing 7101 is supported by a stand 7103 is illustrated.

The television device 7100 illustrated in FIG. 33A can be operated with an operation switch provided in the housing 7101 or a separate remote controller 7111. Alternatively, a touch panel may be used for the display portion 7500, and the television device 7100 may be operated by touch on the touch panel. The remote controller 7111 may be provided with a display portion in addition to operation buttons.

Note that the television device 7100 may include a television receiver and a communication device for network connection.

FIG. 33B illustrates a laptop personal computer 7200. The laptop personal computer 7200 includes a housing 7211, a keyboard 7212, a pointing device 7213, an external connection port 7214, and the like. The display portion 7500 is incorporated into the housing 7211.

FIG. 33C and FIG. 33D illustrate examples of digital signage.

Digital signage 7300 illustrated in FIG. 33C includes a housing 7301, the display portion 7500, a speaker 7303, and the like. Furthermore, an LED lamp, operation keys (including a power switch or an operation switch), a connection terminal, a variety of sensors, a microphone, and the like can be included.

FIG. 33D illustrates digital signage 7400 attached to a cylindrical pillar 7401. The digital signage 7400 includes the display portion 7500 provided along a curved surface of the pillar 7401.

A larger display portion 7500 can increase the amount of information that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIG. 33C and FIG. 33D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIG. 33A to FIG. 33D.

The electronic devices of this embodiment each include a display portion; however, one embodiment of the present invention can also be used in an electronic device without a display portion.

At least part of this embodiment can be implemented in appropriate combination with the other embodiments described in this specification.

Example 1

In this example, a sample (sample A) resembling the shape of the transistor 100A illustrated in FIG. 7 and a sample (sample B) resembling the shape of the transistor 100G illustrated in FIG. 13 were fabricated, and their cross-sectional shapes were evaluated.

<Sample Fabrication>

First, a 30-nm-thick titanium film and a 100-nm-thick copper film were formed in this order over a glass substrate by a sputtering method, and then processed to obtain a first gate electrode (bottom gate).

Next, as a first gate insulating layer, a 300-nm-thick silicon nitride layer and a 100-nm-thick first silicon oxynitride layer were formed in this order. The first gate insulating layer was formed with a PECVD apparatus.

Next, a 25-nm-thick metal oxide film was formed over the first silicon oxynitride layer. The metal oxide film was formed by a sputtering method using an In—Ga—Zn oxide target (In:Ga:Zn=1:1:1 [atomic ratio]). The deposition pressure was 0.6 Pa, the power supply was 2.5 kW, and the substrate temperature was room temperature. A mixed gas of an oxygen gas and an argon gas was used as a deposition gas, and the proportion of the flow rate of the oxygen gas to the total flow rate of the deposition gas (oxygen flow rate ratio) was 30%.

Then, the metal oxide film was processed into an island shape to form a metal oxide layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, as a second gate insulating layer, a 130-nm-thick second silicon oxynitride film was formed. The second gate insulating layer was formed with a PECVD apparatus.

Subsequently, heat treatment was performed at 370° C. in a nitrogen atmosphere for one hour. An oven apparatus was used for the heat treatment.

Next, a 100-nm-thick molybdenum film was formed over the second silicon oxynitride film. The molybdenum film was formed by a sputtering method.

Then, a first resist mask was formed over the molybdenum film, and a molybdenum layer was formed. A wet etching method was used for forming the molybdenum layer. A mixed acid Al etchant was used as an etchant. Here, etching time was adjusted such that an end portion of the molybdenum layer was positioned inward from an end portion of the first resist mask.

Next, the second silicon oxynitride film was processed using the first resist mask as a mask.

Next, the first resist mask was shrunk to form a second resist mask. The first resist mask was shrunk by an ashing method.

Then, the second silicon oxynitride film was processed using the second resist mask as a mask, whereby a second silicon oxynitride layer was obtained. The sample fabricated through the above steps is referred to as the sample A.

Next, for the sample B, the second resist mask was shrunk to form a third resist mask. The second resist mask was shrunk by an ashing method.

Then, the second silicon oxynitride film was processed using the third resist mask as a mask to obtain the second silicon oxynitride layer, whereby the sample B was fabricated.

Through the above process, the sample A and the sample B were obtained.

<Cross-Sectional Observation>

Next, the sample A and the sample B were thinned by a focused ion beam (FIB), and cross sections of these samples were observed with a STEM.

Figure 34A:
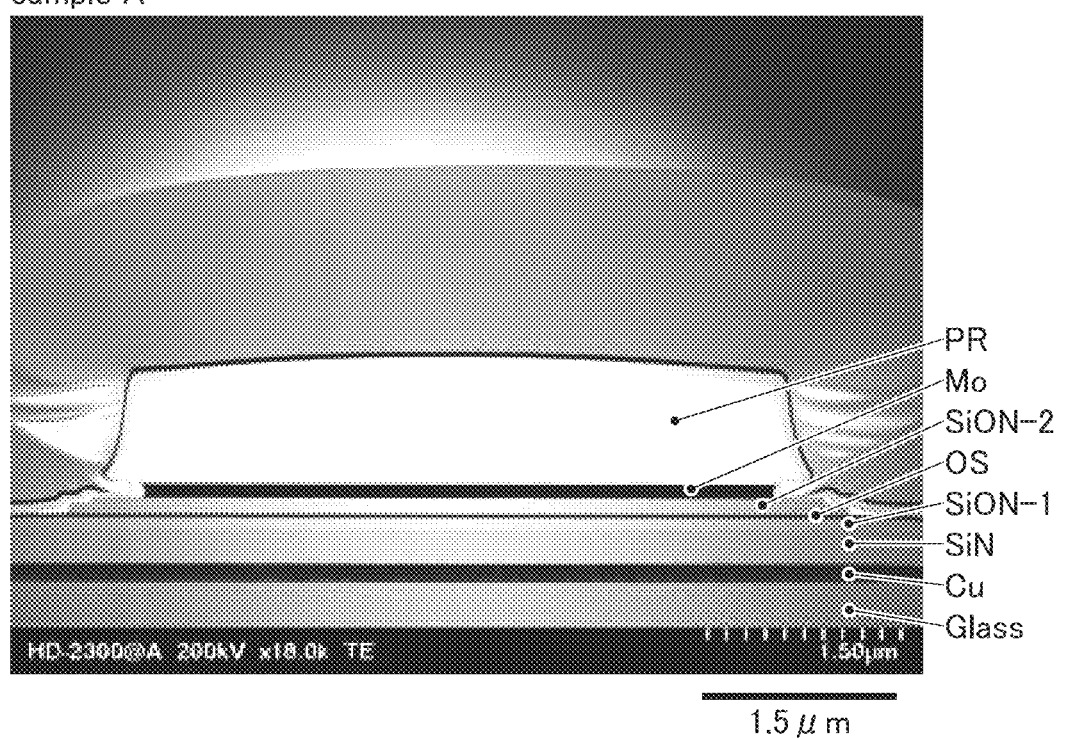
FIG. 34A and FIG. 34B are cross-sectional STEM images.
Figure 34B:
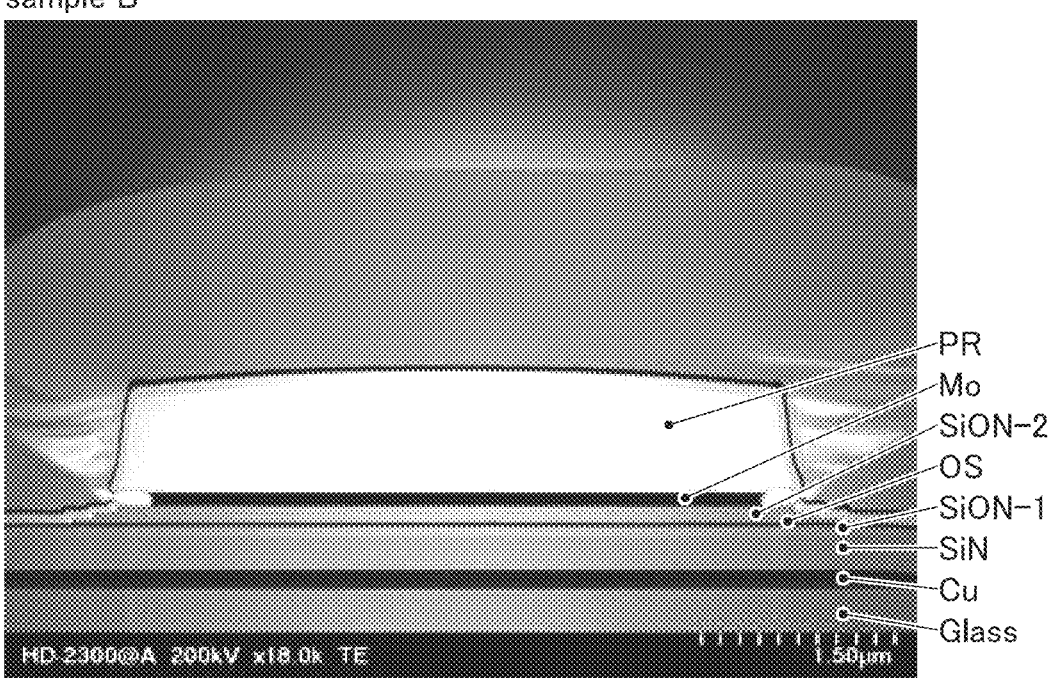

FIG. 34A shows a STEM image of the cross section of the sample A, and FIG. 34B shows a STEM image of the cross section of the sample B. FIG. 34A and FIG. 34B are transmission electron (TE) images at a magnification of 1800 times.

Figure 35A:
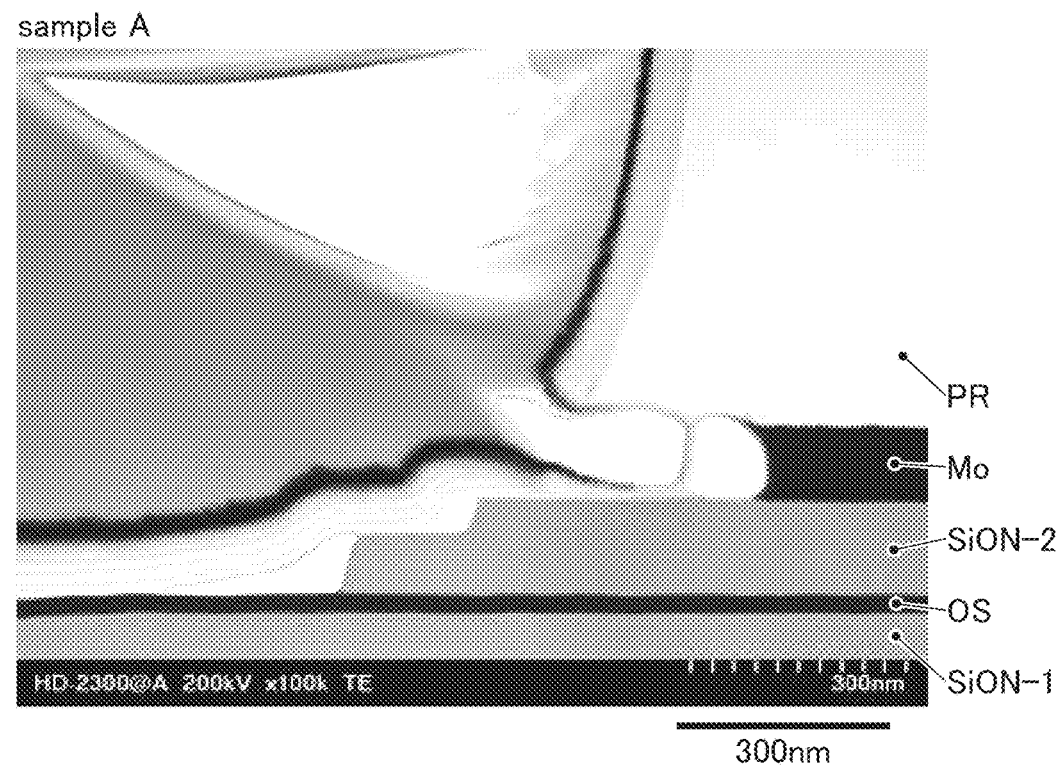
FIG. 35A and FIG. 35B are cross-sectional STEM images.
Figure 35B:
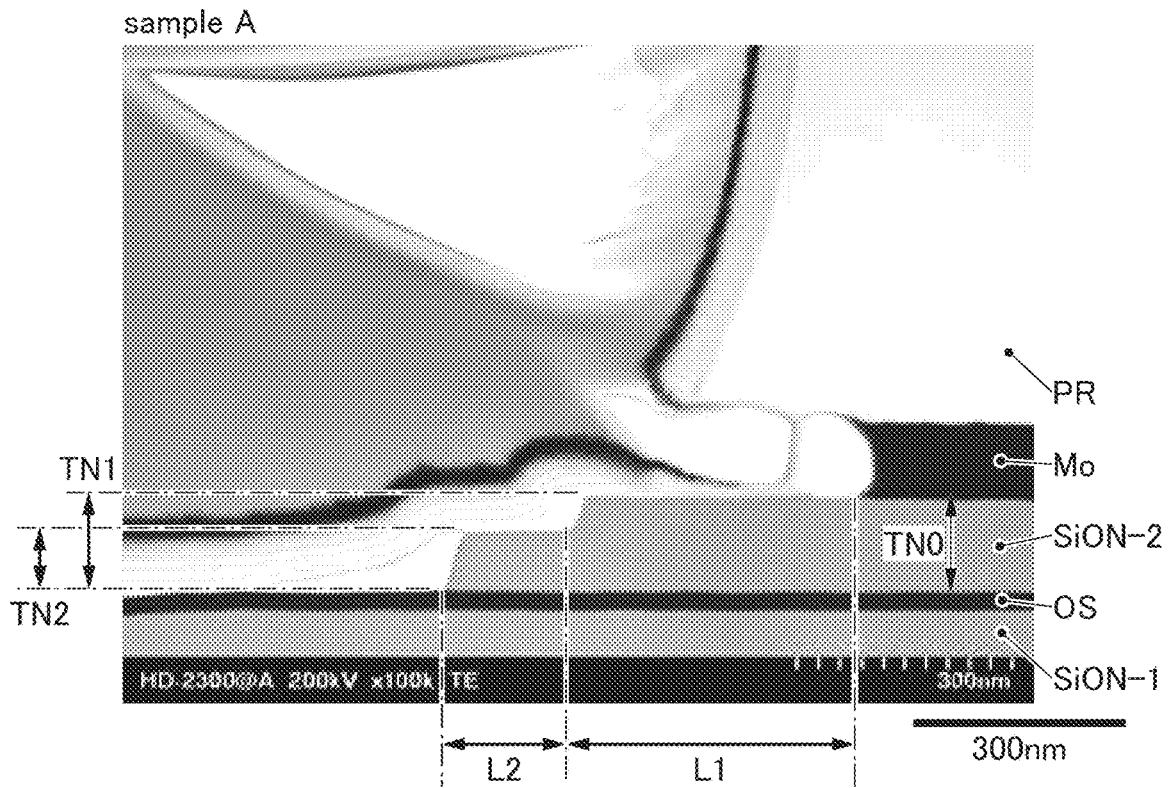
Figure 36A:
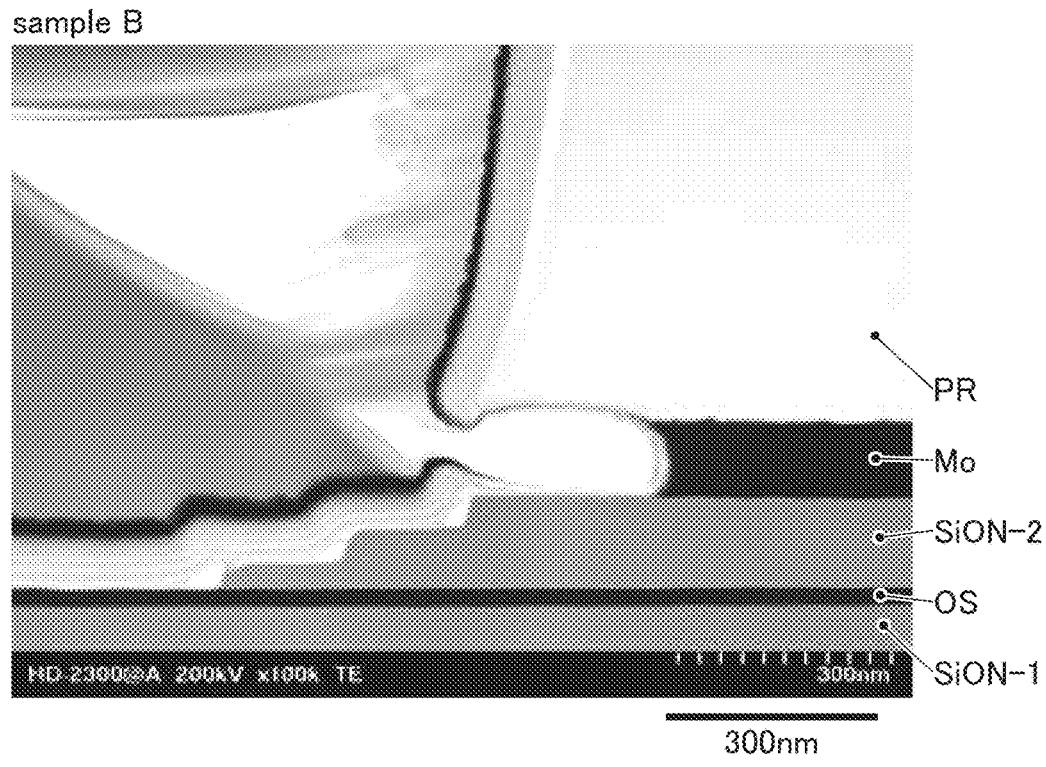
FIG. 36A and FIG. 36B are cross-sectional STEM images.
Figure 36B:
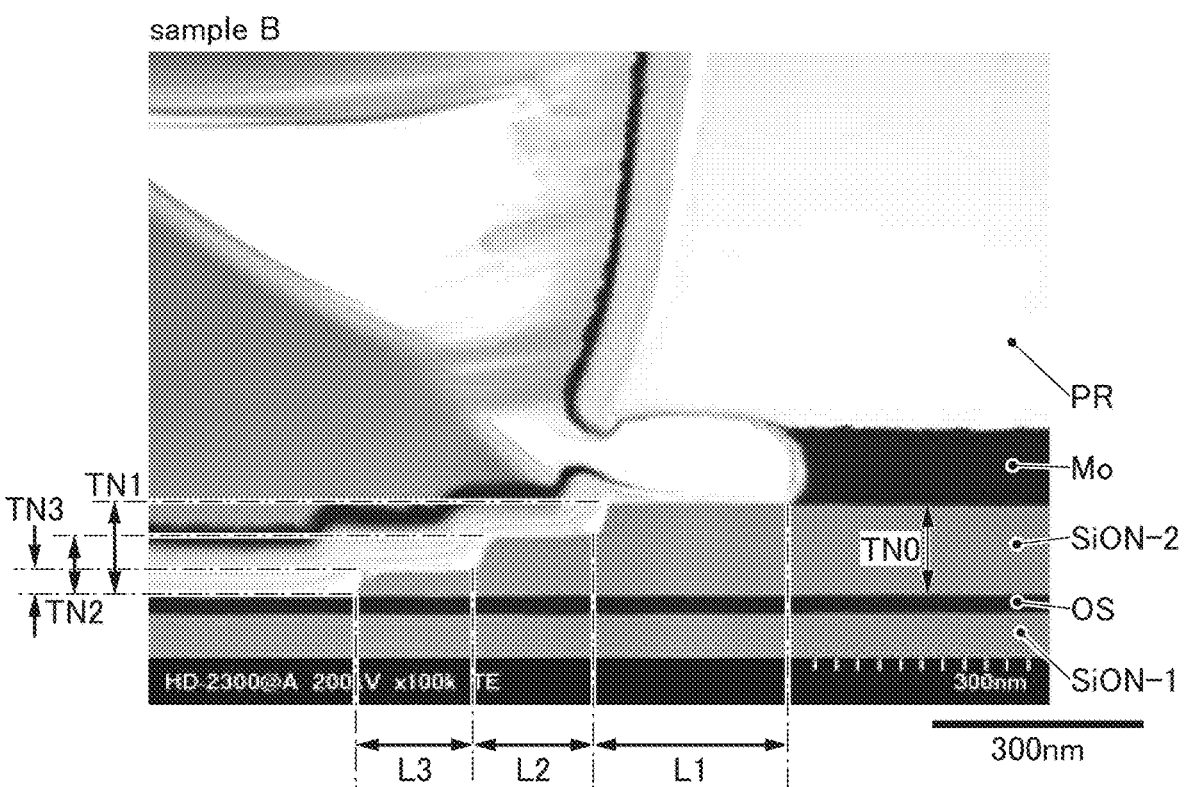

FIG. 35A and FIG. 35B each show an enlarged STEM image of a portion near the end portion of the second silicon oxynitride layer in the sample A. FIG. 36A and FIG. 36B each show an enlarged STEM image of a portion near the end portion of the second silicon oxynitride layer in the sample B. FIG. 35A, FIG. 35B, FIG. 36A, and FIG. 36B each show a transmission electron (TE) image at a magnification of 100000 times.

Note that the STEM image in FIG. 35B is the same as that in FIG. 35A, and the STEM image in FIG. 36B is the same as that in FIG. 36A. FIG. 35B and FIG. 36B each show the measured portions of the width L1 of the region 108L1, the width L2 of the region 108L2, the width L3 of the region 108L3, the thickness TN1 of the second silicon oxynitride layer in a region overlapping with the region 108L1, the thickness TN2 of the second silicon oxynitride layer in a region overlapping with the region 108L2, and the thickness TN3 of the second silicon oxynitride layer in a region overlapping with the region 108L3.

In FIG. 34A, FIG. 34B, FIG. 35A, FIG. 35B, FIG. 36A, and FIG. 36B, the glass substrate is denoted as Glass, the copper layer as Cu, the silicon nitride layer as SiN, the first silicon oxynitride layer as SiON-1, the metal oxide layer as OS, the second silicon oxynitride layer as SiON-2, the molybdenum layer as Mo, and the photoresist as PR.

As shown in FIG. 34A, FIG. 34B, FIG. 35A, FIG. 35B, FIG. 36A, and FIG. 36B, the shape of the second silicon oxynitride layer was a step-like shape.

Table 1 shows the width L1 of the region 108L1, the width L2 of the region 108L2, the width L3 of the region 108L3, the thickness TN1 of the second silicon oxynitride layer in the region overlapping with the region 108L1, the thickness TN2 of the second silicon oxynitride layer in the region overlapping with the region 108L2, and the thickness TN3 of the second silicon oxynitride layer in the region overlapping with the region 108L3 in each of the sample A and the sample B. Note that Table 1 does not show the values of the width L3 and the thickness TN3 in the sample A because the region 108L3 is not provided in the sample A.

TABLE 1

|  | sample A | sample B |
| --- | --- | --- |
| L1 | 399 nm | 254 nm |
| L2 | 181 nm | 181 nm |
| L3 | — | 181 nm |
| TN0 | 133 nm | 133 nm |
| TN1 | 129 nm | 131 nm |
| TN2 | 83.3 nm | 87.3 nm |
| TN3 | — | 35.7 nm |

According to FIG. 34A, FIG. 34B, FIG. 35A, FIG. 35B, FIG. 36A, FIG. 36B, and Table 1, the shape of the transistor including the region 108L1 and the region 108L2 was confirmed in the sample A, and the shape of the transistor including the region 108L1, the region 108L2, and the region 108L3 was confirmed in the sample B. In addition, the ratio of the thickness TN1 to the thickness TN0 in the sample A was 0.97, indicating that the thickness TN0 was substantially equal to the thickness TN1. Also in the sample B, the ratio of the thickness TN1 to the thickness TN0 was 0.99, indicating that the thickness TN0 was substantially equal to the thickness TN1.

Example 2

In this example, samples corresponding to the region 108C, the region 108L1, the region 108L2, the region 108L3, and the region 108N were fabricated, and the resistance of the samples was evaluated.

<Sample Fabrication>

First, a 240-nm-thick first silicon nitride film, a 60-nm-thick second silicon nitride film, and a 100-nm-thick first silicon oxynitride film were formed in this order over a glass substrate.

Next, a 25-nm-thick metal oxide film was formed over the first silicon oxynitride film. The metal oxide film was formed by a sputtering method using an In—Ga—Zn oxide target (In:Ga:Zn=1:1:1 [atomic ratio]). The deposition pressure was 0.6 Pa, the power supply was 2.5 kW, and the substrate temperature was room temperature. A mixed gas of an oxygen gas and an argon gas was used as a deposition gas, and the oxygen flow rate ratio was 30%.

Subsequently, heat treatment was performed at 340° C. in a CDA atmosphere for one hour. An oven apparatus was used for the heat treatment.

Next, a second silicon oxynitride film was formed over the metal oxide film. Note that the thickness of the second silicon oxynitride film differed between the samples. The thicknesses of the second silicon oxynitride were 20 nm, 40 nm, 60 nm, 80 nm, 100 nm, and 140 nm. A sample in which the second silicon oxynitride film was not formed was also fabricated. Note that the second silicon oxynitride film corresponds to the insulating layer provided over the semiconductor layer 108 at the time of supplying the first element 140 described in Embodiment 1. The second silicon oxynitride film corresponds to, for example, the insulating layer 110 and the insulating layer 118a illustrated in FIG. 18B.

Subsequently, heat treatment was performed at 340° C. in a CDA atmosphere for one hour. An oven apparatus was used for the heat treatment. Note that the sample in which the second silicon oxynitride film was not formed was not subjected to the heat treatment.

After that, plasma treatment was performed using an ammonia gas. Note that the substrate temperature during the plasma treatment and the treatment time of the plasma treatment differed between the samples. The substrate temperature during the plasma treatment was 240° C. and 350° C. The treatment time of the plasma treatment was 15 sec, 30 sec, 60 sec, and 90 sec. A sample not subjected to the plasma treatment was also fabricated.

Subsequently, heat treatment was performed in a nitrogen atmosphere for one hour. An oven apparatus was used for the heat treatment. Note that the heat treatment temperature differed between the samples. The heat treatment temperature was 250° C., 300° C., and 350° C. A sample not subjected to the heat treatment was also fabricated.

Then, an opening that reached the metal oxide film was formed in the second silicon oxynitride film, and a terminal was provided.

<Sheet Resistance Measurement>

Next, the sheet resistance of each sample fabricated as above was measured to evaluate the resistance of the metal oxide film.

FIG. 37A, FIG. 37B, FIG. 38A, FIG. 38B, FIG. 39A, and FIG. 39B show the values of the sheet resistance of the metal oxide film in each sample.

Figure 37A:
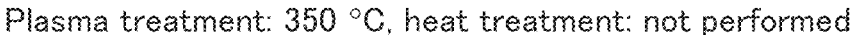
FIG. 37A and FIG. 37B are diagrams showing the resistance of metal oxide films.
Figure 37A:
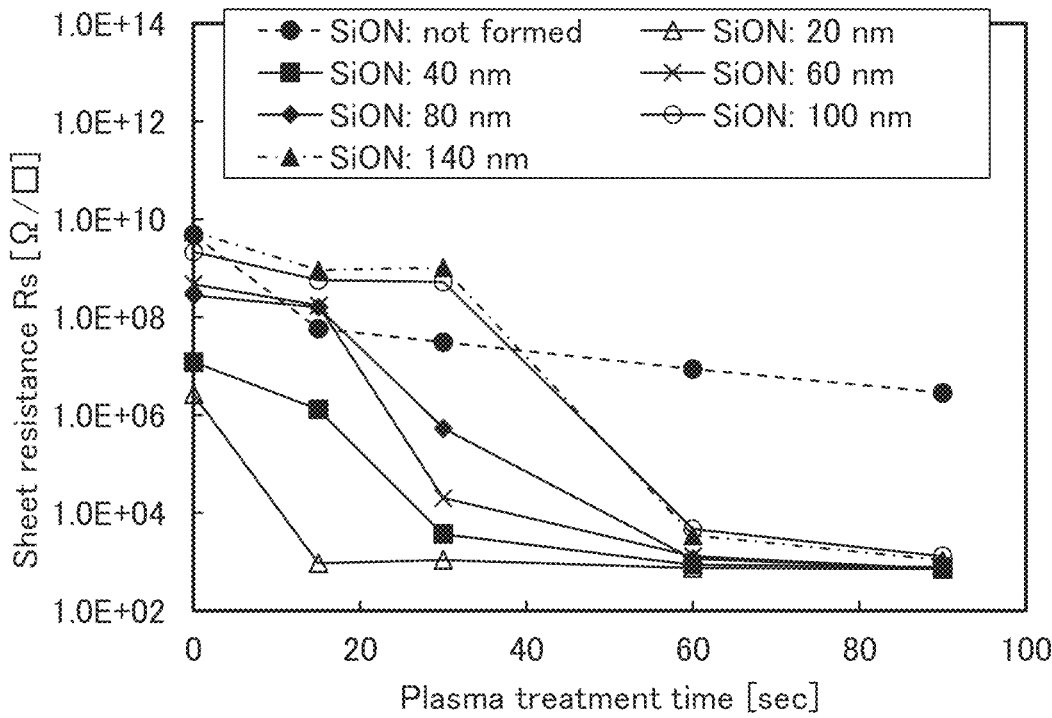
Figure 37B:
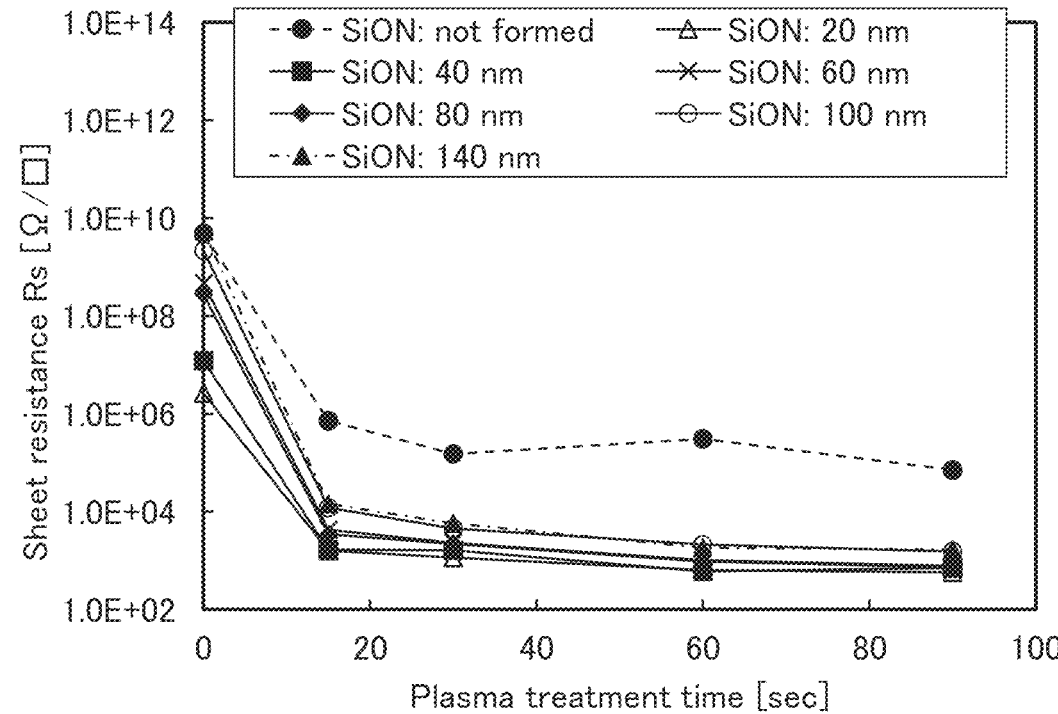
Figure 38A:
FIG. 38A and FIG. 38B are diagrams showing the resistance of metal oxide films.
Figure 38A:
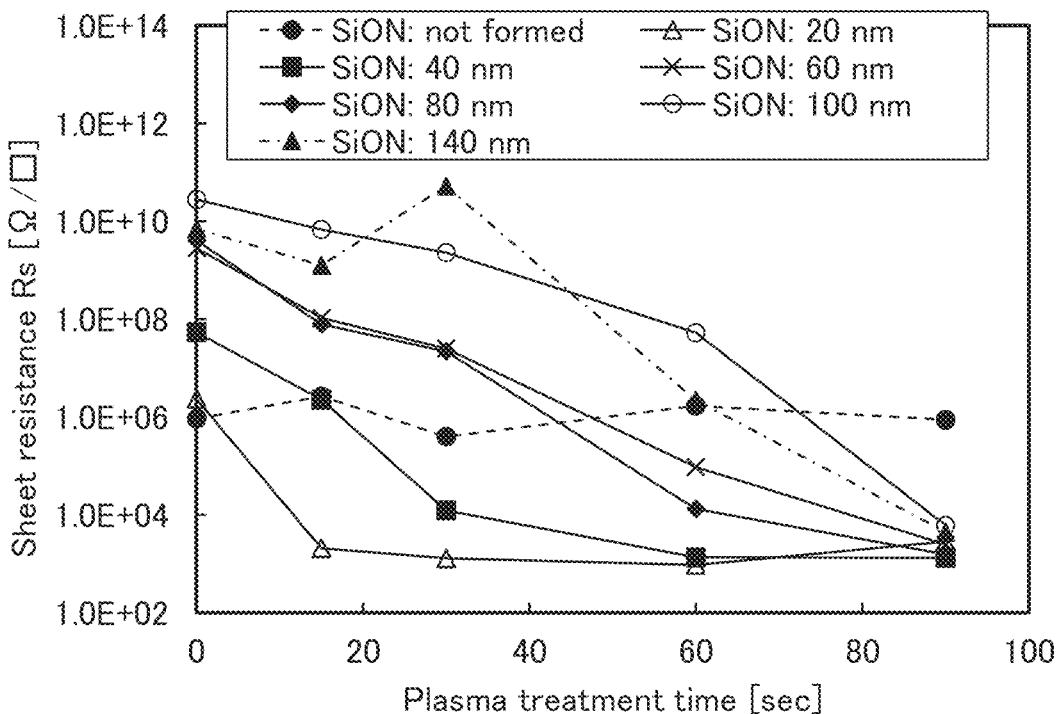
Figure 38B:
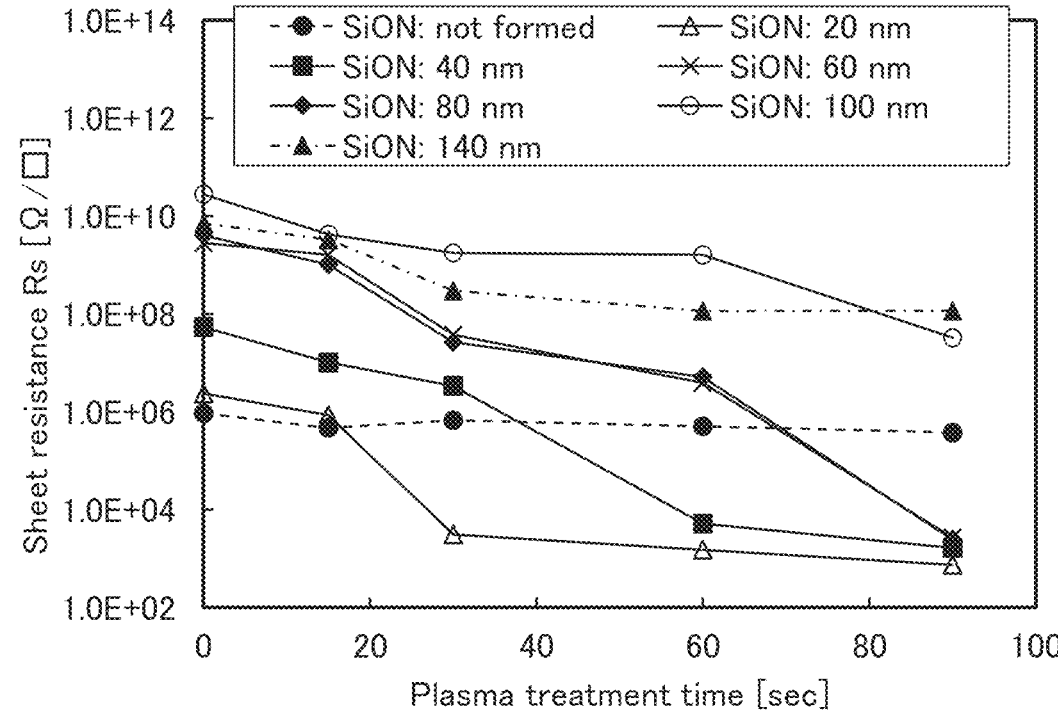

In FIG. 37A, FIG. 37B, FIG. 38A, and FIG. 38B, the horizontal axis represents the treatment time of the plasma treatment, and the vertical axis represents the sheet resistance Rs of the metal oxide film. Note that FIG. 37A selectively shows the results of the samples subjected to the plasma treatment at a substrate temperature of 350° C. and not subjected to the heat treatment after the plasma treatment. FIG. 37B selectively shows the results of the samples subjected to the plasma treatment at a substrate temperature of 240° C. and not subjected to the heat treatment after the plasma treatment. FIG. 38A selectively shows the results of the samples subjected to the plasma treatment at a substrate temperature of 350° C. and subjected to the heat treatment at a temperature of 250° C. after the plasma treatment. FIG. 38B selectively shows the results of the samples subjected to the plasma treatment at a substrate temperature of 240° C. and subjected to the heat treatment at a temperature of 250° C. after the plasma treatment.

Figure 39A:
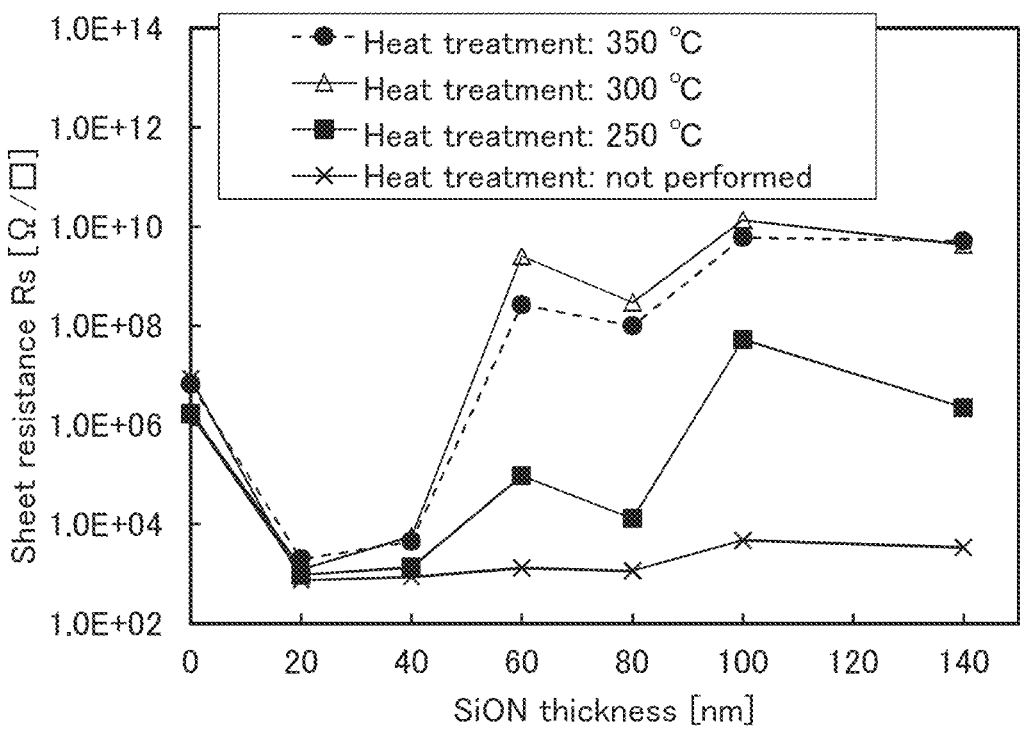
FIG. 39A and FIG. 39B are diagrams showing the resistance of metal oxide films.
Figure 39B:
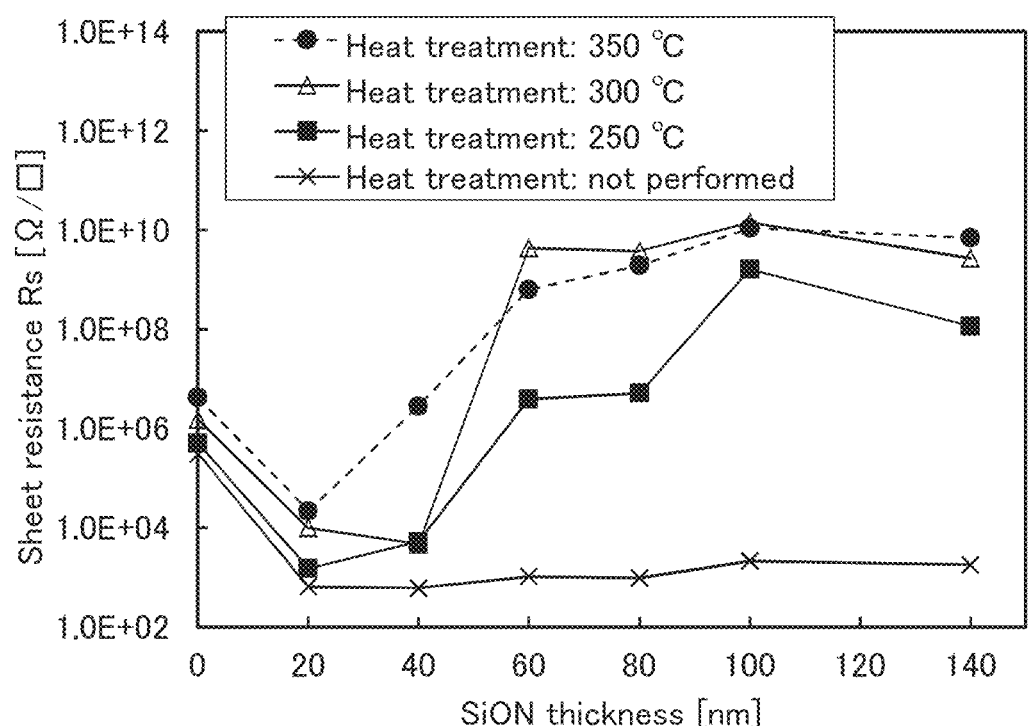

In FIG. 39A and FIG. 39B, the horizontal axis represents the thickness of the second silicon oxynitride film (SiON thickness), and the vertical axis represents the sheet resistance Rs of the metal oxide film. Note that FIG. 39A selectively shows the results of the samples subjected to the plasma treatment at a substrate temperature of 350° C. for a plasma treatment time of 60 sec. FIG. 39B selectively shows the results of the samples subjected to the plasma treatment at a substrate temperature of 240° C. for a plasma treatment time of 60 sec.

FIG. 37A, FIG. 37B, FIG. 38A, and FIG. 38B reveal that longer treatment time of the plasma treatment results in lower resistance of the metal oxide film. It is also found that the resistance of the metal oxide film is lower in the sample subjected to the plasma treatment at a substrate temperature of 350° C. than in the sample subjected to the plasma treatment at a substrate temperature of 240° C. As shown in FIG. 39A and FIG. 39B, the metal oxide film subjected to the heat treatment after the plasma treatment tends to have high resistance, and higher heat treatment temperature tends to lead to higher resistance of the metal oxide film. It is also revealed that a smaller thickness of the second silicon oxynitride film results in lower resistance of the metal oxide film. Note that in the sample in which the second silicon oxynitride film was not formed and on which the plasma treatment was performed, the metal oxide film tends to have high resistance. The sample in which the second silicon oxynitride film was not formed was subjected to the plasma treatment with the metal oxide film exposed; thus, the resistance of the metal oxide film was probably increased by damage to the metal oxide film.

The above results demonstrate that adjusting the thickness of the second silicon oxynitride film and the treatment conditions of the plasma treatment enables the resistance of the metal oxide film to be controlled. Although the heat treatment was performed after the plasma treatment in this example, the heat treatment can be replaced with heat application treatment. Since the resistance of the metal oxide film differs depending on the temperature of the heat treatment after the plasma treatment as described in this example, it is found that the resistance of the metal oxide film can be controlled by adjusting the thickness of the second silicon oxynitride film and the treatment conditions of the plasma treatment in consideration of the temperature of heat application treatment after the plasma treatment.

REFERENCE NUMERALS

C1: capacitor, C2: capacitor, DL_Y: data line, DL_1: data line, G1: wiring, G2: wiring, GL_X: gate line, GL_1: gate line, M1: transistor, M2: transistor, M3: transistor, N1: node, N2: node, P1: region, P2: region, S1: wiring, S2: wiring, T1: period, T2: period, TN0: thickness, TN1: thickness, TN2: thickness, TN3: thickness, 10: transistor, 10A: transistor, 10B: transistor, 10C: transistor, 10D: transistor, 10E: transistor, 10F: transistor, 10G: transistor, 10H: transistor, 10I: transistor, 100: transistor, 100A: transistor, 100B: transistor, 100C: transistor, 100D: transistor, 100E: transistor, 100F: transistor, 100G: transistor, 102: substrate, 103: insulating layer, 103a: insulating layer, 103b: insulating layer, 103c: insulating layer, 106: conductive layer, 108: semiconductor layer, 108C: region, 108f: metal oxide film, 108L1: region, 108L2: region, 108L3: region, 108Lp: region, 108N: region, 110: insulating layer, 110a: insulating layer, 110A: insulating layer, 110b: insulating layer, 110B: insulating layer, 110c: insulating layer, 110f: insulating film, 110S1: first side surface, 110S2: second side surface, 110S3: third side surface, 110Sp: p-th side surface, 112: conductive layer, 112f: conductive film, 114: metal oxide layer, 114f: metal oxide film, 115: resist mask, 115a: resist mask, 115b: resist mask, 118: insulating layer, 118a: insulating layer, 118b: insulating layer, 120a: conductive layer, 120b: conductive layer, 140: first element, 141a: opening portion, 141b: opening portion, 142: opening portion, 400: pixel circuit, 400EL: pixel circuit, 400LC: pixel circuit, 401: circuit, 401EL: circuit, 401LC: circuit, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 700A: display device, 700B: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 717: IC, 721: source driver IC, 722: gate driver circuit portion, 723: FPC, 724: printed circuit board, 730: insulating film, 732: sealing film, 734: insulating film, 736: coloring film, 738: light-blocking film, 740: protective layer, 741: protective layer, 742: bonding layer, 743: resin layer, 744: insulating layer, 745: support substrate, 746: resin layer, 750: transistor, 752: transistor, 760: wiring, 770: planarization insulating film, 772: conductive layer, 773: insulating layer, 774: conductive layer, 775: liquid crystal element, 776: liquid crystal layer, 778: spacer, 780: anisotropic conductive film, 782: light-emitting element, 786: EL layer, 788: conductive film, 790: capacitor, 6000: display module, 6001: upper cover, 6002: lower cover, 6005: FPC, 6006: display device, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7500: display portion, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9100: television device, 9101: portable information terminal, 9102: portable information terminal, 9200: portable information terminal, 9201: portable information terminal

The invention claimed is:

1. A semiconductor device comprising:

a semiconductor layer, a first insulating layer over the semiconductor layer, a conductive layer over the first insulating layer, and a second insulating layer in contact with top surfaces and side surfaces of the semiconductor layer, the first insulating layer, and the conductive layer, wherein the semiconductor layer comprises a first region, a pair of second regions, a pair of third regions, and a pair of fourth regions, wherein the second regions sandwich the first region, wherein the third regions sandwich the first region and the second regions, wherein the fourth regions sandwich the first region, the second regions, and the third regions, wherein the first region comprises a region overlapping with the first insulating layer and the conductive layer, wherein the second regions and the third regions each comprise a region overlapping with the first insulating layer and not overlapping with the conductive layer, wherein the fourth regions overlap with neither the first insulating layer nor the conductive layer, wherein a thickness of the first insulating layer in regions overlapping with the second regions is substantially equal to a thickness of the first insulating layer in a region overlapping with the first region, wherein a thickness of the first insulating layer in regions overlapping with the third regions is smaller than the thickness of the first insulating layer in the regions overlapping with the second regions, wherein the first insulating layer has a first tapered side surface above boundaries between the pair of second regions and the pair of third regions, and a second tapered side surface above boundaries between the pair of third regions and the pair of fourth regions, wherein the first insulating layer has a third tapered side surface and a fourth tapered side surface in a channel width direction, and wherein the first insulating layer has a first top surface between an end portion of the conductive layer and the first tapered side surface, and a second top surface between the first tapered side surface and the second tapered side surface.

2. The semiconductor device according to claim 1, wherein the second insulating layer is in contact with top surfaces of the fourth regions.

3. The semiconductor device according to claim 2, wherein the first insulating layer comprises an oxide or an oxynitride, and wherein the second insulating layer comprises an oxide or an oxynitride.

4. The semiconductor device according to claim 2, wherein the first insulating layer comprises an oxide or an oxynitride, and wherein the second insulating layer comprises a nitride or a nitride oxide.

5. The semiconductor device according to claim 1, wherein the third regions and the fourth regions each comprise a first element, wherein a concentration of the first element in the third regions is higher than a concentration of the first element in the second regions, wherein a concentration of the first element in the fourth regions is higher than the concentration of the first element in the third regions, and wherein the first element is at least one of hydrogen, boron, nitrogen, and phosphorus.

6. The semiconductor device according to claim 1, wherein the second regions have lower resistance than the first region, wherein the third regions have lower resistance than the second regions, and wherein the fourth regions have lower resistance than the third regions.

7. The semiconductor device according to claim 1, wherein the resistance of the third regions is higher than or equal to 2 times and lower than or equal to $1 \times 10^3$ times the resistance of the second regions.

8. The semiconductor device according to claim 1, wherein the thickness of the first insulating layer in the regions overlapping with the third regions is more than or equal to 0.2 times and less than or equal to 0.9 times the thickness of the first insulating layer in the regions overlapping with the second regions.

9. The semiconductor device according to claim 1, wherein a width of the second regions and a width of the third regions are each greater than or equal to 50 nm and less than or equal to 1 μm.

10. The semiconductor device according to claim 1, wherein the semiconductor layer comprises indium, an element M, and zinc, and wherein the element M is at least one of aluminum, gallium, yttrium, and tin.

11. A method for manufacturing a semiconductor device, comprising the steps of:

forming an island-shaped semiconductor layer;

forming an insulating film over the island-shaped semiconductor layer;

forming a conductive film over the insulating film;

forming a first resist mask whose end portion is positioned inward from an end portion of the island-shaped semiconductor layer over the conductive film;

forming a conductive layer whose end portion is positioned inward from the end portion of the first resist mask by etching the conductive film with the first resist mask;

forming a first insulating layer by etching the insulating film with the first resist mask;

forming a second resist mask whose end portion is positioned outward from the end portion of the conductive layer by shrinkage of the first resist mask;

forming a second insulating layer by etching part of an upper portion of the first insulating layer with the second resist mask;

removing the second resist mask;

forming a third insulating layer over the conductive layer, the second insulating layer, and the island-shaped semiconductor layer; and supplying a first element to the island-shaped semiconductor layer through the second insulating layer and the third insulating layer, wherein the first element is at least one of hydrogen, boron, nitrogen, and phosphorus, wherein the second insulating layer has a first tapered side surface above boundaries between the pair of second regions and the pair of third regions, and a second tapered side surface above boundaries between the pair of third regions and the pair of fourth regions, wherein the second insulating layer has a third tapered side surface and a fourth tapered side surface in a channel width direction, wherein the second insulating layer has a first top surface between the end portion of the conductive layer and the first tapered side surface, and a second top surface between the first tapered side surface and the second tapered side surface, and wherein the third insulating layer is in contact with top surfaces and side surfaces of the semiconductor layer, the second insulating layer, and the conductive layer.

12. The method for manufacturing a semiconductor device, according to claim 11, wherein the step of supplying the first element is performed successively after the step of forming the third insulating layer without exposure to the air.

13. The method for manufacturing a semiconductor device, according to claim 11, wherein a wet etching method is employed in the step of forming the conductive layer, and wherein a dry etching method is employed in the step of forming the first insulating layer and the step of forming the second insulating layer.

* * * * *